US012772485B2

(12) United States Patent
Tsai

(10) Patent No.: US 12,772,485 B2
(45) Date of Patent: Oct. 20, 2026

(54) SEMICONDUCTOR DEVICE AND METHOD FOR FABRICATING THE SAME

(71) Applicant: NANYA TECHNOLOGY CORPORATION, New Taipei City (TW)

(72) Inventor: Hung-Chi Tsai, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 478 days.

(21) Appl. No.: 18/383,153

(22) Filed: Oct. 24, 2023

(65) Prior Publication Data

US 2024/0055521 A1 Feb. 15, 2024

Related U.S. Application Data

(60) Division of application No. 18/220,389, filed on Jul. 11, 2023, now Pat. No. 12,648,169, which is a (Continued)

(51) Int. Cl.
*H10D 30/62* (2025.01)
*H10D 30/01* (2025.01)
(Continued)

(52) U.S. Cl.
CPC ......... *H10D 30/62* (2025.01); *H10D 30/0243* (2025.01); *H10D 30/6219* (2025.01); *H10D 64/679* (2025.01); *H10P 14/665* (2026.01)

(58) Field of Classification Search
CPC .. H10D 30/62; H10D 30/6219; H10D 64/679; H10D 30/0243
See application file for complete search history.

(56) References Cited

U.S. PATENT DOCUMENTS 6,642,090 B1 11/2003 Fried et al.
10,236,358 B1 3/2019 Patil et al.
(Continued)

FOREIGN PATENT DOCUMENTS

CN 102148236 A 8/2011
CN 103606559 A 2/2014
(Continued)

OTHER PUBLICATIONS

Office Action and and the search report mailed on May 30, 2024 related to Chinese Application No. 202011517348.X.
(Continued)

*Primary Examiner* — Christine A Enad
(74) *Attorney, Agent, or Firm* — Xuan Zhang

(57) ABSTRACT

The present application discloses semiconductor device, including a gate structure arranged on a substrate; a plurality of word lines arranged apart from the gate structure; two porous spacers arranged on two sides of the gate structure; and a first insulating layer arranged on the substrate laterally surrounding the gate structure and the porous spacers; and a second insulating layer arranged over the first insulating layer, wherein a top surface of the gate structure, top surfaces of the plurality of word lines and a top surface of the second insulating layer are level with each other, and wherein a porosity of the porous spacers is between about 25% and about 100%.

20 Claims, 68 Drawing Sheets

Related U.S. Application Data continuation-in-part of application No. 17/516,688, filed on Nov. 1, 2021, now abandoned, which is a division of application No. 16/751,168, filed on Jan. 23, 2020, now Pat. No. 11,302,814.

(51) Int. Cl.
*H10D 64/66* (2025.01)
*H10P 14/60* (2026.01)

(56) References Cited

U.S. PATENT DOCUMENTS

| | | | |
|---|---|---|---|
| 2006/0220152 A1 | 10/2006 | Huang et al. | |
| 2011/0121372 A1 | 5/2011 | Kang et al. | |
| 2011/0169088 A1 | 7/2011 | Zhu et al. | |
| 2013/0095255 A1 | 4/2013 | Vrtis et al. | |
| 2015/0228788 A1* | 8/2015 | Chen | H10D 30/796 257/288 |
| 2017/0062330 A1* | 3/2017 | Kim | H10B 43/27 |
| 2017/0141207 A1 | 5/2017 | Cheng et al. | |
| 2018/0190653 A1 | 7/2018 | Lu et al. | |
| 2018/0197970 A1 | 7/2018 | Pan et al. | |
| 2018/0269301 A1 | 9/2018 | Cheng et al. | |
| 2019/0287849 A1* | 9/2019 | Wiseman | H10D 30/62 |
| 2020/0388709 A1 | 12/2020 | Ohta | |
| 2021/0143261 A1* | 5/2021 | Huang | H10D 30/601 |

FOREIGN PATENT DOCUMENTS

| | | |
|---|---|---|
| CN | 108074972 A | 5/2018 |
| TW | 201931446 A | 8/2019 |
| TW | 202002022 A | 1/2020 |

OTHER PUBLICATIONS

Office Action and and the search report mailed on Dec. 22, 2023 related to Chinese Application No. 202011517348.X.

Office Action and Search Report mailed on Dec. 16, 2025 related to U.S. Appl. No. 18/220,389, wherein this application is a DIV of U.S. Appl. No. 18/220,389.

Office Action and Search Report mailed on Jan. 30, 2026 related to U.S. Appl. No. 18/220,389, wherein this application is a DIV of U.S. Appl. No. 18/220,389.

Office Action and Search Report mailed on Sep. 25, 2025 related to U.S. Appl. No. 18/220,389, wherein this application is a DIV of U.S. Appl. No. 18/220,389.

* cited by examiner

SEMICONDUCTOR DEVICE AND METHOD FOR FABRICATING THE SAME

CROSS-REFERENCE TO RELATED APPLICATION

This application is a divisional application of U.S. Non-Provisional application Ser. No. 18/220,389 filed Jul. 11, 2023, which is a continuation-in-part application of U.S. Non-Provisional application Ser. No. 17/516,688 filed Nov. 1, 2021, which is a divisional application of U.S. Non-Provisional application Ser. No. 16/751,168 filed Jan. 23, 2020, now U.S. Pat. No. 11,302,814 B2, the disclosures of which are incorporated herein by reference in their entirety.

TECHNICAL FIELD

The present disclosure relates to a method for fabricating a semiconductor device, and more particularly, to a method for fabricating a semiconductor device with the porous structure.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the down-scaling process, and such issues are continuously increasing in quantity and complexity. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

An aspect of the present disclosure discusses a semiconductor device, including: a gate structure arranged on a substrate; a plurality of word lines arranged apart from the gate structure; two porous spacers arranged on two sides of the gate structure; a first insulating layer arranged on the substrate laterally surrounding the gate structure and the porous spacers; and a second insulating layer arranged over the first insulating layer, wherein a top surface of the gate structure, top surfaces of the plurality of word lines and a top surface of the second insulating layer are level with each other, and wherein a porosity of the porous spacers is between about 25% and about 100%.

Another aspect of the present disclosure discusses a method for fabricating a semiconductor device, including: providing a substrate; forming a gate structure on the substrate; forming a plurality of word lines on the substrate and apart from the gate structure, having top surfaces at a same vertical level as a top surface of the gate structure; depositing an energy-removable material on two sides of the gate structure; and performing an energy treatment to transform the energy-removable material into a porous spacer, wherein a porosity of the porous spacer layer is between about 25% and about 100%.

Yet another aspect of the present disclosure discusses a method for fabricating a semiconductor device, including: providing a substrate; forming a gate structure on the substrate; depositing dummy spacers on two sides of the gate structure; depositing a first insulating layer over the substrate and the word lines to laterally surround the dummy spacers; forming a plurality of word lines on the substrate and apart from the gate structure, wherein a top surface of the gate structure is level with top surfaces of the word lines; and removing the dummy spacers and forming porous spacers on two sides of the gate structure.

Due to the design of the semiconductor device of the present disclosure, a coupling capacitance between the gate structure and the source/drain regions may be reduced; so that an RC delay of the semiconductor device may be reduced. In addition, with the presence of the covering layer, an operating current consumption of the semiconductor device may be reduced. Further, the semiconductor device may have a substantially flat top surface. The substantially flat top surface facilitates subsequent semiconductor processes. Therefore, the yield and quality of the semiconductor device may be improved. In addition, the pair of gate stress regions or the plurality of stress regions may increase the carrier mobility of the semiconductor device; therefore, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
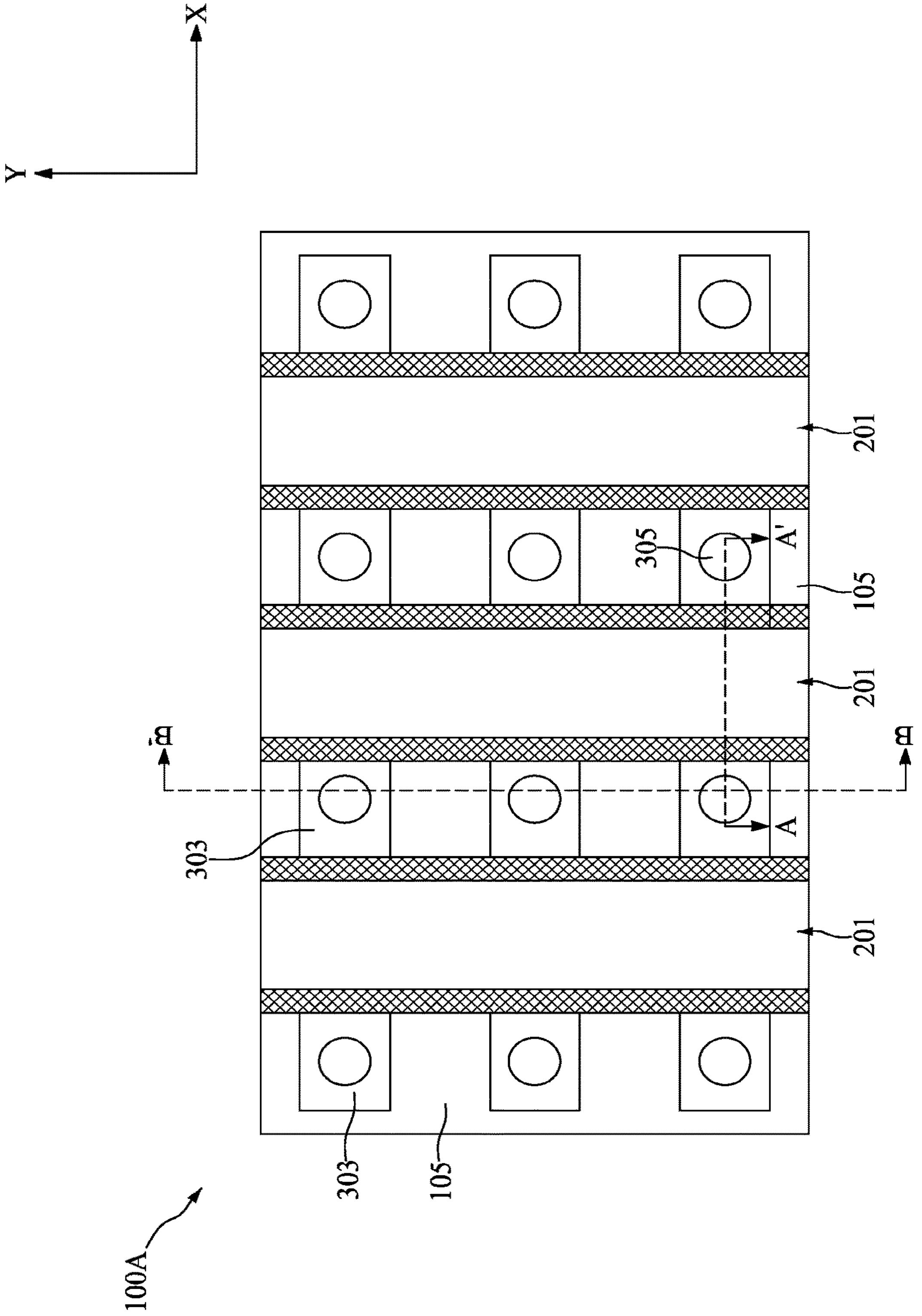
FIG. 1 illustrates, in a schematic top-view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
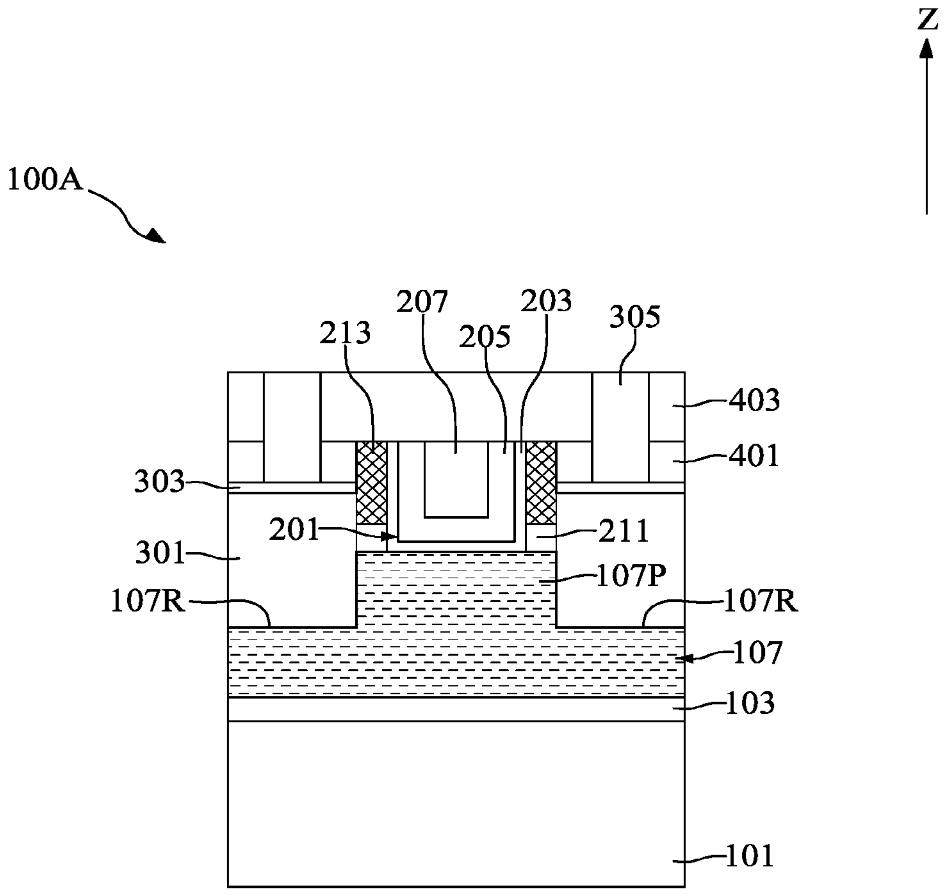
FIG. 2 is a schematic cross-sectional view diagram taken along a line A-A' in FIG. 1.
Figure 3:
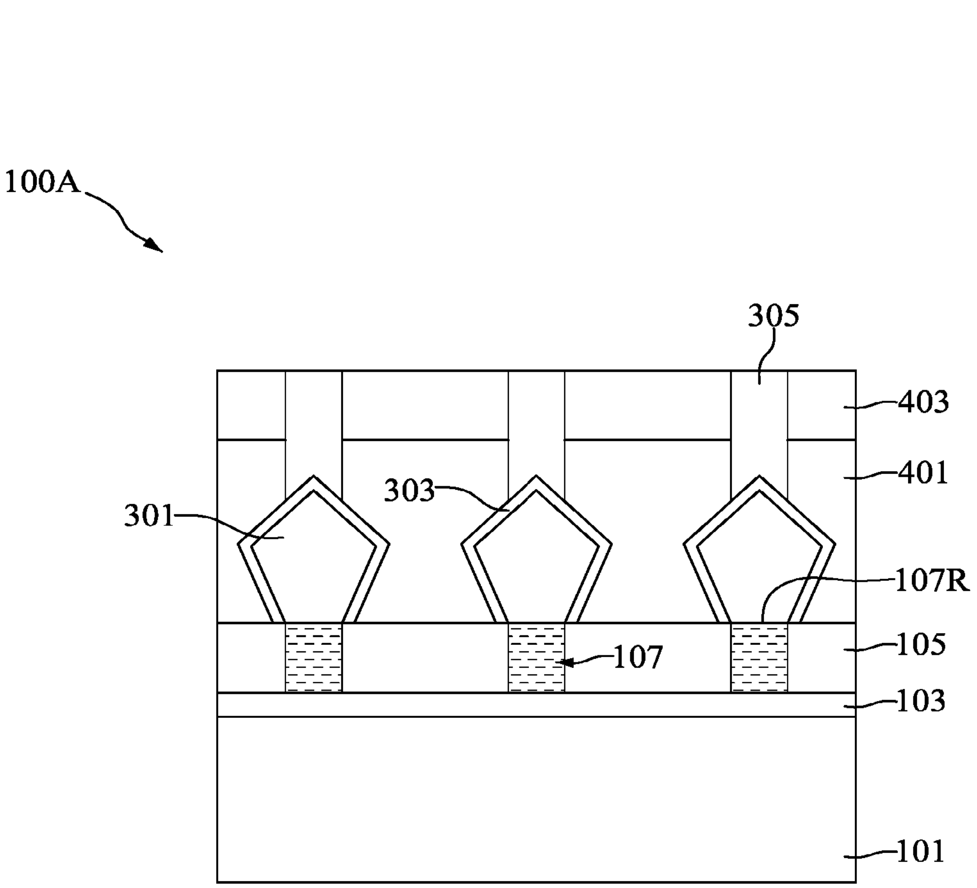
FIG. 3 is a schematic cross-sectional view diagram taken along a line B-B' in FIG. 1.

FIG. 1 illustrates, in a schematic top-view diagram, a semiconductor device 100A in accordance with one embodiment of the present disclosure. FIG. 2 is a schematic cross-sectional view diagram taken along a line A-A' in FIG. 1. FIG. 3 is a schematic cross-sectional view diagram taken along a line B-B' in FIG. 1. Some elements of the semiconductor device 100A are not shown in FIG. 1 for clarity.

With reference to FIGS. 1 to 3, in the embodiment depicted, the semiconductor device 100A may include a substrate 101, a first stop layer 103, an isolation layer 105, a plurality of fins 107, a plurality of gate structures 201, a plurality of bottom etch stop layers 211, a plurality of porous spacers 213, a plurality of source/drain regions 301, a plurality of covering layers 303, a plurality of contacts 305, a first insulating layer 401 and a second insulating layer 403.

With reference to FIGS. 1 to 3, in the embodiment depicted, the substrate 101 may be formed of, for example, silicon, silicon carbide, germanium silicon germanium, gallium arsenic, indium arsenide, indium, or other semiconductor materials including group III, group IV, or group V elements. The substrate 101 may include a silicon-on-insulator structure. For example, the substrate 101 may include a buried oxide layer formed by using a process such as separation by implanted oxygen.

With reference to FIGS. 1 to 3, in the embodiment depicted, the first stop layer 103 may be disposed on the substrate 101. The first stop layer 103 may have a thickness between about 1 nm and about 50 nm. The first stop layer 103 may be formed of, for example, silicon germanium, silicon oxide, silicon germanium oxide, silicon phosphide, or silicophosphates.

With reference to FIGS. 1 to 3, in the embodiment depicted, the plurality of fins 107 may be disposed on the first stop layer 103. The plurality of fins 107 may provide active regions for the semiconductor device 100A in which channels are formed according to voltages applied to the plurality of gate structures 201. Each of the plurality of fins 107 may extend along a first direction X. The plurality of fins 107 may be spaced apart from each other along a second direction Y crossing the first direction X. Each of the plurality of fins 107 may protrude from the first stop layer 103 in the direction Z perpendicular to the first direction X and the second direction Y. Each of the plurality of fins 107 may include a protruding portion 107P and two recessed portions 107R. The protruding portion 107P may be disposed on the first stop layer 103 and extend along the first direction X. The two recessed portions 107R may be respectively correspondingly disposed adjacent to two sides of the protruding portion 107P. A top surface of the protruding portion 107P may be at a vertical level higher than a vertical level of top surfaces of the recessed portions 107R. The plurality of fins 107 may be formed of, for example, silicon, silicon carbide, germanium silicon germanium, gallium arsenic, indium arsenide, indium, or other semiconductor materials including group III, group IV, or group V elements.

It should be noted that the plurality of fins 107 include three fins, but the number of fins is not limited thereto. For example, the number of the fins 107 may be less than three or more than three.

Alternatively, in another embodiment, the semiconductor device may include a plurality of nanowires instead of the plurality of fins 107 to provide active regions. In some embodiments, a planar semiconductor device is adopted as the semiconductor device, in which the fins 107 are replaced with a substrate having a flat upper surface.

With reference to FIGS. 1 to 3, in the embodiment depicted, the isolation layer 105 may be disposed on the first stop layer 103 and between the plurality of fins 107. Top surfaces of the isolation layer 105 may be at a same vertical level as the recessed portions 107R. The isolation layer 105 may isolate the plurality of fins 107 from each other to prevent electrical leakage between adjacent semiconductor components. The isolation layer 105 may be formed of, for example, silicon nitride, silicon oxide, silicon oxynitride, or silicon nitride oxide.

It should be noted that, in the present disclosure, silicon oxynitride refers to a substance which contains silicon, nitrogen and oxygen and in which a proportion of oxygen is greater than that of nitrogen. Silicon nitride oxide refers to a substance which contains silicon, oxygen and nitrogen and in which a proportion of nitrogen is greater than that of oxygen.

With reference to FIGS. 1 to 3, in the embodiment depicted, the plurality of gate structures 201 may be disposed on the plurality of fins 107 and the isolation layer 105. Each of the plurality of gate structures 201 may extend along the second direction Y. In other words, the plurality of gate structures 201 may intersect the plurality of fins 107 from a top-view perspective. The plurality of gate structures 201 may be spaced apart from each other along the first direction X. Each of the plurality of gate structures 201 may include a gate insulating layer 203, a gate conductive layer 205 and a gate filler layer 207.

With reference to FIGS. 1 to 3, in the embodiment depicted, the gate insulating layer 203 may have a U-shaped cross-sectional profile. The gate insulating layer 203 may be disposed on a top surface of the protruding portion 107P. The gate insulating layer 203 may have a thickness between about 0.5 nm and about 5.0 nm. In some embodiments, the thickness of the gate insulating layer 203 may be between about 0.5 nm and about 2.5 nm. The gate insulating layer 203 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof. Specifically, the gate insulating layer 203 may be formed of hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof. In other embodiments, the gate insulating layer 203 may be a multilayer structure that includes, for example, one layer of silicon oxide and another layer of high-k dielectric material.

With reference to FIGS. 1 to 3, in the embodiment depicted, the gate conductive layer 205 may have a U-shaped cross-sectional profile. The gate conductive layer 205 may be disposed on the gate insulating layer 203. The gate conductive layer 205 may have a thickness between about 10 angstroms and about 200 angstroms. Top surfaces of the gate conductive layer 205 may be at a same vertical level as the top surfaces of the gate insulating layer 203. The gate conductive layer 205 may be formed of, for example, a conductive material such as polycrystalline silicon, polycrystalline silicon germanium, metal nitride, metal silicide, metal oxide, metal, or a combination thereof. Metal nitride may be, for example, tungsten nitride, molybdenum nitride, titanium nitride or tantalum nitride. Metal silicide may be, for example, tungsten silicide, titanium silicide, cobalt silicide, nickel silicide, platinum silicide or erbium silicide. Metal oxide may be, for example, ruthenium oxide or indium tin oxide. Metal may be, for example, tungsten, titanium, aluminum, copper, molybdenum, nickel or platinum. The gate conductive layer 205 may serve to adjust a work function of the gate structure 201.

With reference to FIGS. 1 to 3, in the embodiment depicted, the gate filler layer 207 may be disposed on the gate conductive layer 205. A top surface of the gate filler layer 207 may be at a same vertical level as the top surfaces of the gate conductive layer 205. The gate filler layer 207 may be formed of, for example, tungsten or aluminum. The gate filler layer 207 may serve to fill up a space formed by the gate conductive layer 205.

With reference to FIGS. 1 to 3, for each of the plurality of the gate structures 201, two bottom etch stop layers 211 may be disposed on the top surface of the protruding portion 107P. The two bottom etch stop layers 211 may be respectively correspondingly disposed adjacent to lower portions of two sides of the gate structure 201. Specifically, the two bottom etch stop layers 211 may be disposed adjacent to lower portions of sidewalls of the gate insulating layer 203. The sidewalls of the gate insulating layer 203 may be opposite to the gate conductive layer 205. Top surfaces of the two bottom etch stop layers 211 may be at a vertical level lower than a vertical level of the top surfaces of the gate insulating layer 203. It should be noted that the two bottom etch stop layers 211 may extend along the second direction Y (for clarity, such embodiment is not shown in the top-view diagram in FIG. 1). The two bottom etch stop layers 211 may be formed of, for example, carbon-doped oxide, carbon incorporated silicon oxide, ornithine decarboxylase, or nitrogen-doped silicon carbide.

With reference to FIGS. 1 to 3, in the embodiment depicted, the plurality of porous spacers 213 may be disposed adjacent to the sides of the plurality of gate structures 201. The plurality of porous spacers 213 may extend along the second direction Y from a top-view perspective. For each of the plurality of gate structures 201, two porous spacers 213 may be disposed adjacent to the two sides of the gate structure 201. The two porous spacers 213 may be respectively correspondingly disposed on the two bottom etch stop layers 211. Top surfaces of the two porous spacers 213 may be at a same vertical level as the top surfaces of the gate insulating layer 203. The two porous spacers 213 may be formed from an energy-removable material, as will be illustrated later. For each of the two porous spacers 213, the porous spacer 213 may include a skeleton and a plurality of empty spaces disposed among the skeleton. The plurality of empty spaces may connect to each other and may be filled with air. The skeleton may include, for example, silicon oxide or methylsilsesquioxane. The two porous spacers 213 may have a porosity between 25% and 100%. It should be noted that, when the porosity is 100%, it means the porous spacer 213 includes only an empty space and the porous spacer may be regarded as an air gap. In some embodiments, the porosity of the two porous spacers 213 may be between 45% and 95%. The plurality of the porous spacers 213 may serve to electrically isolate the plurality of gate structures 201 from other conductive features such as the plurality of source/drain regions 301. In addition, the plurality of empty spaces of the porous spacer 213 may be filled with air. As a result, a dielectric constant of the porous spacer 213 may be significantly lower than a spacer formed of, for example, silicon oxide. Therefore, the porous spacer 213 may significantly reduce the parasitic capacitance between the gate structure 201 and adjacent conductive features, such as the plurality of source/drain regions 301. That is, the porous spacer 213 may significantly alleviate an interference effect between electrical signals induced or applied to the gate structure.

The energy-removable material may include a material such as a thermal decomposable material, a photonic decomposable material, an e-beam decomposable material, or a combination thereof. For example, the energy-removable material may include a base material and a decomposable porogen material that is sacrificially removed upon being exposed to an energy source.

From a top-view perspective as in FIG. 1, the plurality of source/drain regions 301 may be respectively correspondingly disposed adjacent to the sides of the plurality of gate structures 201 with the plurality of porous spacers 213 interposed therebetween. From a cross-sectional perspective as in FIG. 2, the source/drain regions 301 may be disposed on the top surfaces of the recessed portions 107R. Top surfaces of the source/drain regions 301 may be at a vertical level lower than the vertical level of the top surfaces of the two porous spacers 213. The vertical level of the top surfaces of the source/drain regions 301 may be higher than the vertical level of the top surfaces of the two bottom etch stop layers 211. From another cross-sectional perspective as in FIG. 3, the source/drain regions 301 have a pentagonal shape. Bottoms of the source/drain regions 301 may have a same width as the top surfaces of the recessed portions 107R. The plurality of source/drain regions 301 may be formed of, for example, silicon germanium or silicon carbide. A lattice constant of silicon germanium is greater than that of silicon. A lattice constant of silicon carbide is smaller than that of silicon. The plurality of source/drain regions 301 formed of silicon germanium or silicon carbide may apply a compressive or tensile stress to the plurality of fins 107 and improve the mobility of carriers in the channels.

With reference to FIGS. 1 to 3, in the embodiment depicted, the plurality of covering layers 303 may be respectively correspondingly disposed on the plurality of source/drain regions 301. Top surfaces of the plurality of covering layers 303 may be at a vertical level between the vertical level of the top surfaces of the two porous spacers 213 and the vertical level of the top surfaces of the two bottom etch stop layers 211. From a cross-sectional perspective as in FIG. 3, the covering layer 303 may be disposed on outer surfaces of the source/drain region 301 except for the bottom of the source/drain region 301. The plurality of covering layers 303 may be formed of, for example, titanium silicide, nickel silicide, nickel platinum silicide, tantalum silicide, or cobalt silicide. The plurality of covering layers 303 may serve to reduce contact resistance between the plurality of source/drain regions 301 and the plurality of contacts 305, as will be illustrated later. In addition, the plurality of covering layers 303 may have lower resistance compared to the plurality of source/drain regions 301. Therefore, in an operation of the semiconductor device 100A, most of a current may flow through the covering layer 303 to reach the fin 107, and only a small portion of the current may flow through the source/drain region 301 to reach the fin 107. As a result, the operating current consumption of the semiconductor device 100A may be low.

With reference to FIGS. 1 to 3, in the embodiment depicted, the first insulating layer 401 may be disposed on the plurality of covering layers 303 and the isolation layer 105. The first insulating layer 401 may enclose the plurality of covering layers 303 and upper portions of sidewalls of the plurality of porous spacers 213. The first insulating layer 401 may be formed of, for example, silicon oxynitride, silicon nitride oxide, silicon carbon, silicon oxide, or silicon nitride.

Alternatively, in another embodiment, the first insulating layer 401 may be formed of, for example, a low-k dielectric material having atoms of Si, C, O, B, P, N, or H. For example, the dielectric constant of the low-k dielectric material may be between about 2.4 and 3.5 depending upon mole fractions of the aforementioned atoms. The first insulating layer 401 may have a mechanical strength sufficient to support the plurality of porous spacers 213 or to prevent the plurality of porous spacers 213 from collapsing.

With reference to FIGS. 1 to 3, in the embodiment depicted, the second insulating layer 403 may be disposed on the first insulating layer 401 and the plurality of gate structures 201. The second insulating layer 403 may be formed of a same material as the first insulating layer 401, but is not limited thereto.

With reference to FIGS. 1 to 3, in the embodiment depicted, the plurality of contacts 305 may be disposed penetrating the second insulating layer 403 and the first insulating layer 401, and respectively correspondingly disposed on the plurality of covering layers 303. The plurality of contacts 305 may be formed of, for example, tungsten, copper, cobalt, ruthenium, or molybdenum.

Figure 9:
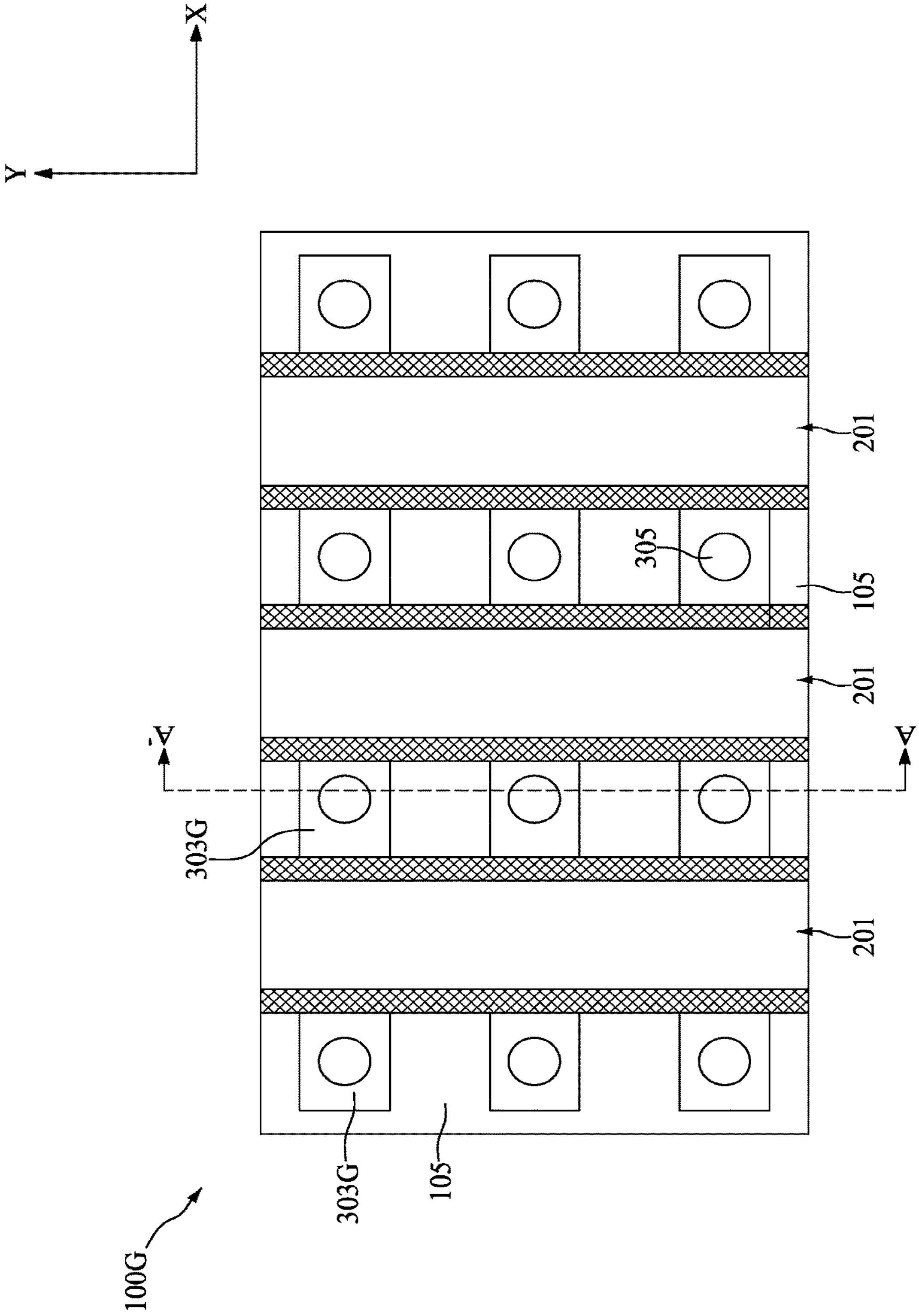
FIG. 9 illustrates, in a schematic top-view diagram, a semiconductor device in accordance with one embodiment of the present disclosure.
Figure 10:
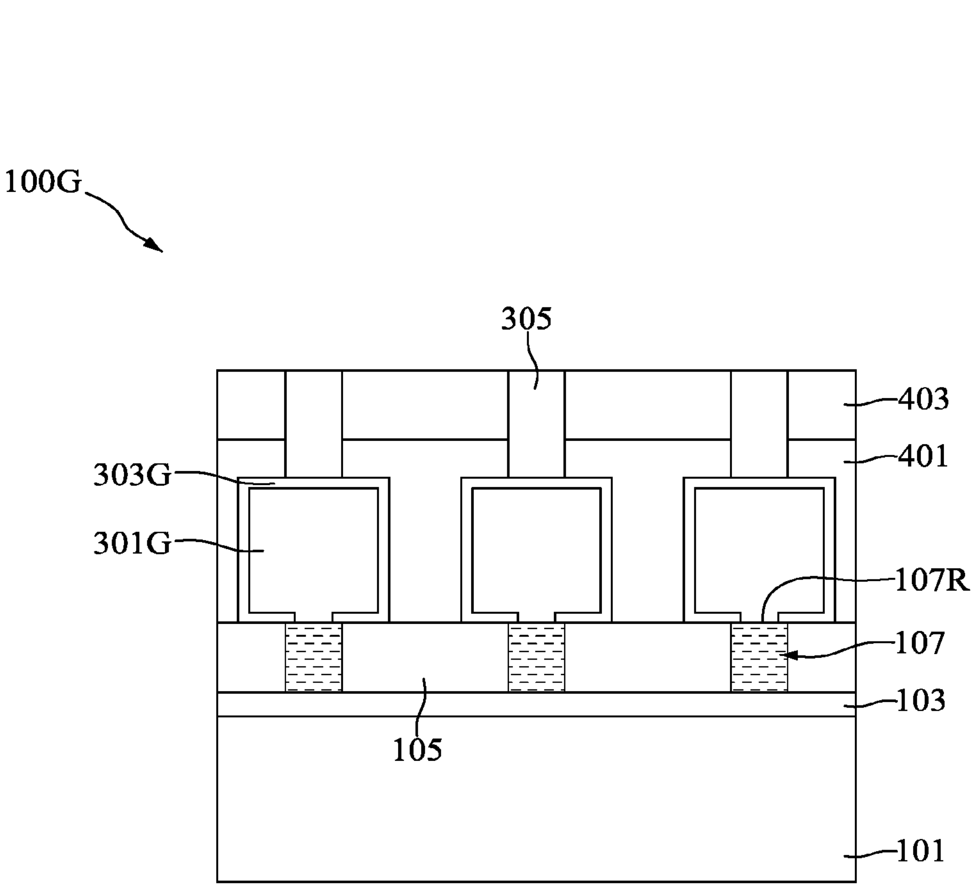
FIG. 10 is a schematic cross-sectional view diagram taken along a line A-A' in FIG. 9.

FIGS. 4 to 7, 8A and 8B illustrate, in schematic cross-sectional view diagrams similar to FIG. 2, semiconductor devices 100B, 100C, 100D, 100E and 100F in accordance with embodiments of the present disclosure. FIG. 9 illustrates, in a schematic top-view diagram, a semiconductor device 100G in accordance with one embodiment of the present disclosure. FIG. 10 is a schematic cross-sectional view diagram taken along a line A-A' in FIG. 9.

Figure 4:
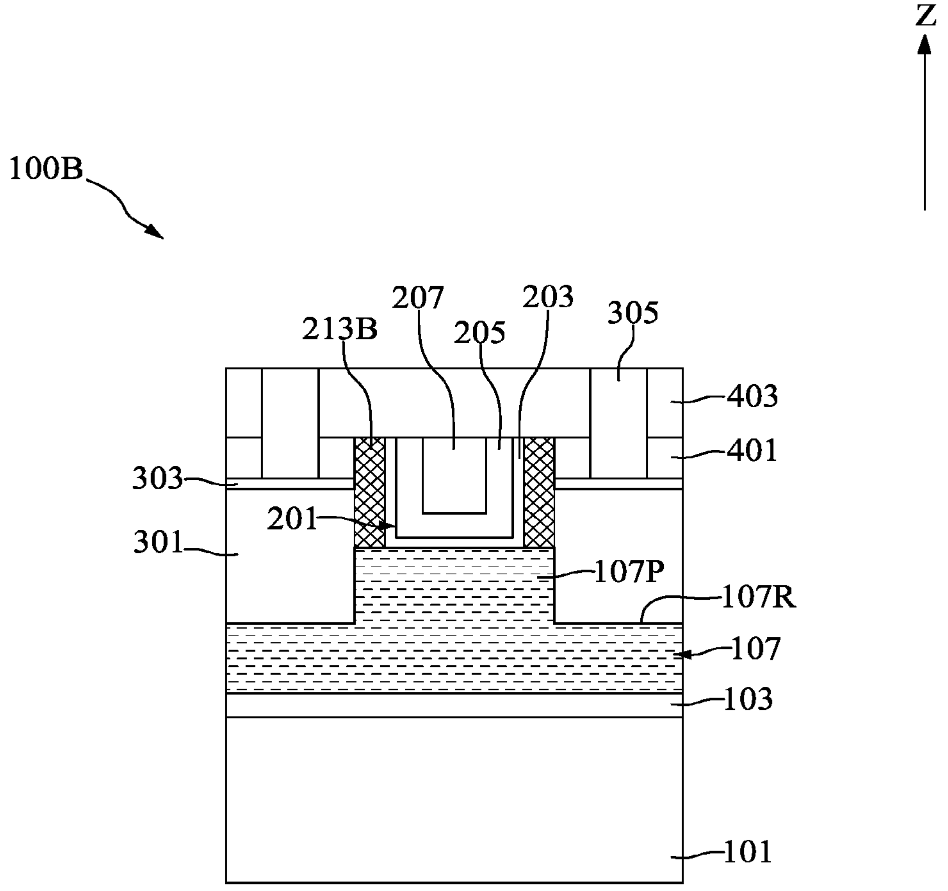
FIGS. 4 to 7, 8A and 8B illustrate, in schematic cross-sectional view diagrams similar to that in FIG. 2, semiconductor devices in accordance with embodiments of the present disclosure.
Figure 5:
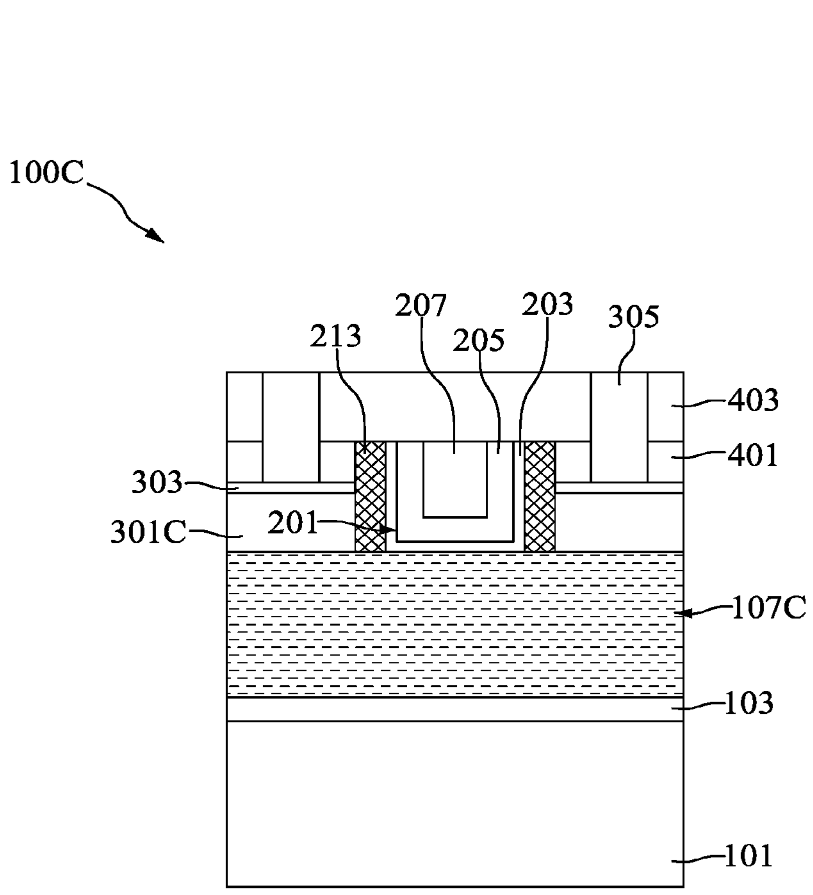

With reference to FIG. 4, in the semiconductor device 100B, the two porous spacers 213B may be disposed on a top surface of the protruding portion 107P. The bottom etch stop layers 211 may not be present. With reference to FIG. 5, in the semiconductor device 100C, each of the plurality of fins 107C may have no recessed portions. Bottoms of the source/drain regions 301C may be at a same vertical level as a vertical level of a bottom of the gate insulating layer 203.

Figure 6:
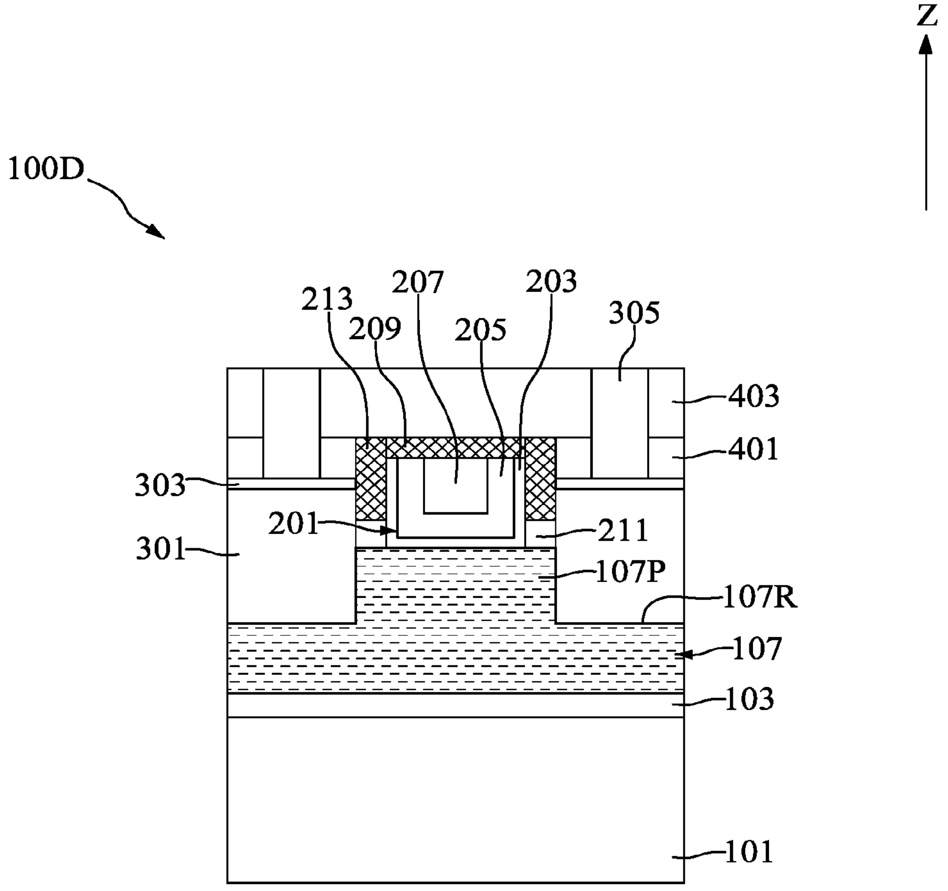

With reference to FIG. 6, the semiconductor device 100D may include a porous capping layer 209. The porous capping layer 209 may be disposed on the top surfaces of the gate insulating layer 203, the top surfaces of the gate conductive layer 205, and the top surface of the gate filler layer 207. The porous capping layer 209 may be disposed between the two porous spacers 213 and disposed below the second insulating layer 403. The porous capping layer 209 may have a porosity between 25% and 100%. In some embodiments, the porosity of the porous capping layer 209 may be between 45% and 95%. The porous capping layer 209 may have the same structural feature as the porous spacers 213 and may significantly reduce the parasitic capacitance between the gate structure 201 and conductive features disposed above the gate structure 201.

Figure 7:
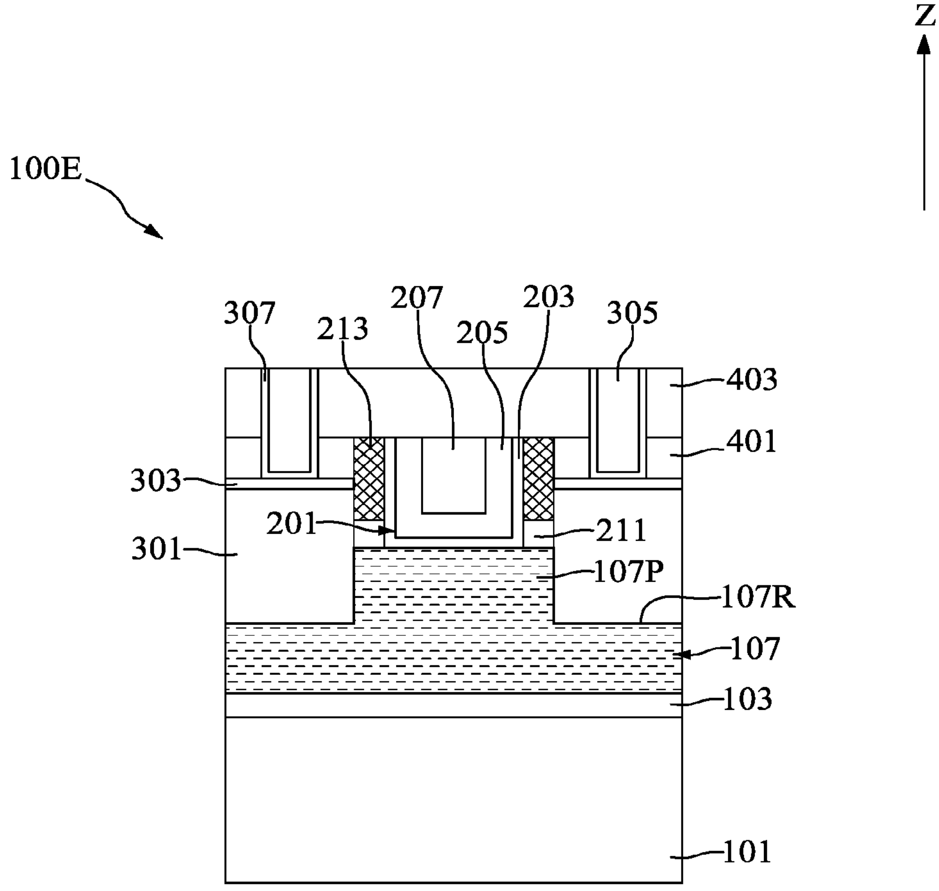

With reference to FIG. 7, the semiconductor device 100E may include a plurality of contact liners 307. The plurality of contact liners 307 may be respectively correspondingly disposed between the plurality of contacts 305 and the plurality of covering layers 303. The contact liner 307 may serve as a protective layer for its underlying structure (e.g., the covering layer 303 and the source/drain region 301) during formation of the contact 305. The contact liner 307 may also serve as an adhesive layer between the contact 305 and the covering layer 303 or between the contact 305 and the source/drain region 301.

Figure 8A:
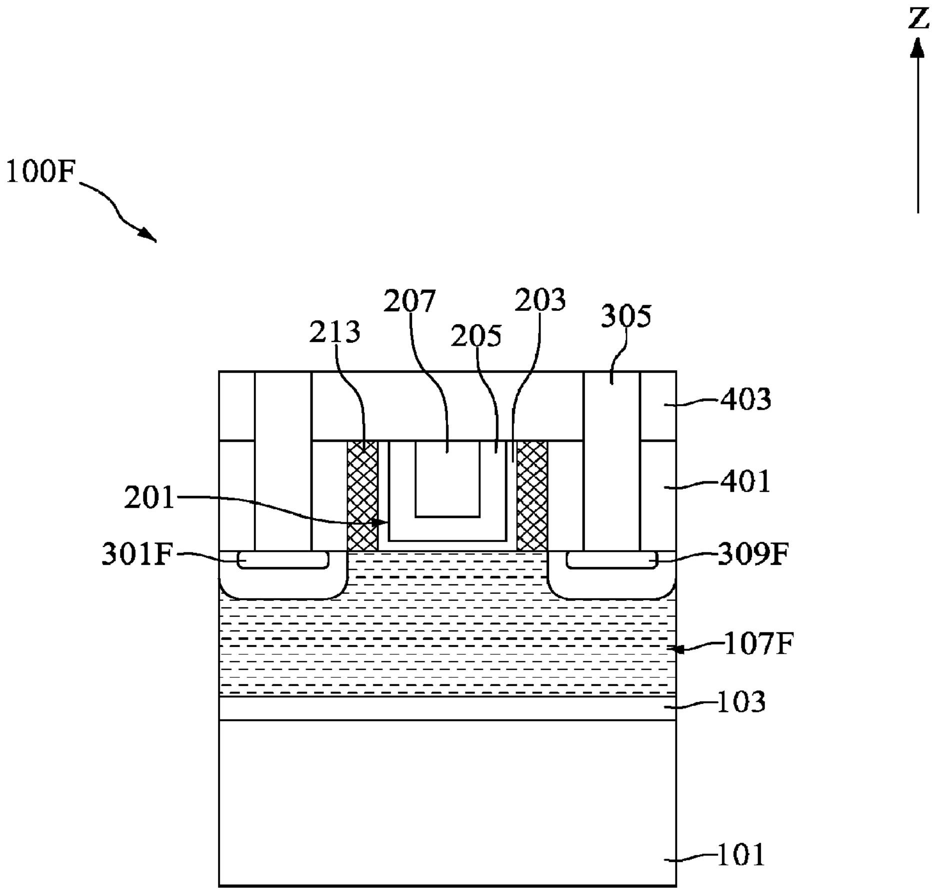
Figure 8B:
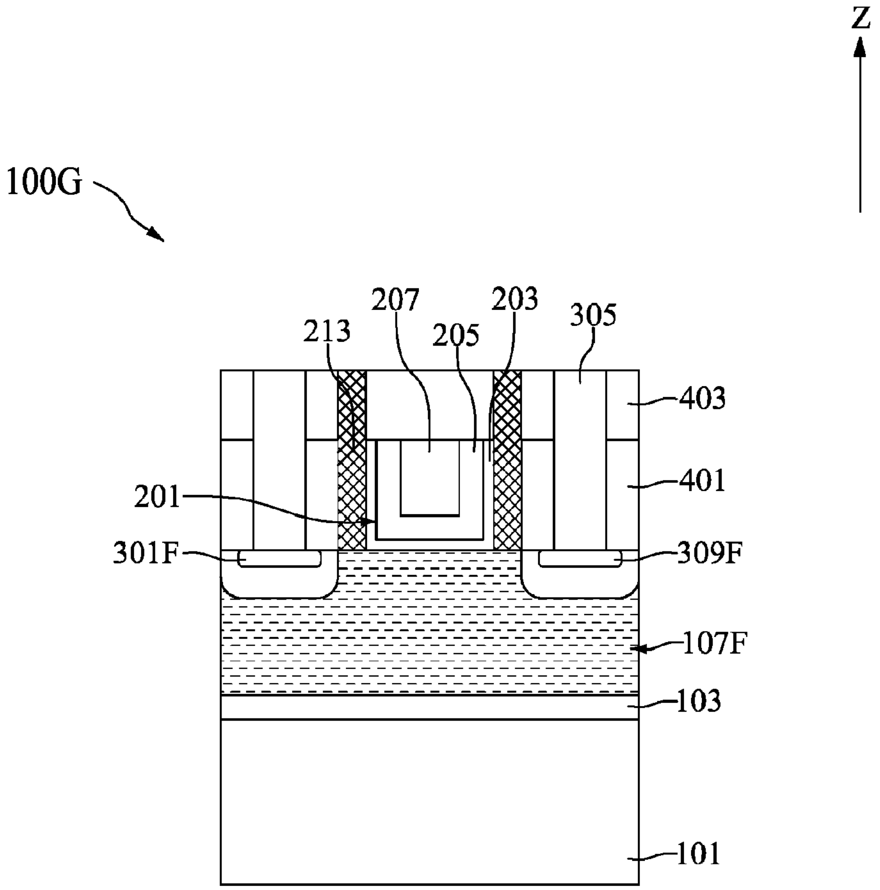

With reference to FIG. 8A, in the semiconductor device 100F, each of the plurality of fins 107F may have no recessed portions, referred to herein as a planar-type substrate or semiconductor device. The source/drain regions 301F may be disposed in the fin 107F and respectively correspondingly adjacent to the two porous spacers 213. The source/drain regions 301F may be include silicon doped with dopants or silicon germanium doped with dopants. The dopants may be phosphorus, arsenic, antimony, boron, or indium. With reference to FIG. 8B, the semiconductor device 100G is similar to the semiconductor device 100F. The gate structure 201 is extended to the upper surface of the second insulating layer 403 and has a top surface level with the upper surface of the second insulating layer 403. The second insulating layer 403 may be absent from the semiconductor device 100G and replaced with the first insulating layer 401.

With reference to FIGS. 9 and 10, in the semiconductor device 100G, the source/drain region 301G may have a square shape. The covering layer 303G may be disposed on portions of a bottom of the source/drain region 301, sidewalls of the source/drain region 301, and a top surface of the source/drain region 301. Alternatively, in another embodiment, the source/drain region 301 may have a rectangular shape, a diamond shape, a circular shape, or a shape having more than five sides.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

Figure 11:
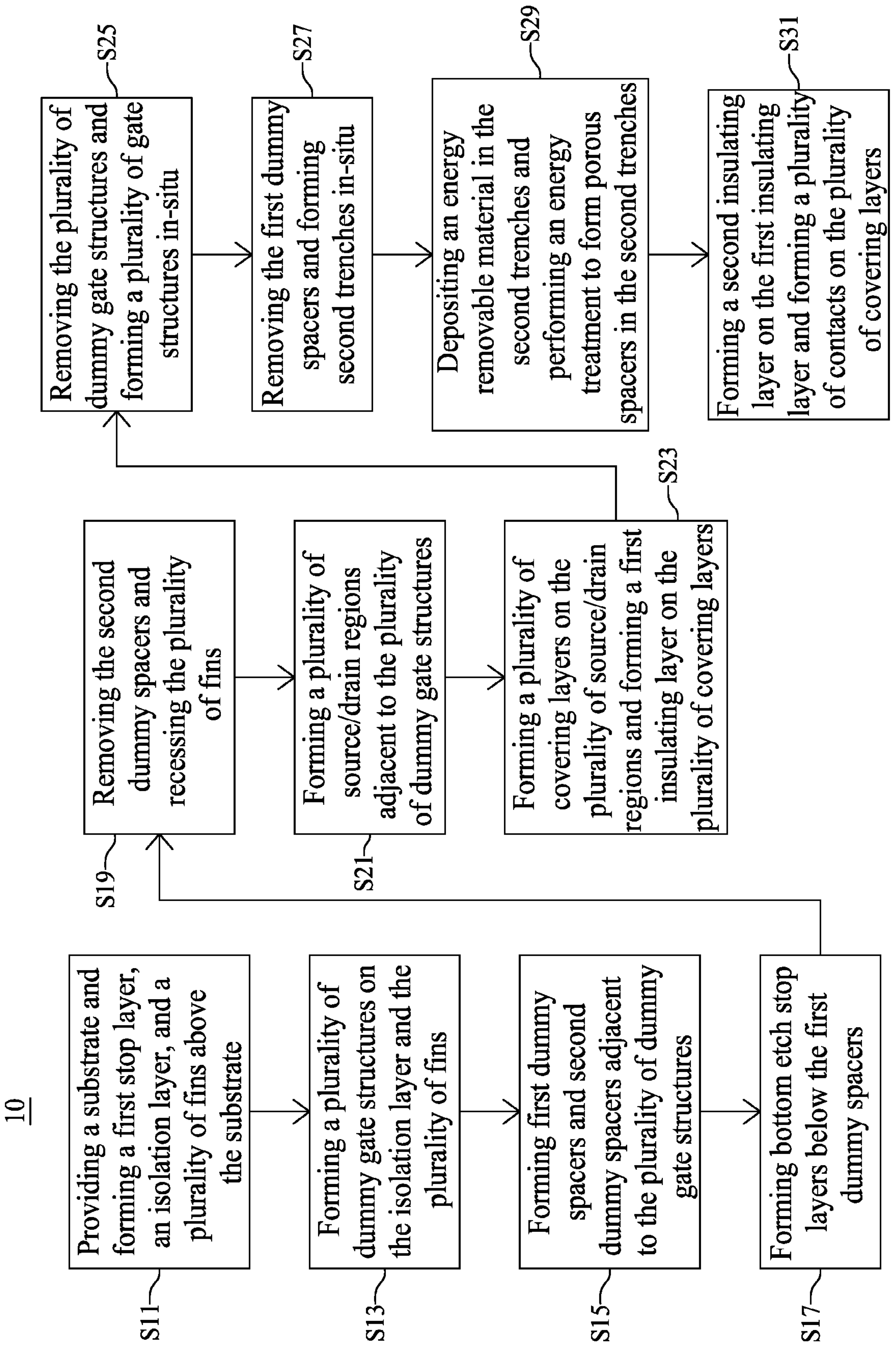
FIG. 11 illustrates, in a flowchart diagram form, a method for fabricating a semiconductor device in accordance with one embodiment of the present disclosure.
Figure 12:
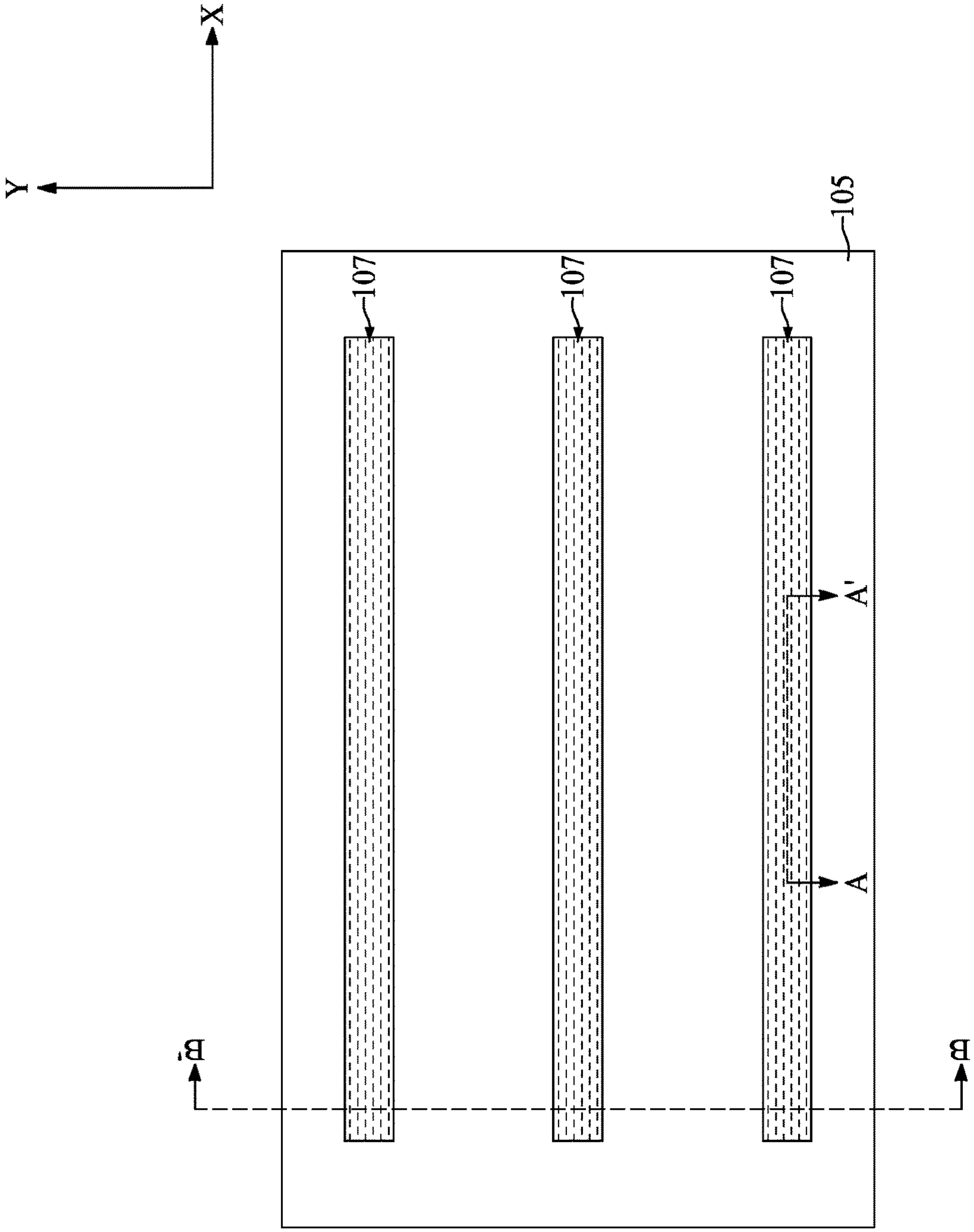
FIG. 12 illustrates, in a schematic top-view diagram, an intermediate semiconductor device in accordance with one embodiment of the present disclosure.
Figure 13:
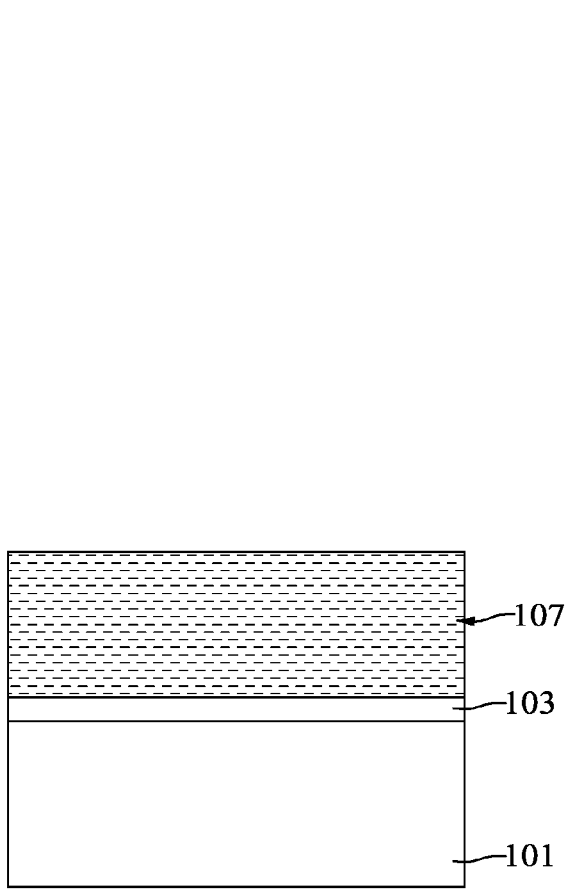
FIG. 13 is a schematic cross-sectional view diagram taken along the line A-A' in FIG. 12 illustrating part of a flow for fabricating the semiconductor device in accordance with one embodiment of the present disclosure.
Figure 14:
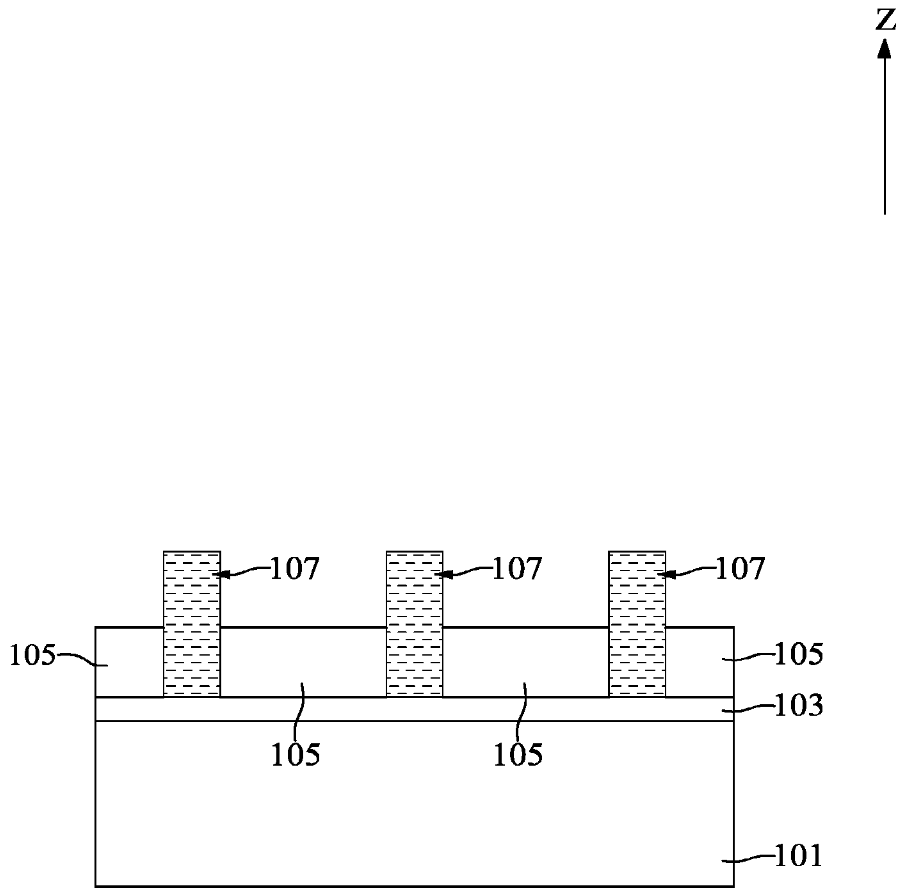
FIG. 14 is a schematic cross-sectional view diagram taken along the line B-B' in FIG. 12 illustrating part of a flow for fabricating the semiconductor device in accordance with one embodiment of the present disclosure.

FIG. 11 illustrates, in a flowchart diagram form, a method 10 for fabricating a semiconductor device 100A in accordance with one embodiment of the present disclosure. FIG. 12 illustrates, in a schematic top-view diagram, an intermediate semiconductor device in accordance with one embodiment of the present disclosure. FIG. 13 is a schematic cross-sectional view diagram taken along the line A-A' in FIG. 12 illustrating part of a flow for fabricating the semiconductor device 100A in accordance with one embodiment of the present disclosure. FIG. 14 is a schematic cross-sectional view diagram taken along the line B-B' in FIG. 12 illustrating part of the flow for fabricating the semiconductor device 100A in accordance with one embodiment of the present disclosure.

With reference to FIGS. 11 to 14, at step S11, in the embodiment depicted, a substrate 101 may be provided, and a first stop layer 103, an isolation layer 105 and a plurality of fins 107 may be formed above the substrate 101. The first stop layer 103 may be formed on the substrate 101. A semiconductor layer (not shown) may be formed on the first stop layer 103 and may be etched until a top surface of the first stop layer 103 is exposed to form the plurality of fins 107. Because the etching process stops at the top surface of the first stop layer 103, a height of the plurality of fins 107 may be approximately equal to a thickness of the semiconductor layer, such that the thickness of the semiconductor layer may be effectively controlled. Consequently, the height of the plurality of fins 107, and thus the channel width of the semiconductor device 100A, may be effectively controlled in accordance with the requirements of circuit design, thereby obtaining good device performance.

The semiconductor layer may be, for example, a silicon layer and may be epitaxially grown on the first stop layer 103. In some embodiments, a layer of photoresist material (not shown) may be deposited over the semiconductor layer and may be patterned and developed to remove a portion of the photoresist material. The remaining photoresist material may protect the underlying material during subsequent semiconductor processes, such as an etching process. It should be noted that other masks, such as a silicon oxide mask or a silicon nitride mask, may also be used in the etching process.

With reference to FIG. 14, an insulating material such as silicon nitride, silicon oxide, silicon oxynitride, or silicon nitride oxide may be deposited to fill trenches between the plurality of fins 107 and form the isolation layer 105. Upper portions of the isolation layer 105 may be recessed to expose upper portions of the plurality of fins 107. A recess process may include a selective etching process.

Figure 15:
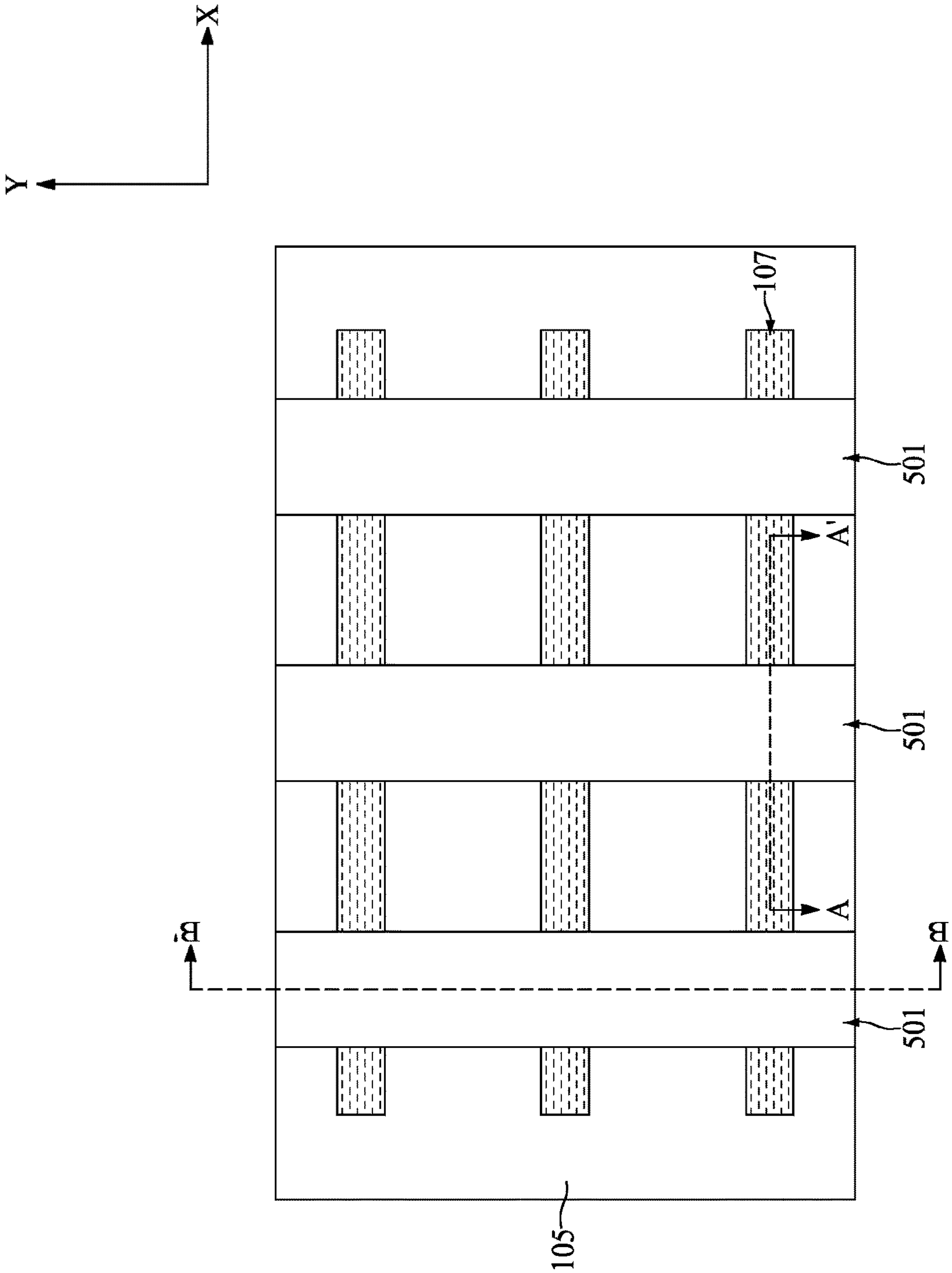
FIG. 15 illustrates, in a schematic top-view diagram, an intermediate semiconductor device in accordance with one embodiment of the present disclosure.
Figure 16:
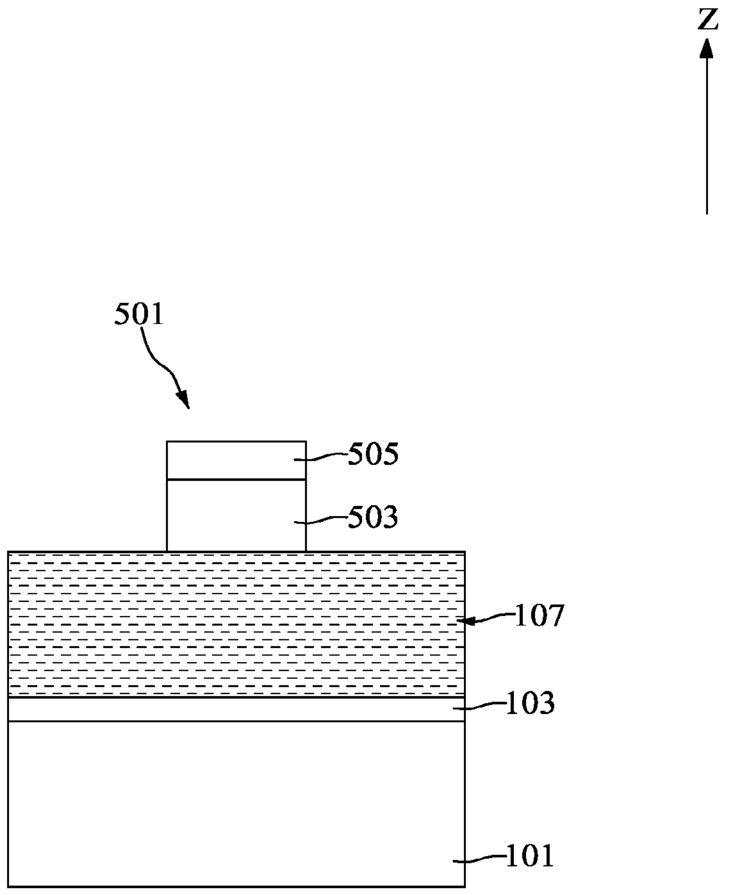
FIG. 16 is a schematic cross-sectional view diagram taken along the line A-A' in FIG. 15 illustrating part of a flow for fabricating the semiconductor device in accordance with one embodiment of the present disclosure.
Figure 17:
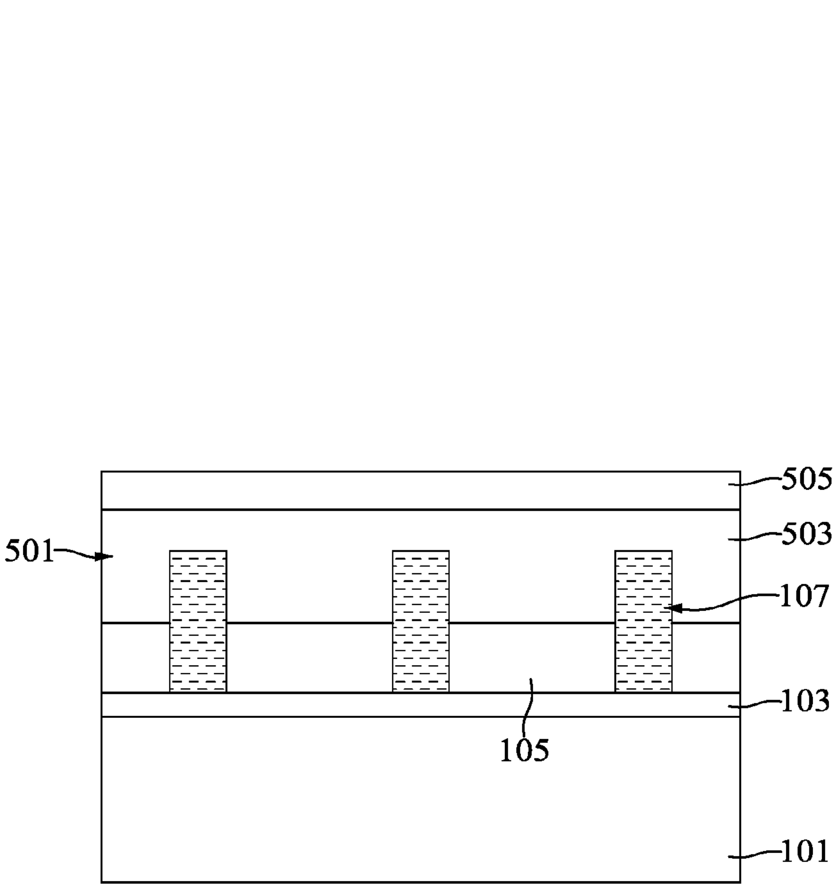
FIG. 17 is a schematic cross-sectional view diagram taken along the line B-B' in FIG. 15 illustrating part of a flow for fabricating a semiconductor device in accordance with one embodiment of the present disclosure.

FIG. 15 illustrates, in a schematic top-view diagram, an intermediate semiconductor device in accordance with one embodiment of the present disclosure. FIG. 16 is a schematic cross-sectional view diagram taken along the line A-A' in FIG. 15 illustrating part of the flow for fabricating the semiconductor device 100A in accordance with one embodiment of the present disclosure. FIG. 17 is a schematic cross-sectional view diagram taken along the line B-B' in FIG. illustrating part of the flow for fabricating the semiconductor device 100A in accordance with one embodiment of the present disclosure. FIGS. 18 to 25 are schematic cross-sectional view diagrams taken along the line A-A' in FIG. 15 illustrating parts of the flow for fabricating the semiconductor device 100A in accordance with one embodiment of the present disclosure.

With reference to FIGS. 11 and 15 to 17, at step S13, in the embodiment depicted, a plurality of dummy gate structures 501 may be formed on the isolation layer 105 and the plurality of fins 107. Each of the plurality of dummy gate structures 501 may include a dummy gate bottom layer 503 and a dummy gate mask layer 505. The dummy gate bottom layer 503 may be formed on the isolation layer 105 and the plurality of fins 107. The dummy gate bottom layer 503 may be formed of, for example, polysilicon. The dummy gate mask layer 505 may be formed on the dummy gate bottom layer 503. The dummy gate mask layer 505 may be formed of, for example, silicon nitride, silicon oxynitride, silicon nitride oxide, aluminum oxide, or zirconium oxide.

Figure 18:
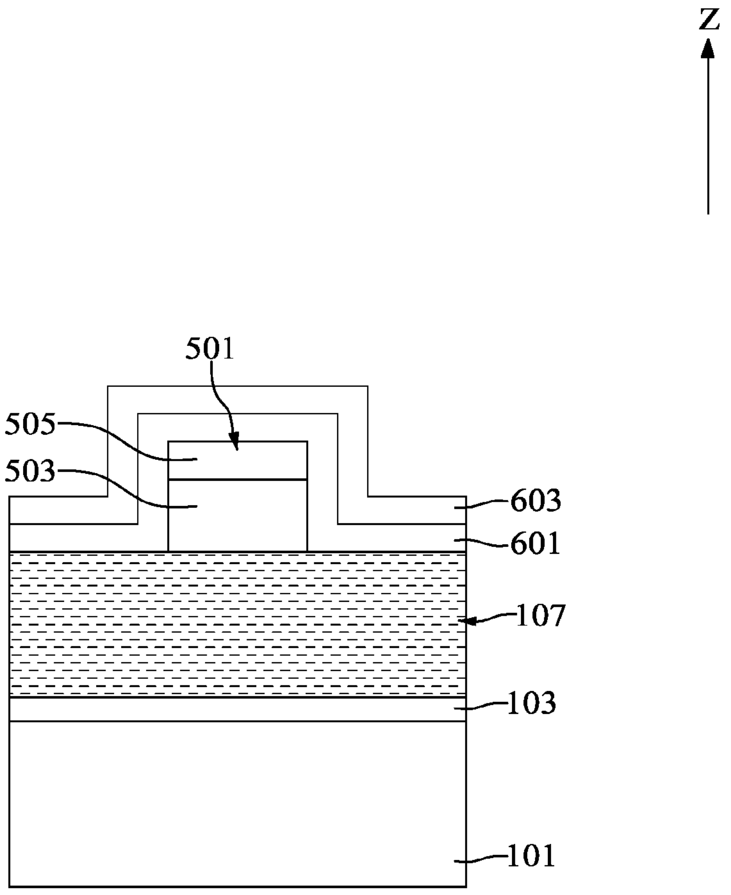
FIGS. 18 to 25 are schematic cross-sectional view diagrams taken along the line A-A' in FIG. 15 illustrating parts of a flow for fabricating a semiconductor device in accordance with one embodiment of the present disclosure.
Figure 19:
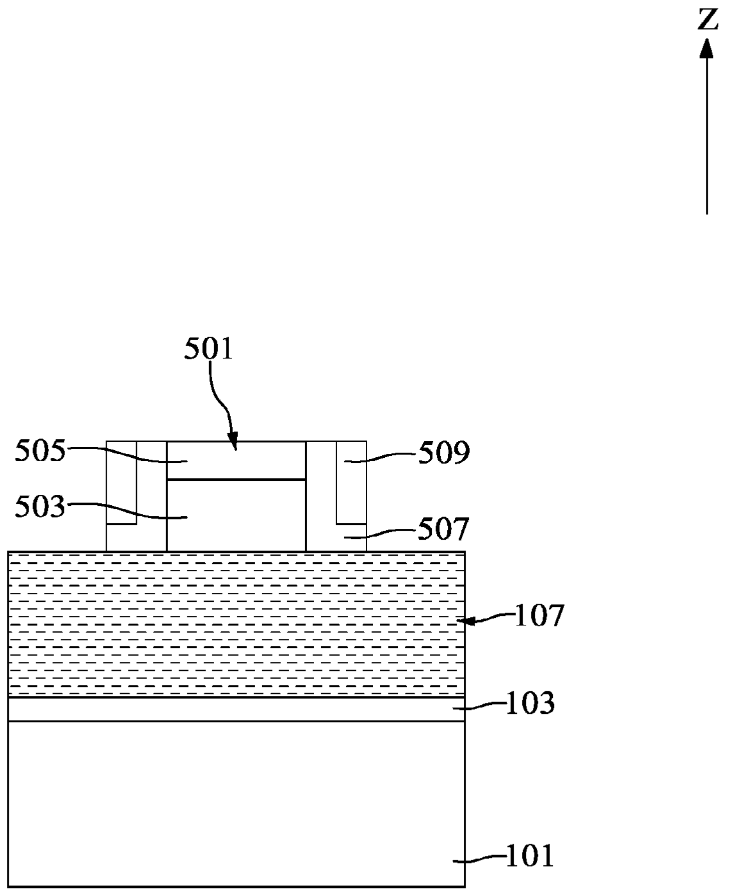

With reference to FIGS. 11, 18 and 19, at step S15, in the embodiment depicted, first dummy spacers 507 and second dummy spacers 509 may be formed adjacent to the dummy gate structure 501. With reference to FIG. 18, a layer of a first dummy spacer material 601 may be formed to cover the fin 107, sidewalls of the dummy gate bottom layer 503, sidewalls of the dummy gate mask layer 505, and a top surface of the dummy gate mask layer 505. The first dummy spacer material 601 may be, for example, silicon oxide, silicon nitride, silicon oxynitride, silicon nitride oxide, aluminum oxide, or zirconium oxide. A layer of a second dummy spacer material 603 may be formed to cover the layer of the first dummy spacer material 601. The second dummy spacer material 603 may be, for example, silicon oxide, silicon nitride, silicon oxynitride, silicon nitride oxide, aluminum oxide, or zirconium oxide. The first dummy spacer material 601 may be different from the second dummy spacer material 603.

With reference to FIG. 19, a first etching process may be performed to remove portions of the second dummy spacer material 603 and form the two second dummy spacers 509 adjacent to sides of the dummy gate structure 501. The first etching process may have an etching selectivity to the second dummy spacer material 603. The selectivity of an etching process may be generally expressed as a ratio of etching rates. For example, if one material is etched 25 times faster than other materials, the etch process may be described as having a selectivity of 25:1 or simply 25. In this regard, higher ratios or values indicate more selective etching processes. In the first etching process, an etching rate for the second dummy spacer material 603 may be greater than an etching rate of the first dummy spacer material 601, an etching rate of the dummy gate mask layer 505, and an etching rate of the fin 107. The selectivity of the first etching process may be greater than or equal to about 10, greater than or equal to about 12, greater than or equal to about 15, greater than or equal to about 20, or greater than or equal to about 25.

With reference to FIG. 19, a second etching process may be performed to remove portions of the first dummy spacer material 601 and form the two first dummy spacers 507 adjacent to sides of the dummy gate structure 501. The second etching process may have an etching selectivity to the first dummy spacer material 601. In the second etching process, an etching rate for the first dummy spacer material 601 may be greater than an etching rate of the second dummy spacer material 603, an etching rate of the dummy gate mask layer 505, and an etching rate of the fin 107. The selectivity of the second etching process may be greater than or equal to about 10, greater than or equal to about 12, greater than or equal to about 15, greater than or equal to about 20, or greater than or equal to about 25.

Figure 20:
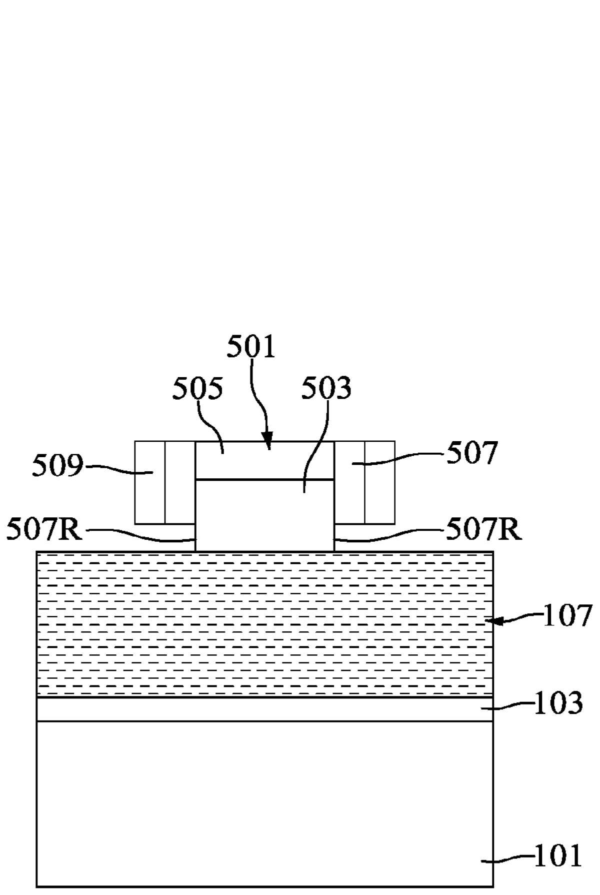

With reference to FIGS. 11 and 20 to 22, at step S17, in the embodiment depicted, two bottom etch stop layers 211 may be respectively correspondingly formed below the two first dummy spacers 507. With reference to FIG. 20, the two second dummy spacers 509 may act as an etching mask. A lateral recess process may be performed to remove portions of the two first dummy spacers 507 and concurrently form recessed portions of first dummy spacers 507R. The lateral recess process may be, for example, an isotropic wet etching process.

Figure 21:
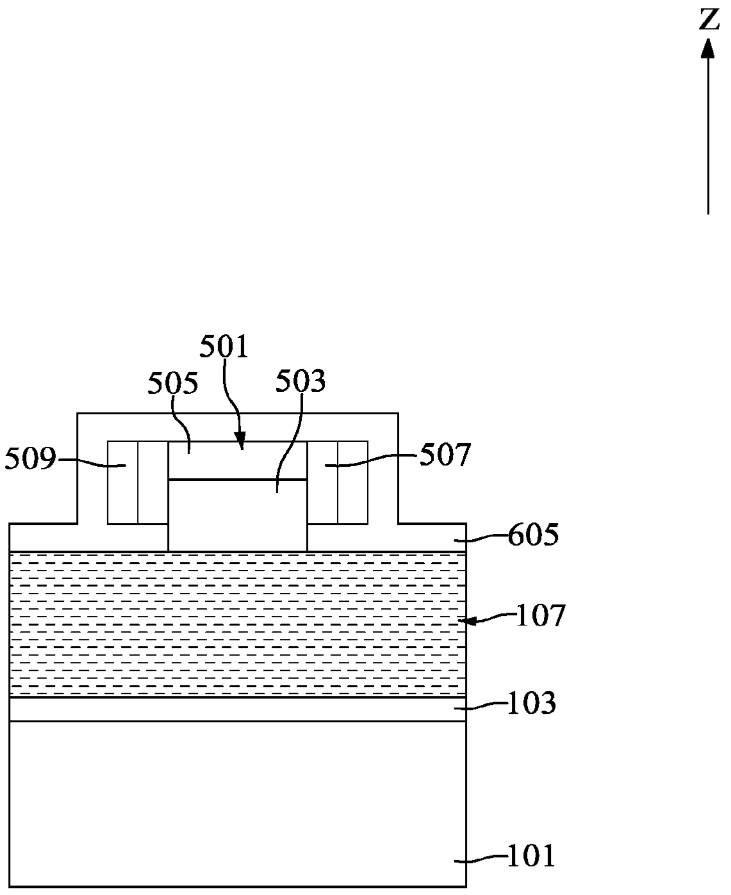
Figure 22:
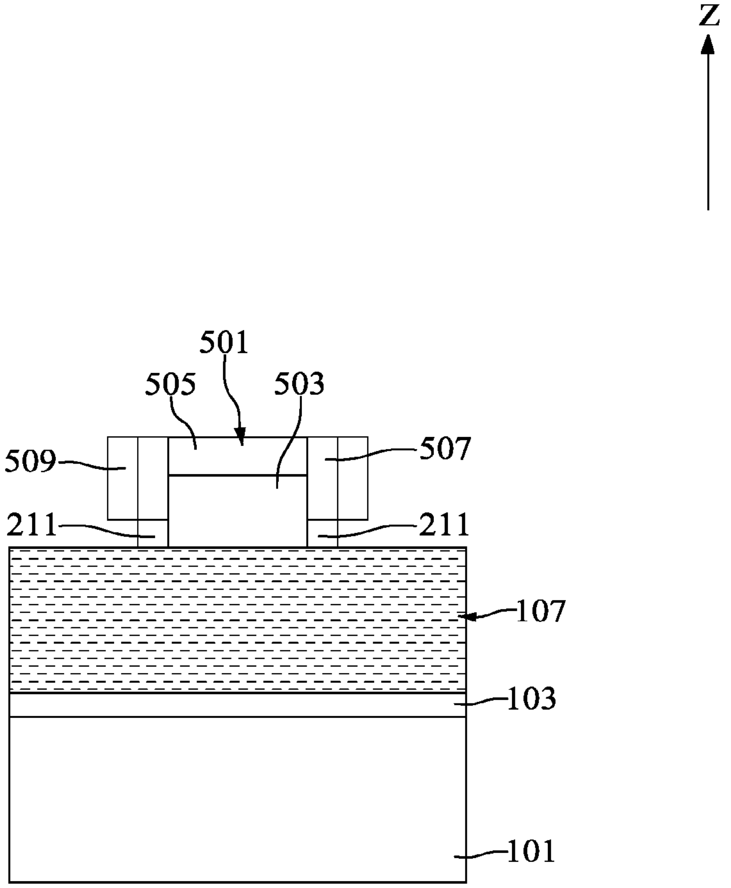

With reference to FIG. 21, a layer of a bottom etch stop layer material 605 may be deposited in the recessed portions of the first dummy spacers 507R and over the two first dummy spacers 507, the two second dummy spacers 509, and the dummy gate mask layer 505. The bottom etch stop layer material 605 may be, for example, carbon-doped oxide, carbon incorporated silicon oxide, ornithine decarboxylase, or nitrogen-doped silicon carbide. The deposition of the layer of the bottom etch stop layer material 605 may be performed using, for example, chemical vapor deposition, plasma-enhanced chemical vapor deposition, atomic layer deposition, physical vapor deposition, or spin-on deposition. With reference to FIG. 22, an etch-back process may be performed to remove portions of the layer of the bottom etch stop layer material 605 and concurrently form the two bottom etch stop layers 211. The etch-back process may be an anisotropic etching process such as reactive ion etching or wet etching. The etch-back process may be generally difficult to control with precision. However, the two second dummy spacers 509 may protect the two first dummy spacers 507 during the etch-back process, such that the length of these features can be precisely controlled and consistently produced.

Figure 23:
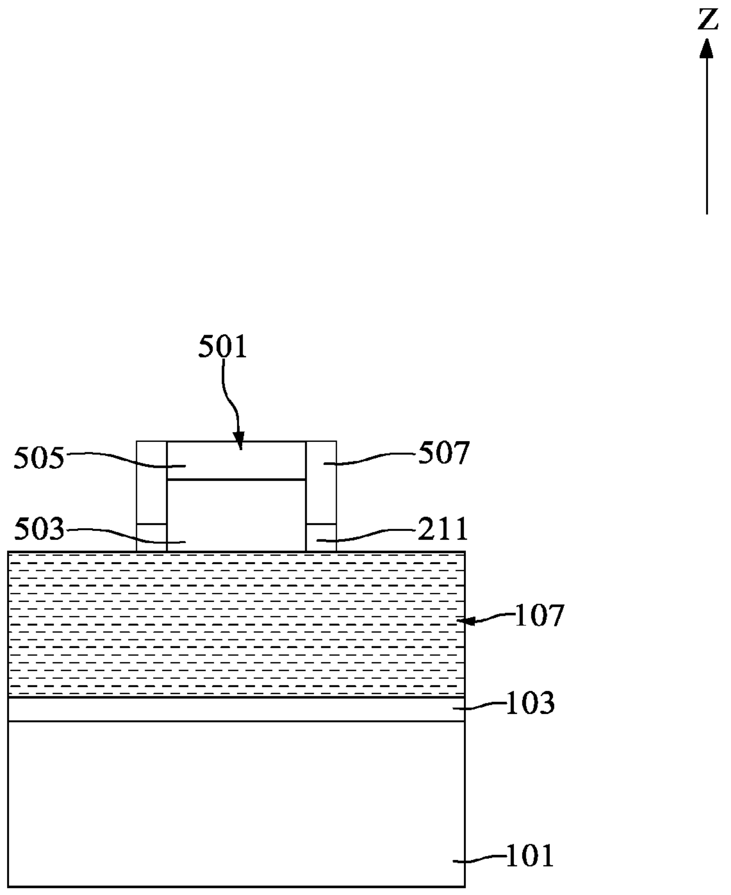
Figure 24:
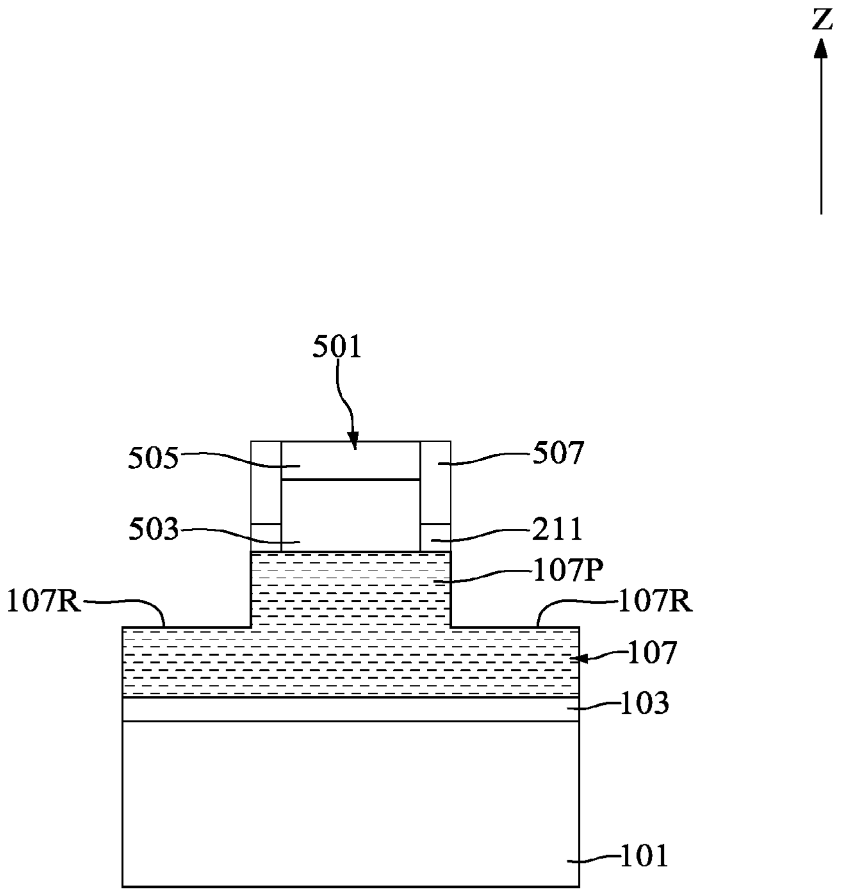

With reference to FIGS. 11, 23 and 24, at step S19, in the embodiment depicted, the two second dummy spacers 509 may be removed and the plurality of fins 107 may be recessed. With reference to FIG. 23, the two second dummy spacers 509 may be removed by a first etching process. In the first etching process, an etching rate for the two second dummy spacers 509 may be greater than an etching rate of the two first dummy spacers 507, an etching rate of the dummy gate mask layer 505, an etching rate of the two bottom etch stop layers 211, and an etching rate of the fin 107. With reference to FIG. 24, a second etching process may be performed to recess portions of the fin 107 adjacent to the sides of the gate structure 201. After the second etching process, the fin 107 may include a protruding portion 107P and recessed portions 107R adjacent to the protruding portion 107P. In the second etching process, an etching rate for the fin 107 may be greater than an etching rate of the two first dummy spacers 507, an etching rate of the dummy gate mask layer 505, and an etching rate of the two bottom etch stop layers 211.

In embodiments where the bottom etch stop layer 211 is not present (see FIG. 5), the fabrication process shown in FIG. 11 and FIGS. 12 to 24 can be simplified. For example, referring to FIG. 18, only the first dummy spacer material 601 is necessary to be deposited over the dummy gate structure 501 and the fin 107. Referring to FIGS. 19 to 23, only one round of etching operation may be required to remove horizontal portions of the first dummy spacer material 601 to leave vertical portions of the first dummy spacer material 601 on the sidewalls of the dummy gate structure 501. The first dummy spacers 507 thus formed may extend from the upper surface of the dummy gate mask layer 505 to the bottom surface of the dummy gate bottom layer 503 in place of the bottom etch stop layers 211, with a cross-sectional profile similar to the cross-sectional view of the porous spacer 213 shown in FIG. 5.

Figure 25:
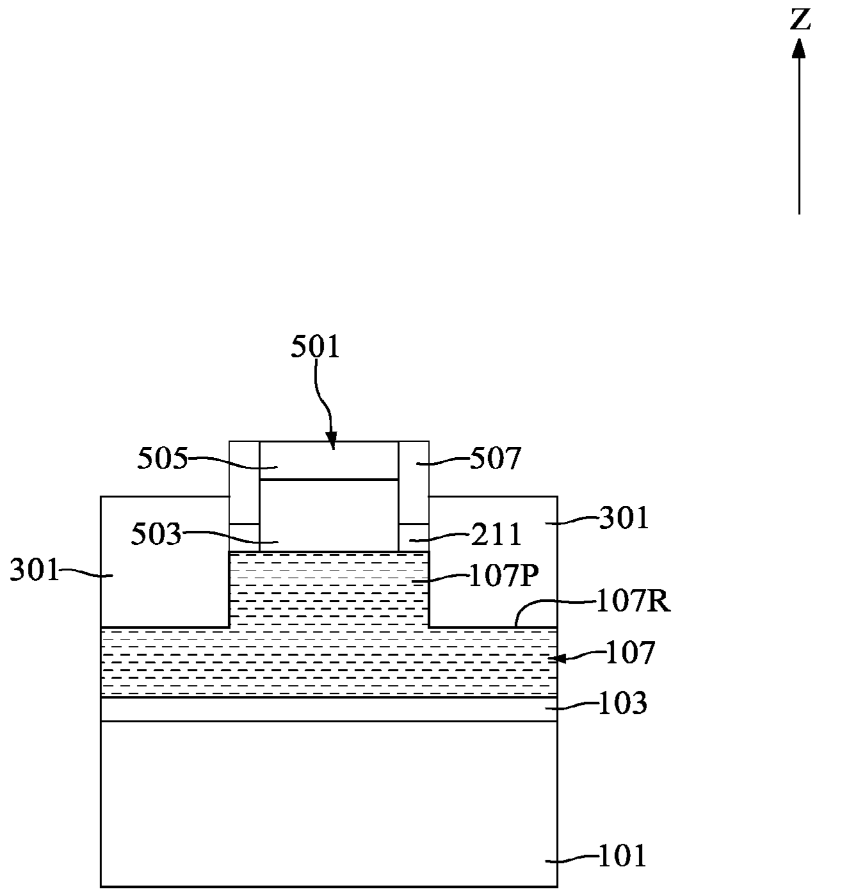

With reference to FIGS. 11 and 25, at step S21, in the embodiment depicted, a plurality of source/drain regions 301 may be respectively correspondingly formed on the recessed portions 107R and adjacent to the plurality of dummy gate structures 501. The plurality of source/drain regions 301 may be formed by an epitaxial growth process. The plurality of source/drain regions 301 may be in-situ doped during the epitaxial growth process or may be doped with an implantation process after the epitaxial growth process. The plurality of source/drain regions 301 may include silicon and dopants such as phosphorus, arsenic, antimony, boron, or indium. The plurality of source/drain regions 301 may have a dopant concentration between about 1E19 atoms/$cm^3$ and about 5E21 atoms/$cm^3$. An annealing process may be performed to activate the plurality of source/drain regions 301. The annealing process may have a process temperature between about 800° C. and about 1250° C. The annealing process may have a process duration between about 1 millisecond and about 500 milliseconds. The annealing process may be, for example, a rapid thermal anneal, a laser spike anneal, or a flash lamp anneal.

Figure 26:
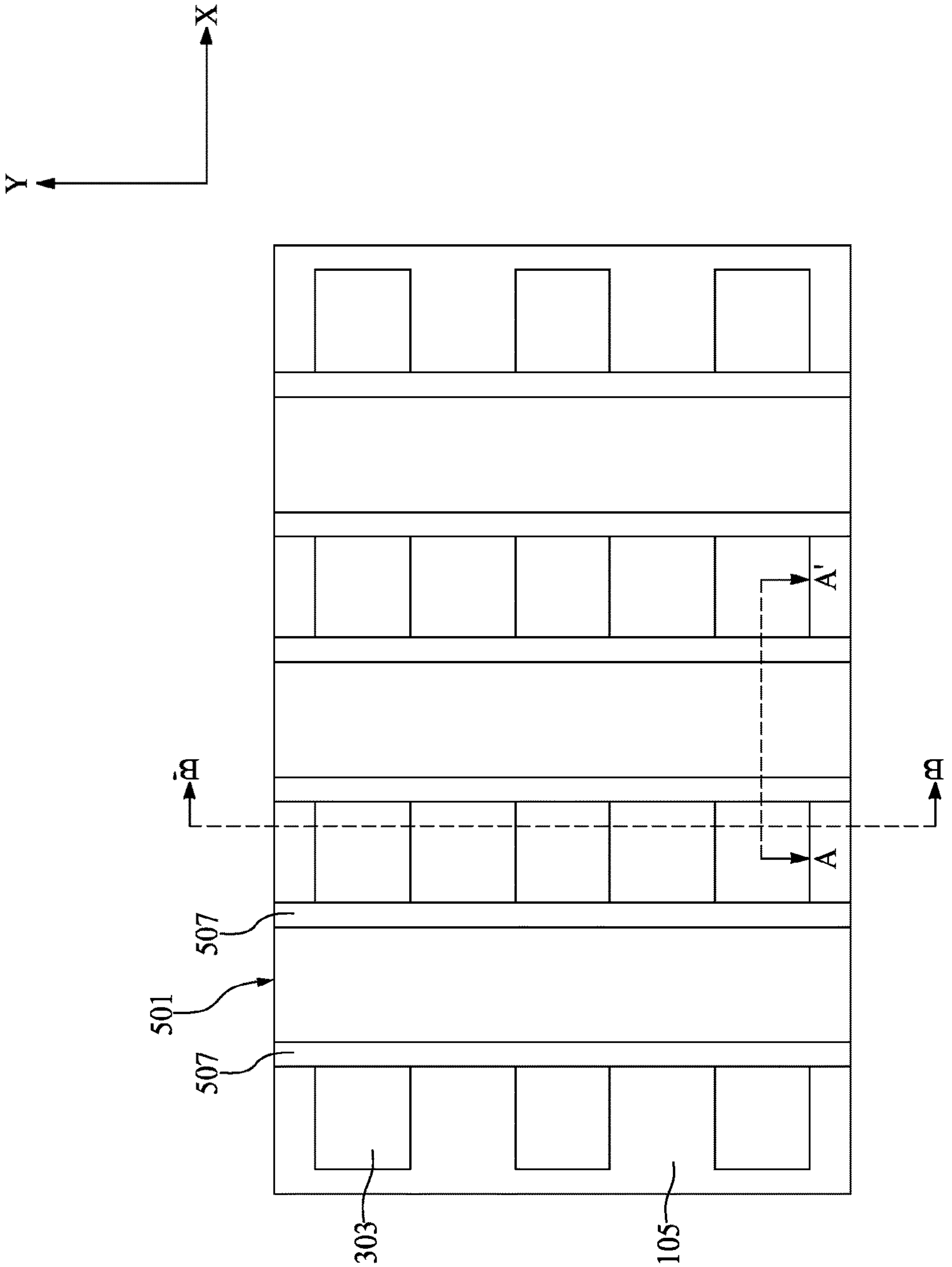
FIG. 26 illustrates, in a schematic top-view diagram, an intermediate semiconductor device in accordance with one embodiment of the present disclosure.
Figure 27:
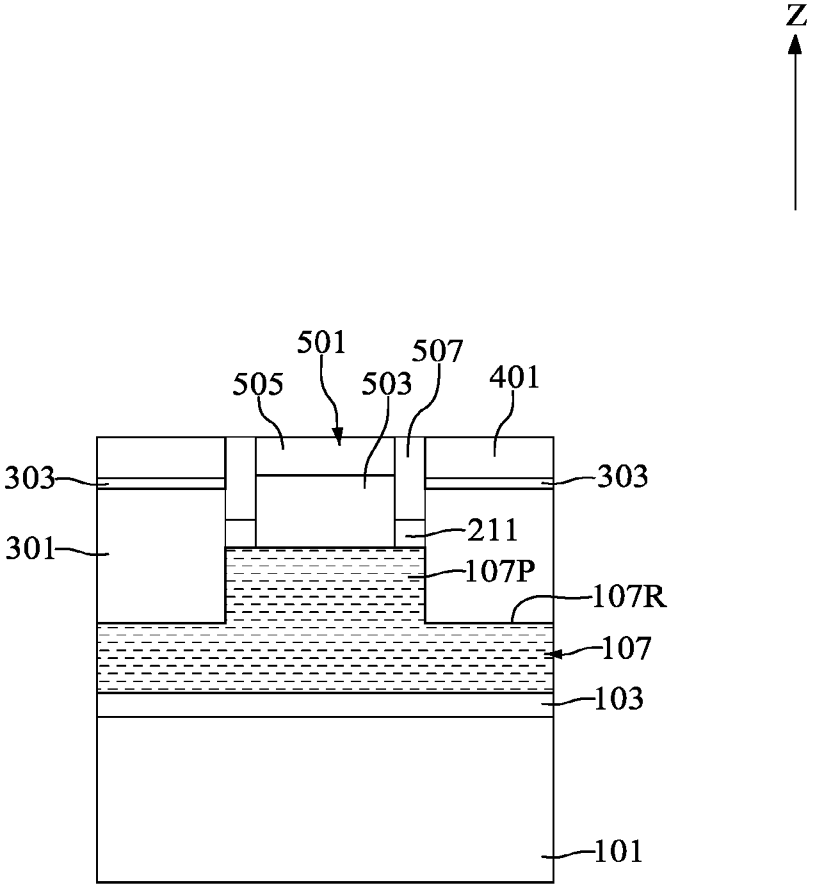
FIG. 27 is a schematic cross-sectional view diagram taken along the line A-A' in FIG. 26 illustrating part of a flow for fabricating a semiconductor device in accordance with one embodiment of the present disclosure.
Figure 28:
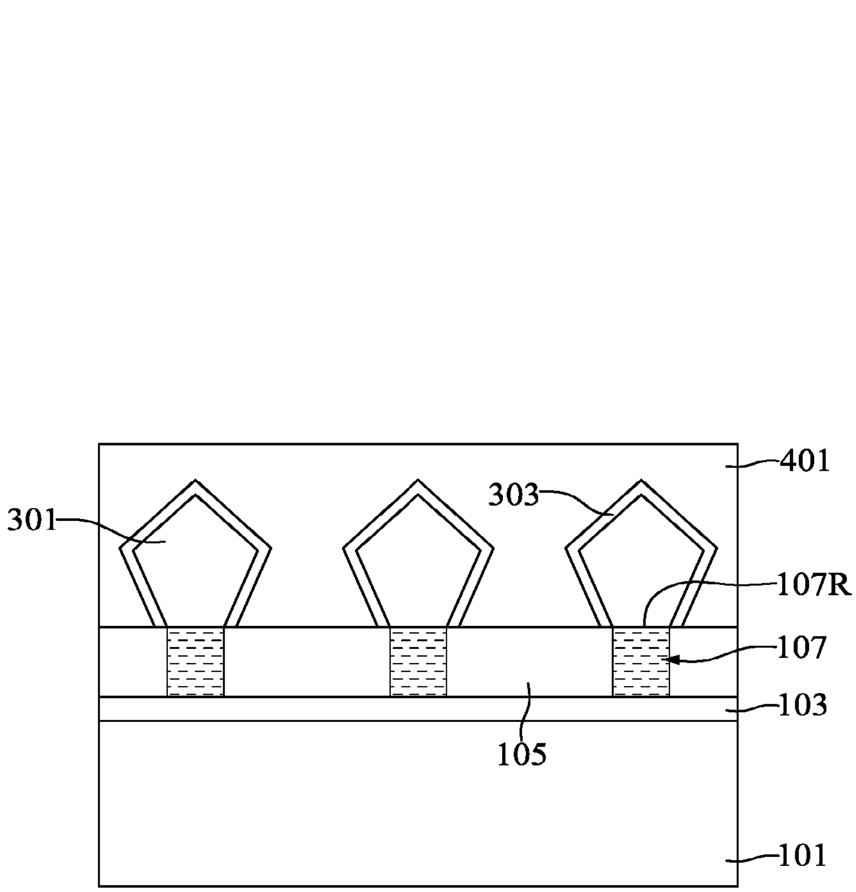
FIG. 28 is a schematic cross-sectional view diagram taken along the line B-B' in FIG. 26 illustrating part of a flow for fabricating a semiconductor device in accordance with one embodiment of the present disclosure.

FIG. 26 illustrates, in a schematic top-view diagram, an intermediate semiconductor device in accordance with one embodiment of the present disclosure. FIG. 27 is a schematic cross-sectional view diagram taken along the line A-A' in FIG. 26 illustrating part of the flow for fabricating the semiconductor device 100A in accordance with one embodiment of the present disclosure. FIG. 28 is a schematic cross-sectional view diagram taken along the line B-B' in FIG. 26 illustrating part of the flow for fabricating the semiconductor device 100A in accordance with one embodiment of the present disclosure.

With reference to FIGS. 11, 27 and 28, at step S23, in the embodiment depicted, a plurality of covering layers 303 may be respectively correspondingly formed on the plurality of source/drain regions 301 and a first insulating layer 401 may be formed on the plurality of covering layers 303 and the isolation layer 105. For the formation of the plurality of covering layers 303, a metal layer may be deposited over the plurality of source/drain regions 301 and a thermal treatment may be performed. The metal layer may include, for example, titanium, nickel, platinum, tantalum, or cobalt. During the thermal treatment, metal atoms of the metal layer may react chemically with silicon atoms of the plurality of source/drain regions 301 to form the plurality of covering layers 303. The plurality of covering layers 303 may include titanium silicide, nickel silicide, nickel platinum silicide, tantalum silicide, or cobalt silicide. The thermal treatment may be a dynamic surface annealing process and may cause a shallow-depth region of the source/drain regions 301 to reach a silicidation temperature. After the thermal treatment, a cleaning process may be performed to remove the unreacted metal layer. The cleaning process may use etchant such as hydrogen peroxide and an SC-1 solution.

With reference to FIGS. 27 and 28, an insulating material may be deposited over the plurality of covering layers 303, the isolation layer 105, the plurality of dummy gate structures 501, and the first dummy spacers 507. The deposition process may be a chemical vapor deposition, a plasma-enhanced chemical vapor deposition, or a sputtering deposition. The insulating material may have a dielectric constant between about 2.4 and 3.5. A planarization process, such as chemical mechanical polishing, may be performed until a top surface of the dummy gate mask layer 505 is exposed, in order to remove excess material, provide a substantially flat surface for subsequent processing steps, and conformally form the first insulating layer 401.

Figure 29:
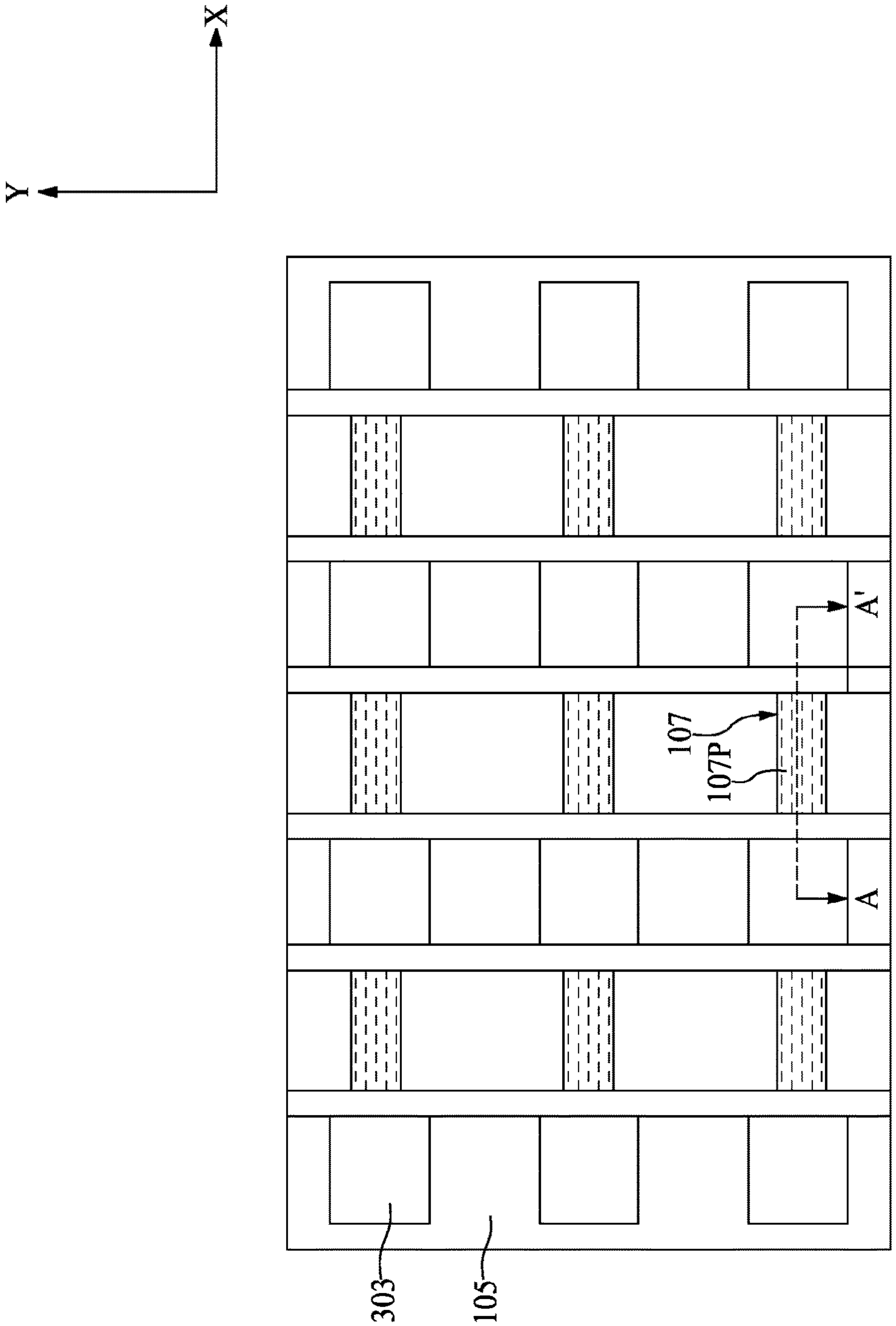
FIG. 29 illustrates, in a schematic top-view diagram, an intermediate semiconductor device in accordance with one embodiment of the present disclosure.

FIG. 29 illustrates, in a schematic top-view diagram, an intermediate semiconductor device in accordance with one embodiment of the present disclosure. FIGS. 30 to 35 are schematic cross-sectional view diagrams taken along the line A-A' in FIG. 29 illustrating parts of the flow for fabricating the semiconductor device 100A in accordance with one embodiment of the present disclosure.

Figure 30:
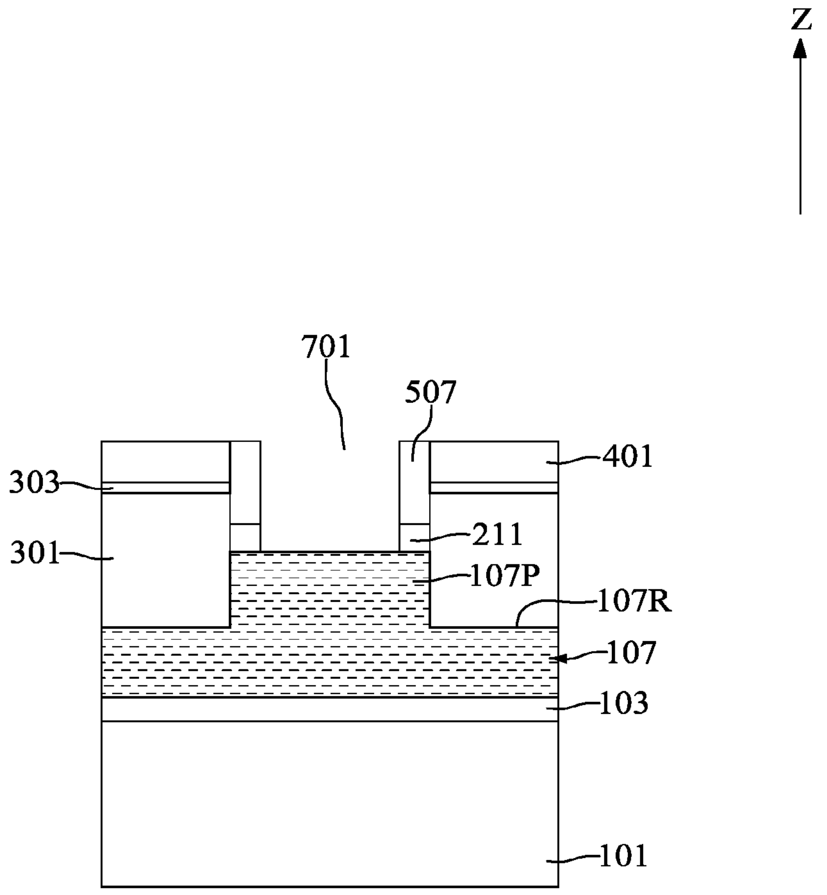
FIGS. 30 to 35 are schematic cross-sectional view diagrams taken along the line A-A' in FIG. 29 illustrating parts of a flow for fabricating a semiconductor device in accordance with one embodiment of the present disclosure.
Figure 31:
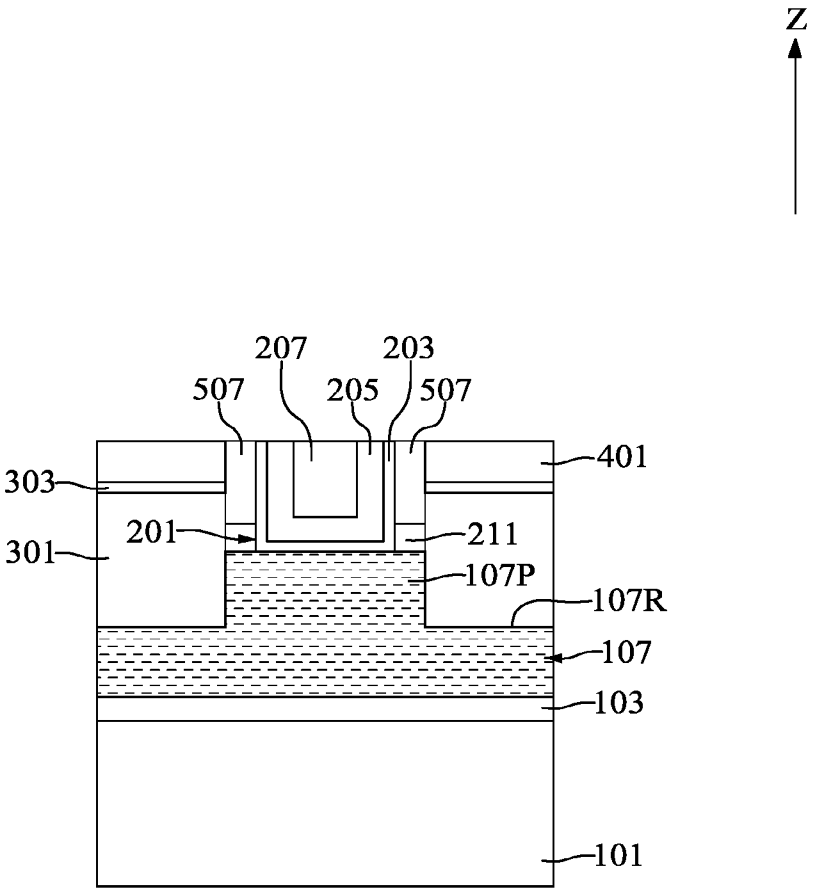

With reference to FIGS. 11 and 29 to 31, at step S25, in the embodiment depicted, the plurality of dummy gate structures 501 may be removed and a plurality of gate structures 201 may be formed in situ. With reference to FIGS. 29 and 30, the dummy gate mask layer 505 and the dummy gate bottom layer 503 may be removed by a multi-step etching process. After the removal of the dummy gate structure 501, a first trench 701 may be formed in situ; in other words, the first trench 701 may be formed in the place previously occupied by the dummy gate structure 501. With reference to FIG. 31, the gate structure 201 may be formed in the first trench 701. The gate structure 201 may include a gate insulating layer 203, a gate conductive layer 205, and a gate filler layer 207. The gate insulating layer 203 may be formed in the first trench 701 by a deposition process such as chemical vapor deposition, physical vapor deposition, atomic layer deposition, thermal treatment, ozone oxidation, or a combination thereof.

With reference to FIG. 31, the gate conductive layer 205 may be formed on the gate insulating layer 203 by another deposition process suitable for depositing conductive materials, such as chemical vapor deposition or sputtering deposition. The gate filler layer 207 may be formed on the gate conductive layer 205 by another deposition process similar to that of the deposition of the gate conductive layer 205. A planarization process, such as chemical mechanical polishing, may be performed to provide a substantially flat surface for subsequent processing steps.

Figure 32:
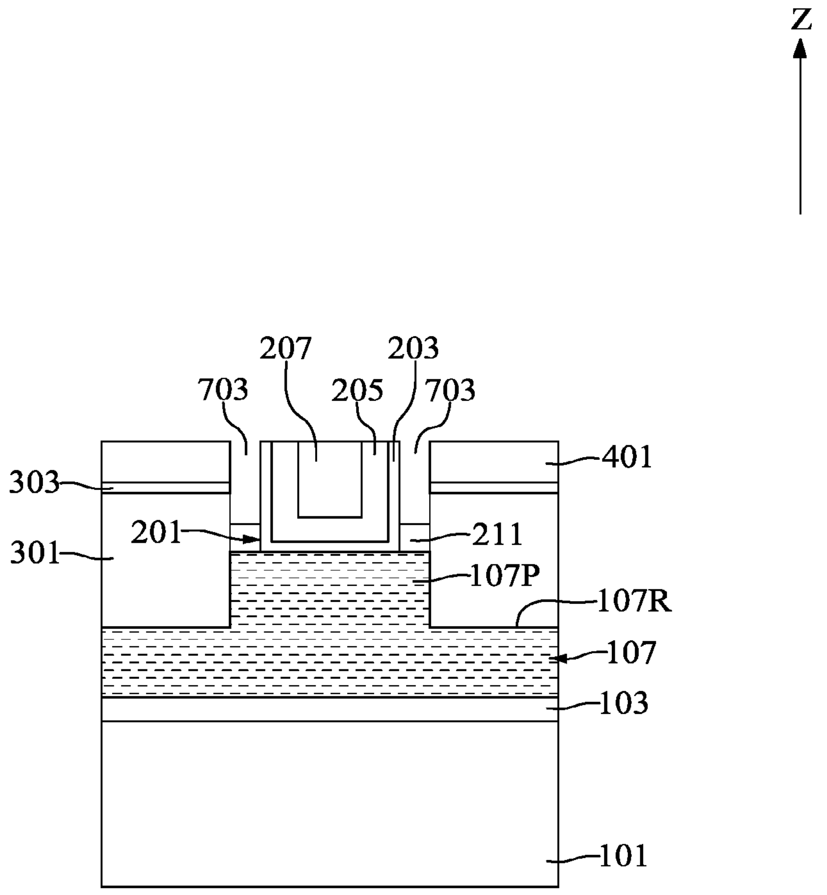

With reference to FIGS. 11 and 32, at step S27, in the embodiment depicted, the two first dummy spacers 507 may be removed and second trenches 703 may be formed in situ. The two first dummy spacers 507 may be removed by an etching process. A gate mask layer (not shown) may be formed on the gate structure 201 before the etching process to protect the gate structure 201. In the etching process, an etching rate of the two first dummy spacers 507 may be greater than an etching rate of the first insulating layer 401, an etching rate of the gate mask layer, and an etching rate of the two bottom etch stop layers 211.

Figure 33:
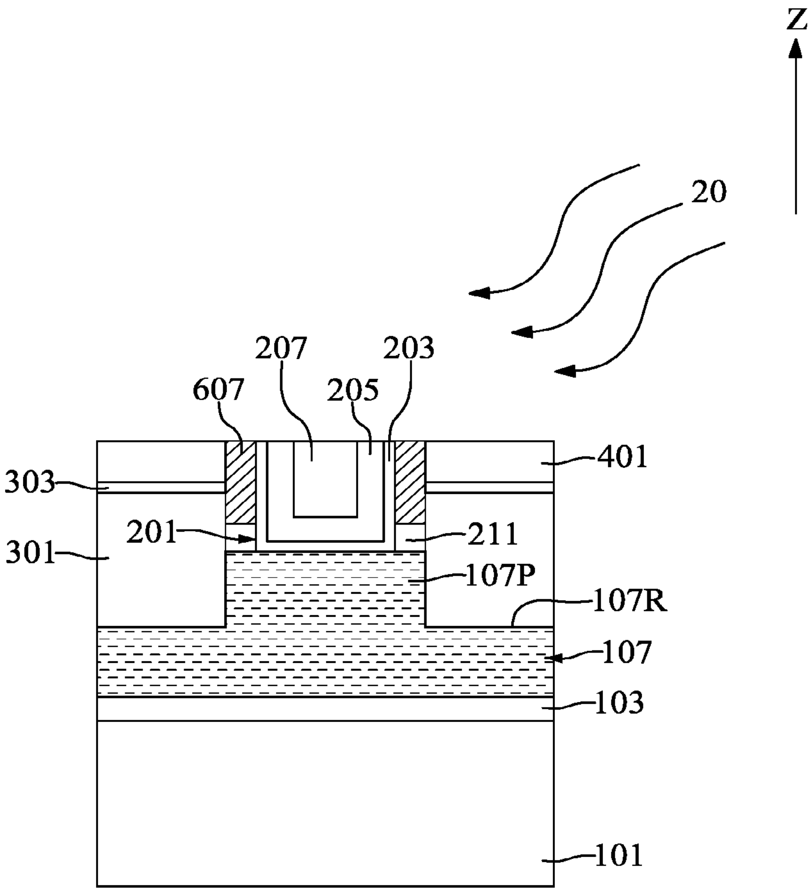
Figure 34:
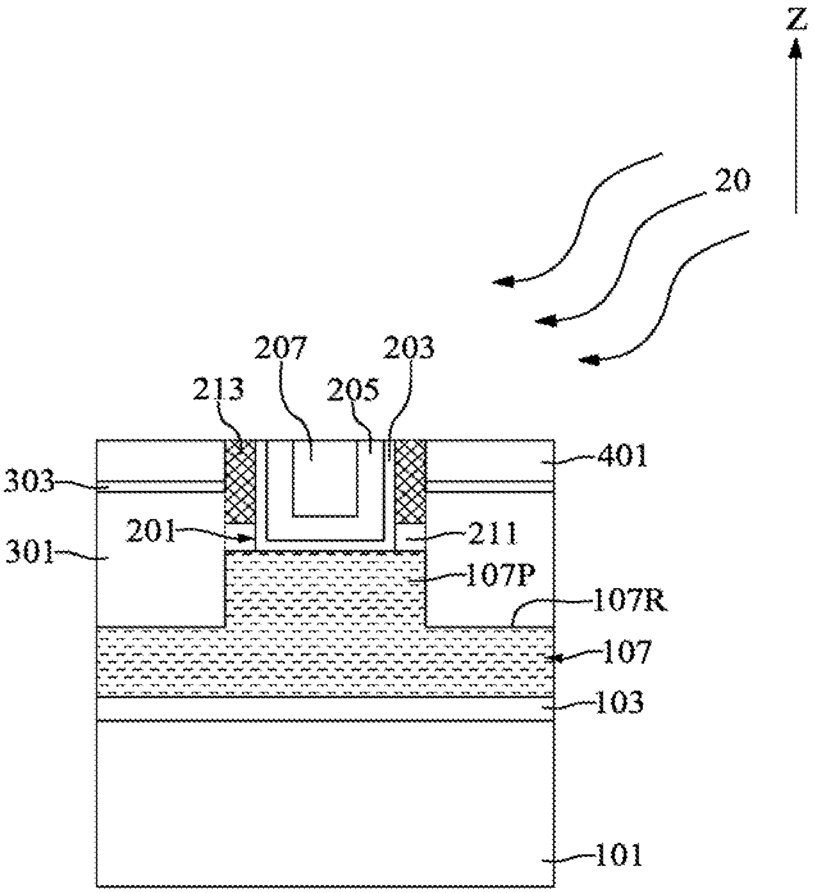

With reference to FIGS. 11, 33 and 34, at step S29, in the embodiment depicted, an energy-removable material 607 may be deposited in the second trenches 703 and an energy treatment 20 may be performed to form two porous spacers 213 in the second trenches 703. With reference to FIG. 33, an energy-removable material 607 may be deposited in the second trenches 703. The energy-removable material 607 may include a material such as a thermal decomposable material, a photonic decomposable material, an e-beam decomposable material, or a combination thereof. For example, the energy-removable material 607 may include a base material and a decomposable porogen material that is sacrificially removed upon exposure to an energy source. The base material may include a methylsilsesquioxane based material. The decomposable porogen material may include a porogen organic compound that provides porosity to the base material of the energy-removable material. The energy treatment 20 may be performed by applying the energy source to the intermediate semiconductor device in FIG. 34. The energy source may include heat, light, or a combination thereof. When heat is used as the energy source, a temperature of the energy treatment may be between about 800° C. and about 900° C. When light is used as the energy source, an ultraviolet light may be applied. The energy treatment 20 may remove the decomposable porogen material from the energy-removable material to generate empty spaces (pores), with the base material remaining in place.

Alternatively, in another embodiment, the base material may be silicon oxide. The decomposable porogen material may include compounds including unsaturated bonds such as double bonds or triple bonds. During the energy treatment 20, the unsaturated bonds of the decomposable porogen material may cross-link with silicon oxide of the base material. As a result, the decomposable porogen material may shrink and generate empty spaces, with the base material remaining in place. The empty spaces may be filled with air so that a dielectric constant of the empty spaces may be significantly low.

In some embodiments, the energy-removable material 607 may include a relatively high concentration of the decomposable porogen material and a relatively low concentration of the base material, but is not limited thereto. For example, the energy-removable material 607 may include about 75% or greater of the decomposable porogen material, and about 25% or less of the base material. In another example, the energy-removable material 607 may include about 95% or greater of the decomposable porogen material, and about 5% or less of the base material. In another example, the energy-removable material 607 may include about 100% of the decomposable porogen material, and no base material is used. In another example, the energy-removable material 607 may include about 45% or greater of the decomposable porogen material, and about 55% or less of the base material.

With reference to FIG. 34, after the energy treatment 20, the energy-removable material 607 in the second trenches 703 may turn into the two porous spacers 213. The base material may turn into a skeleton of the two porous spacers 213 and the empty spaces may be distributed among the skeleton of the two porous spacers 213. According to the composition of the energy-removable material 607, the two porous spacers 213 may have a porosity of 45%, 75%, 95%, or 100%. A planarization process, such as chemical mechanical polishing, may be performed after the energy treatment 20 to provide a substantially flat surface for subsequent processing steps.

Figure 35:
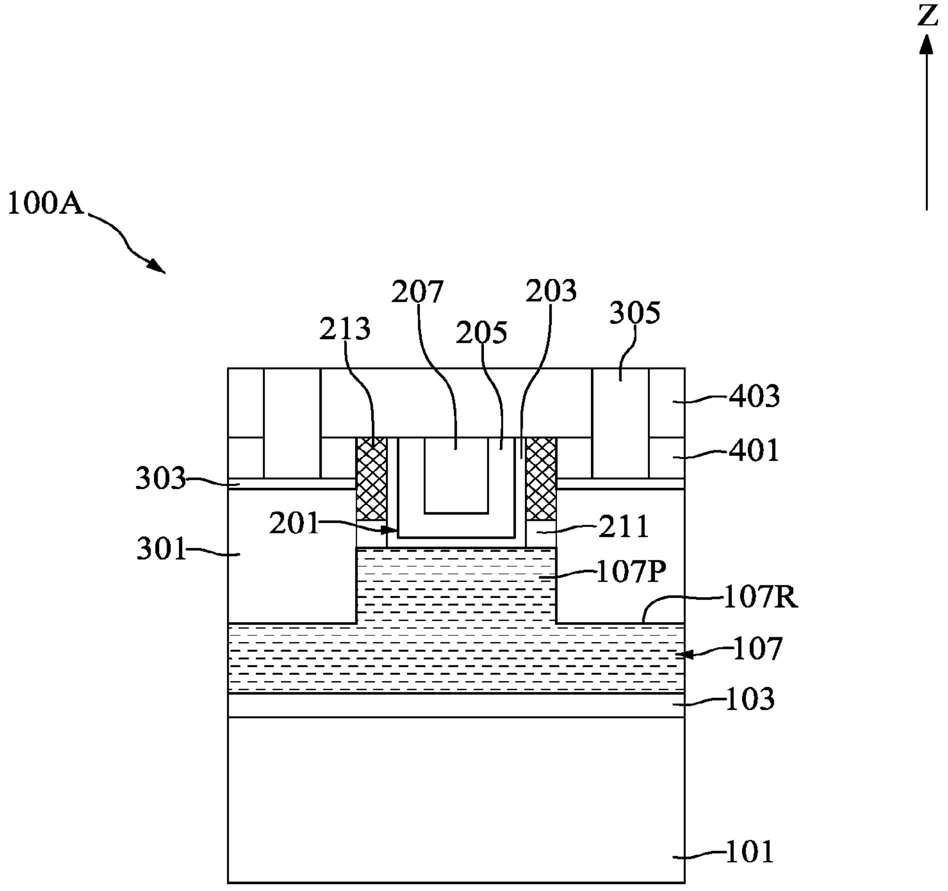

With reference to FIGS. 11 and 35, at step S31, in the embodiment depicted, a second insulating layer 403 may be formed on the first insulating layer 401 and a plurality of contacts 305 may be respectively correspondingly formed on the plurality of covering layers 303. The second insulating layer 403 may be formed by a procedure similar to that of the formation of the first insulating layer 401. A photolithography process may be performed to define positions of the plurality of contacts 305. After the photolithography process, an etching process, such as an anisotropic dry etch process, may be performed to form a plurality of contact openings penetrating the second insulating layer 403 and the first insulating layer 401. A conductive material, such as tungsten, copper, cobalt, ruthenium, or molybdenum, may be deposited into the plurality of contact openings by a deposition process. After the deposition process, a planarization process, such as chemical mechanical polishing, may be performed to remove excess material, provide a substantially flat surface for subsequent processing steps, and conformally form the plurality of contacts 305.

Due to the design of the semiconductor device of the present disclosure, a coupling capacitance between the gate structure 201 and the source/drain regions 301 may be reduced; so that an RC delay of the semiconductor device 100A may be reduced.

Figure 36:
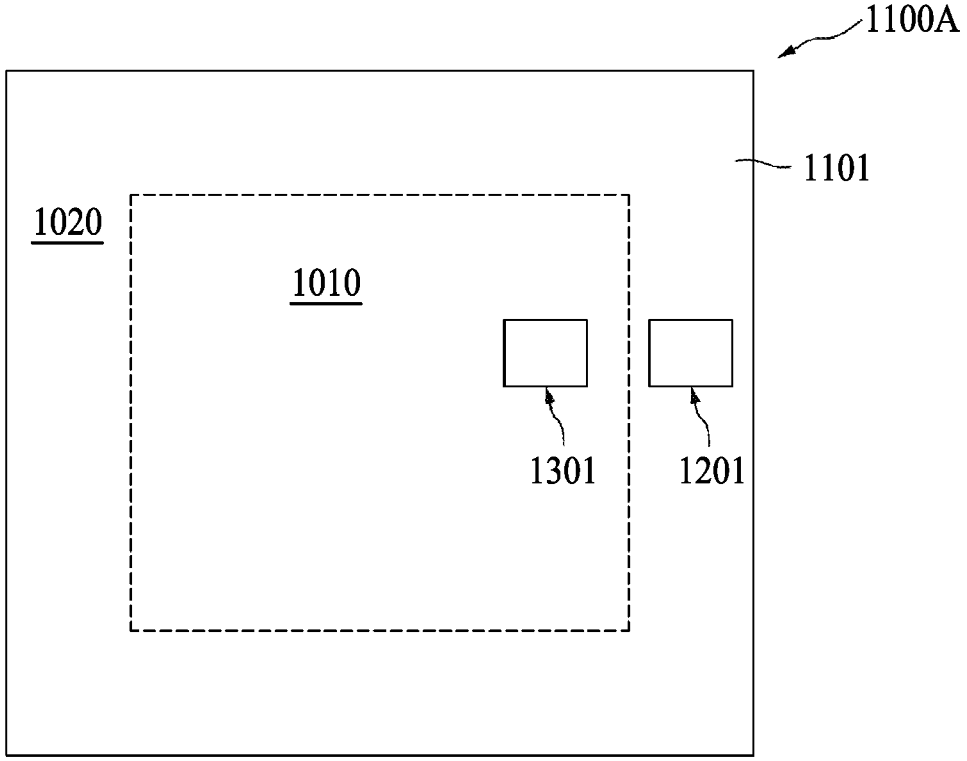
FIG. 36 illustrates, in a schematic top-view diagram, a semiconductor device in accordance with one embodiment of the present disclosure.
Figure 37:
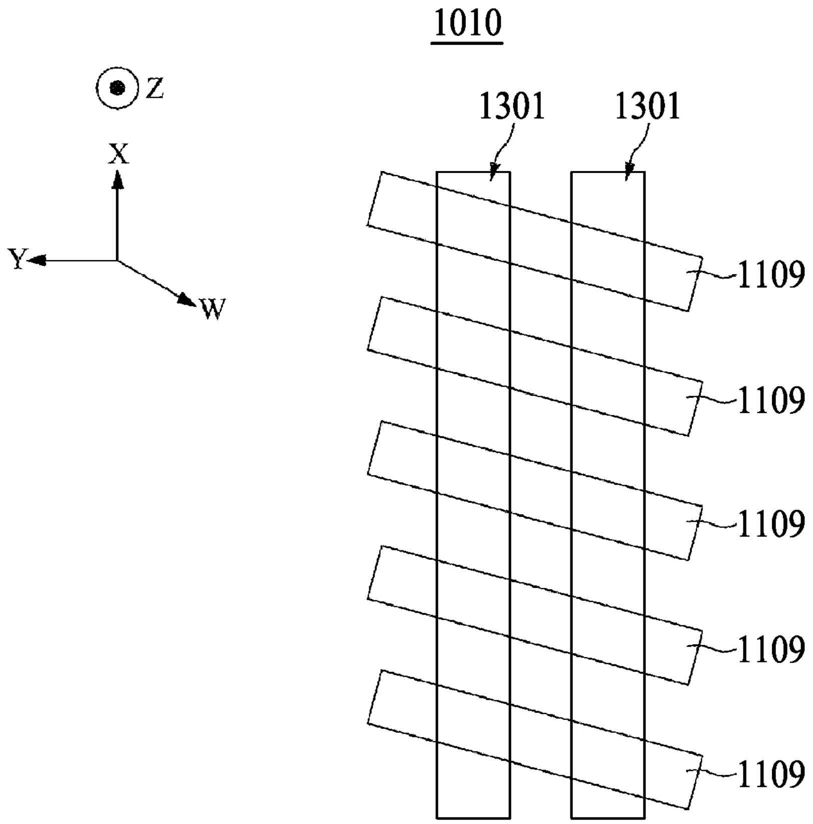
FIG. 37 illustrates, in a schematic top-view diagram, part of the semiconductor device in accordance with one embodiment of the present disclosure.
Figure 38:
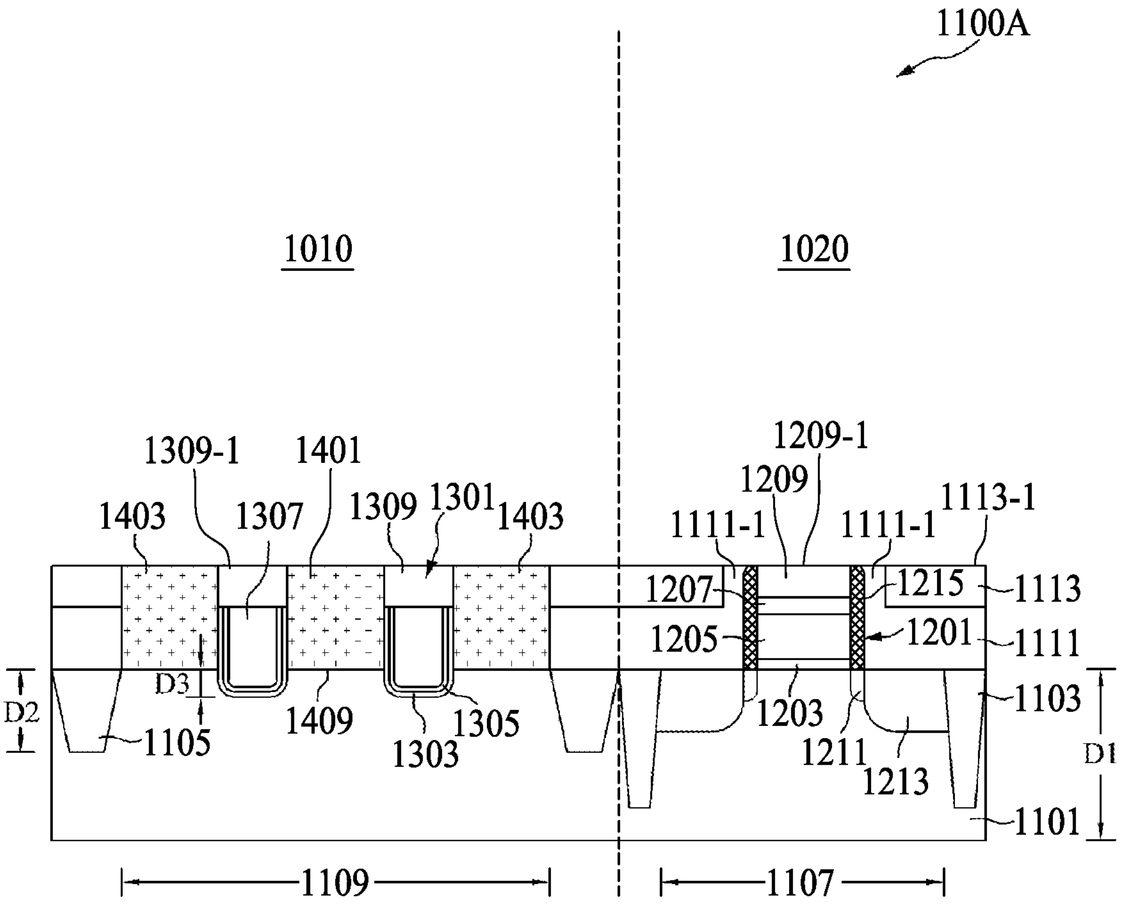
FIG. 38 illustrates, in a schematic cross-sectional view diagram, the semiconductor device in accordance with one embodiment of the present disclosure.

FIG. 36 illustrates, in a schematic top-view diagram, a semiconductor device 1100A in accordance with one embodiment of the present disclosure. FIG. 37 illustrates, in a schematic top-view diagram, part of the semiconductor device 1100A in accordance with one embodiment of the present disclosure. FIG. 38 illustrates, in a schematic cross-sectional view diagram, the semiconductor device 1100A in accordance with one embodiment of the present disclosure.

With reference to FIGS. 36 to 38, in the embodiment depicted, the semiconductor device 1100A may include a substrate 1101, a first isolation structure 1103, a second isolation structure 1105, a first insulating layer 1111, a second insulating layer 1113, a gate structure 1201, a pair of lightly-doped regions 1211, a pair of heavily-doped regions 1213, a pair of first spacers 1215, a plurality of word lines 1301, and a plurality of conductive regions. In some embodiments, the first spacers 1215 are configured as porous spacers.

With reference to FIGS. 36 to 38, in the embodiment depicted, the substrate 1101 may include an array area 1010 and a peripheral area 1020. The array area 1010 may be in the center of the substrate 1101. The peripheral area 1020 may surround the array area 1010. The substrate 1101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials. The substrate 1101 may have a first lattice constant and a crystal orientation <100>.

Alternatively, in another embodiment, the substrate 1101 may include an organic semiconductor or a layered semiconductor such as silicon/silicon germanium, silicon-on-insulator or silicon germanium-on-insulator. When the substrate 1101 is formed of silicon-on-insulator, the substrate 1101 may include a top semiconductor layer and a bottom semiconductor layer formed of silicon, and a buried insulating layer which may separate the top semiconductor layer from the bottom semiconductor layer. The buried insulating layer may include, for example, a crystalline or non-crystalline oxide, nitride or any combination thereof. The substrate 1101 may include similar materials to the substrate 101 or the fin 107.

With reference to FIGS. 36 to 38, in the embodiment depicted, the first isolation structure 1103 may be disposed in the peripheral area 1020 of the substrate 1101 and may define a peripheral active region 1107 at the peripheral area 1020. The first isolation structure 1103 may have a first depth D1. The first isolation structure 1103 may be formed of, for example, an insulating material such as silicon oxide, silicon nitride, silicon oxynitride, silicon nitride oxide, or fluoride-doped silicate. It should be noted that the peripheral active region 1107 may be a portion of the substrate 1101 enclosed by the first isolation structure 1103 and a space above that portion of the substrate 1101 enclosed by the first isolation structure 1103. Alternatively, the peripheral active region 1107 may be a portion of the fin 107, whose bottom portions are enclosed by the first isolation structure 1103.

With reference to FIGS. 36 to 38, in the embodiment depicted, the second isolation structure 1105 may be disposed in the array area 1010 of the substrate 1101 and may define a plurality of array active regions 1109 at the array area 1010. The second isolation structure 1105 may have a second depth D2. The second depth D2 of the second isolation structure 1105 may be less than the first depth D1 of the first isolation structure 1103. A ratio of the second depth D2 of the second isolation structure 1105 to the first depth D1 of the first isolation structure 1103 may be between about 1:2 and about 1:5. The second isolation structure 1105 may be formed of a same material as the first isolation structure 1103, but is not limited thereto. It should be noted that the plurality of array active regions 1109 may be comprised of portions of the substrate 1101 enclosed by the second isolation structure 1105 and spaces above such portions of the substrate 1101 enclosed by the second isolation structure 1105.

With reference to FIGS. 36 to 38, in the embodiment depicted, the first insulating layer 1111 may be disposed on the substrate 1101. The first insulating layer 1111 may be formed of, for example, silicon nitride, silicon oxide, silicon oxynitride, flowable oxide, tonen silazen, undoped silica glass, borosilica glass, phosphosilica glass, borophosphosilica glass, plasma-enhanced tetra-ethyl orthosilicate, fluoride silicate glass, carbon-doped silicon oxide, xerogel, aerogel, amorphous fluorinated carbon, organo silicate glass, parylene, bis-benzocyclobutenes, polyimide, porous polymeric material, or a combination thereof, but is not limited thereto.

With reference to FIGS. 36 to 38, in the embodiment depicted, the semiconductor device 1100A may include protruding first insulating segments 1111-1. The protruding first insulating segments 1111-1 may be disposed on a top surface of the first insulating layer 1111 and located at the peripheral area 1020. Top surfaces of the protruding first insulating segments 1111-1 may be even with the top surface 1311-1 of the second insulating layer 1113 and the top surface 1209-1 of the gate structure 1209. The protruding first insulating segments 1111-1 may be formed of a same material as the first insulating layer 1111. In some embodiments, an entirety of the first insulating layer 1111 is covered by the second insulating layer 1113.

With reference to FIGS. 36 to 38, in the embodiment depicted, the second insulating layer 1113 may be disposed on the first insulating layer 1111. A portion of the second insulating layer 1113 located at the peripheral area 1020 may surround the protruding first insulating segments 1111-1. The second insulating layer 1113 may be formed of a same material as the first insulating layer 1111, but is not limited thereto.

With reference to FIGS. 36 to 38, in the embodiment depicted, the gate structure 1201 may be disposed in the peripheral active region 1107 of the peripheral area 1020. The gate structure 1201 may be disposed in the first insulating layer 1111 and the protruding first insulating segments 1111-1. A lower portion of the gate structure 1201 may be disposed on the top surface of the substrate 1101 and in the first insulating layer 1111. An upper portion of the gate structure 1201 may be surrounded by the protruding first insulating segments 1111-1 or the second insulating layer 1113. A top surface of the gate structure 1201 may be even with a top surface of the second insulating layer 1113. The gate structure 1201 may be similar to the gate structure 201; alternatively, the gate structure 1201 includes a gate insulating film 1203, a first gate conductive film 1205, a second gate conductive film 1207, and a gate mask film 1209. The first With reference to FIGS. 36 to 38, in the embodiment depicted, the gate insulating film 1203 may be disposed in the peripheral active region 1107 of the peripheral area 1020. The gate insulating film 1203 may be disposed on the top surface of the substrate 1101 and in the first insulating layer 1111. The gate insulating film 1203 may have a thickness between about 0.5 nm and about 5.0 nm. Preferably, the thickness of the gate insulating film 1203 may be between about 0.5 nm and about 2.5 nm. It should be noted that the thickness of the gate insulating film 1203 may be set to an arbitrary range depending on the circumstances.

The gate insulating film 1203 may be formed of, for example, an insulating material having a dielectric constant of about 4.0 or greater. (All dielectric constants mentioned herein are relative to a vacuum unless otherwise noted.) The insulating material having a dielectric constant of about 4.0 or greater may be hafnium oxide, hafnium zirconium oxide, hafnium lanthanum oxide, hafnium silicon oxide, hafnium tantalum oxide, hafnium titanium oxide, zirconium oxide, aluminum oxide, aluminum silicon oxide, titanium oxide, tantalum pentoxide, lanthanum oxide, lanthanum silicon oxide, strontium titanate, lanthanum aluminate, yttrium oxide, gallium (III) trioxide, gadolinium gallium oxide, lead zirconium titanate, barium titanate, barium strontium titanate, barium zirconate, or a mixture thereof. Alternatively, in another embodiment, the insulating material may be silicon oxide, silicon nitride, silicon oxynitride, silicon nitride oxide, or the like.

With reference to FIGS. 36 to 38, in the embodiment depicted, the first gate conductive film 1205 may be disposed on the gate insulating film 1203 and in the first insulating layer 1111. The first gate conductive film 1205 may have a thickness between about 150 nm and about 300 nm. The first gate conductive film 1205 may be formed of, for example, doped polysilicon. The second gate conductive film 1207 may be disposed on the first gate conductive film 1205 and in the first insulating layer 1111. The second gate conductive film 1207 may be formed of, for example, metal silicide. The gate mask film 1209 may be disposed on the second gate conductive film 1207 and may be surrounded by the protruding first insulating segments 1111-1. A top surface 1209-1 of the gate mask film 1209 may be even with the top surface of the second insulating layer 1113. The gate mask film 1209 may be formed of, for example, silicon nitride, silicon oxynitride, silicon nitride oxide, or the like.

With reference to FIGS. 36 to 38, in the embodiment depicted, the pair of lightly-doped regions 1211 may be disposed in the peripheral active region 1107. The pair of lightly-doped regions 1211 may be respectively correspondingly disposed adjacent to the gate insulating film 1203 and in the substrate 1101. The pair of lightly-doped regions 1211 may be doped with a dopant such as boron, phosphorus, arsenic, or antimony.

With reference to FIGS. 36 to 38, in the embodiment depicted, the pair of first spacers 1215 may be attached to two sides of the gate structure 1201. The pair of first spacers 1215 may be attached to sidewalls of the gate mask film 1209, sidewalls of the second gate conductive film 1207, sidewalls of the first gate conductive film 1205, and sidewalls of the gate insulating film 1203. Upper portions of the pair of first spacers 1215 may be surrounded by the protruding first insulating segments 1111-1. Lower portions of the pair of first spacers 1215 may be disposed in the first insulating layer 1111. Bottoms of the pair of first spacers 1215 may be respectively correspondingly disposed on portions of the pair of lightly-doped regions 1211. The pair of first spacers 1215 may be formed of, for example, polysilicon, silicon oxide, or silicon nitride. In the embodiment depicted, the pair of first spacers 1215 may be formed of silicon oxide.

With reference to FIGS. 36 to 38, in the embodiment depicted, the pair of heavily-doped regions 1213 may be disposed in the peripheral active region 1107. The pair of heavily-doped regions 1213 may be disposed adjacent to the pair of first spacers 1215 and in the substrate 1101. The pair of heavily-doped regions 1213, also referred to herein as source/drain regions, may be disposed adjacent to the pair of lightly-doped regions 1211. The heavily-doped regions 1213 may work with the gate structure 1201, in which a channel is formed in the substrate 1101 below the gate insulating film 1203 between the heavily-doped regions 1213. The pair of heavily-doped regions 1213 may be doped with a same dopant as the pair of lightly-doped regions 1211. The pair of heavily-doped regions 1213 may have a dopant concentration greater than a dopant concentration of the pair of lightly-doped regions 1211.

With reference to FIGS. 36 to 38, in the embodiment depicted, the plurality of word lines 1301 may be located at the array area 1010. The plurality of word lines 1301 may intersect the plurality of array active regions 1109 in a top-view diagram. The plurality of word lines 1301 may extend along a first direction X and the plurality of array active regions 1109 may extend along a second direction W diagonal with respect to the first direction X. The plurality of word lines 1301 may be disposed in the first insulating layer 1111, the second insulating layer 1113, and the substrate 1101. Lower portions of the plurality of word lines 1301 may be disposed in the substrate 1101. Upper portions of the plurality of word lines 1301 may be disposed in the first insulating layer 1111 and the second insulating layer 1113. Top surfaces of the plurality of word lines 1301 may be even with the top surface of the second insulating layer 1113. The plurality of word lines 1301 may include a plurality of word line channel films 1303, a plurality of word line insulating films 1305, a plurality of word line electrodes 1307, and a plurality of word line capping films 1309.

With reference to FIGS. 36 to 38, in the embodiment depicted, the plurality of word line channel films 1303 may be inwardly disposed in the first insulating layer 1111 and the substrate 1101. Upper portions of the plurality of word line channel films 1303 may be disposed in the first insulating layer 1111. Top surfaces of the plurality of word line channel films 1303 may be even with a top surface of the first insulating layer 1111. Lower portions of the plurality of word line channel films 1303 may be disposed in the substrate 1101. The lower portions of the plurality of word line channel films 1303 may have a third depth D3 in the substrate 1101. A ratio of the third depth D3 of the lower portions of the plurality of word line channel films 1303 to the second depth D2 of the second isolation structure 1105 may be between about 1:3 and about 1:10. Bottoms of the plurality of word line channel films 1303 may be flat. Each of the plurality of word line channel films 1303 may have a U-shaped cross-sectional profile. The plurality of word line channel films 1303 may be formed of, for example, doped polysilicon or undoped polysilicon. For example, doped polysilicon may be doped with a dopant such as phosphorus, arsenic, or antimony.

With reference to FIGS. 36 to 38, in the embodiment depicted, the plurality of word line insulating films 1305 may be respectively correspondingly disposed on the plurality of word line channel films 1303 and in the first insulating layer 1111. In other words, the plurality of word line insulating films 1305 may respectively correspondingly cover inner surfaces of the plurality of word line channel films 1303. Top surfaces of the plurality of word line insulating films 1305 may be even with the top surfaces of the plurality of word line channel films 1303 and the top surface of the first insulating layer 1111. Each of the plurality of word line insulating films 1305 may have a U-shaped cross-sectional profile. The plurality of word line insulating films 1305 may be formed of, for example, an insulating material having a dielectric constant of about 4.0 or greater. Alternatively, in another embodiment, the insulating material may be silicon oxide, silicon nitride, silicon oxynitride, silicon nitride oxide, or the like.

With reference to FIGS. 36 to 38, in the embodiment depicted, the plurality of word line electrodes 1307 may be respectively correspondingly disposed on the plurality of word line insulating films 1305 and in the first insulating layer 1111. Top surfaces of the plurality of word line electrodes 1307 may be even with the top surface of the first insulating layer 1111, the top surfaces of the plurality of word line insulating films 1305, and the top surfaces of the plurality of word line channel films 1303. The plurality of word line electrodes 1307 may be formed of, for example, a conductive material such as doped polysilicon, silicon germanium, metal, metal alloy, metal silicide, metal nitride, metal carbide, or a combination including multilayers thereof. The metal may be aluminum, copper, tungsten, or cobalt. The metal silicide may be nickel silicide, platinum silicide, titanium silicide, molybdenum silicide, cobalt silicide, tantalum silicide, tungsten silicide, or the like.

With reference to FIGS. 36 to 38, in the embodiment depicted, the plurality of word line capping films 1309 may be respectively correspondingly disposed on the plurality of word line electrodes 1307 and in the second insulating layer 1113. The plurality of word line capping films 1309 may have a same thickness as the second insulating layer 1113. Top surfaces 1309-1 of the plurality of word line capping films 1309 may be even with the top surface of the second insulating layer 1113. The plurality of word line capping films 1309 may be formed of a single layer including an insulating material having a dielectric constant of about 4.0 or greater. Alternatively, in another embodiment, the plurality of word line capping films 1309 may be formed of stacked layers including a bottom capping layer disposed on the plurality of word line electrodes 1307 and a top capping layer disposed on the bottom capping layer. The bottom capping layer may be formed of an insulating material having a dielectric constant of about 4.0 or greater. A top surface of the top capping layer may be even with the top surface of the second insulating layer 1113. The top capping layer may be formed of a low dielectric-constant material such as silicon oxide, or the like. The top capping layer formed of the low dielectric-constant material may reduce electric field on the top surface of second insulating layer 1113; therefore, leakage current may be reduced.

With reference to FIGS. 36 to 38, in the embodiment depicted, the plurality of conductive regions 1401, 1403 may be disposed above the plurality of array active regions 1109 and in the first insulating layer 1111 and the second insulating layer 1113. For each of the plurality of array active regions 1109, the plurality of conductive regions 1401, 1403 may include a first conductive region 1401 and two second conductive regions 1403. The first conductive region 1401 may be disposed between an adjacent pair of the plurality of word lines 1301. The two second conductive regions 1403 may be respectively correspondingly opposite to the first conductive region 1401 and disposed adjacent to the adjacent pair of the plurality of word lines 1301. The first conductive region 1401 and the two second conductive regions 1403 may be respectively correspondingly disposed adjacent to the upper portions of the plurality of word line channel films 1303.

With reference to FIGS. 36 to 38, in the embodiment depicted, the top surfaces of the first conductive region 1401 and the two second conductive regions 1403 may be even with the top surface of the second insulating layer 1113 and the top surfaces of the plurality of word line capping films 1309. Bottom surfaces of the first conductive region 1401 and two second conductive regions 1403 may directly contact the top surface of the substrate 1101. The plurality of conductive regions may be formed of, for example, doped polysilicon or undoped silicon. When exterior voltages are applied to the plurality of word lines 1301 and the plurality of conductive regions 1401, 1403, carrier channels may be formed along the plurality of word line channel films 1303.

FIGS. 39 to 43 illustrate, in schematic cross-sectional view diagrams, semiconductor devices 1100B, 1100C, 1100D, 1100E and 1100F in accordance with other embodiments of the present disclosure.

Figure 39:
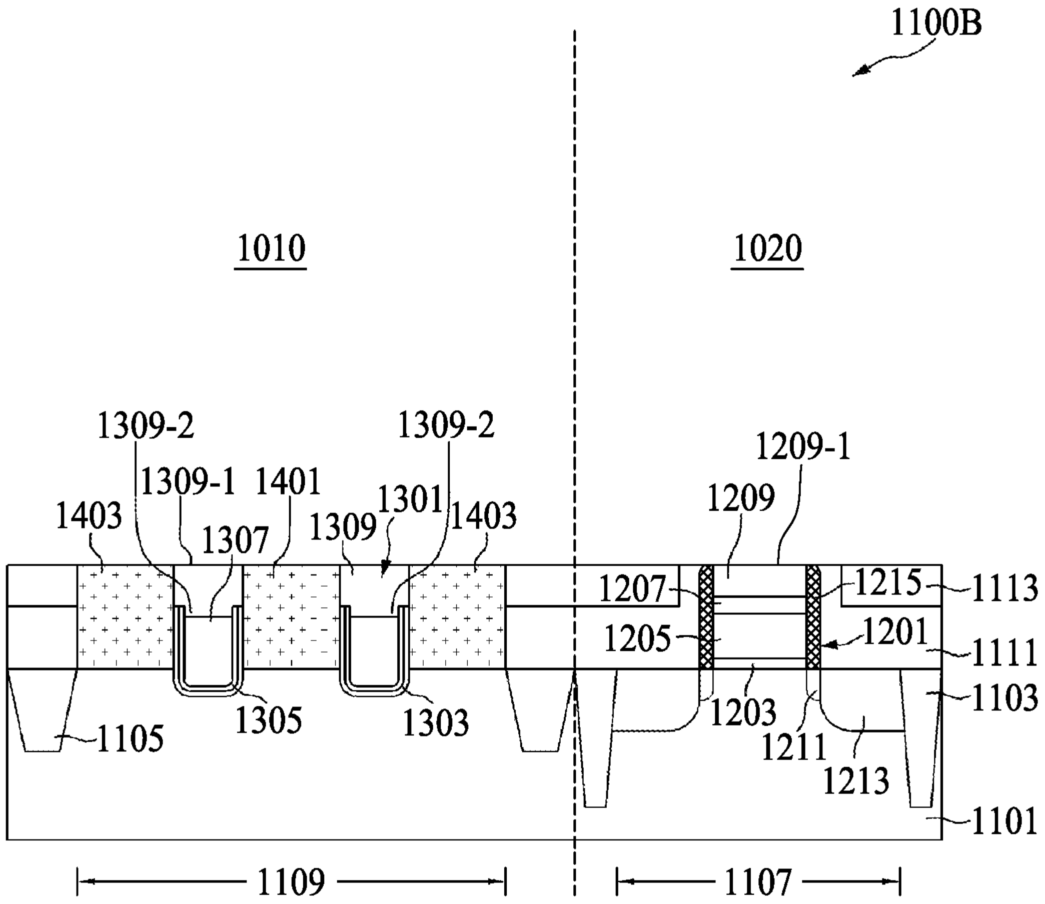
FIGS. 39 to 43 illustrate, in schematic cross-sectional view diagrams, semiconductor devices in accordance with other embodiments of the present disclosure.

With reference to FIG. 39, each of the plurality of word line capping films 1309 may include a lower protruding portion 1309-2. The lower protruding portions 1309-2 may respectively correspondingly protrude from bottom surfaces of the plurality of word line capping films 1309. In other words, the lower protruding portions 1309-2 may be respectively correspondingly disposed between the plurality of word line capping films 1309 and the plurality of word line electrodes 1307. Sidewalls of the lower protruding portions 1309-2 may respectively correspondingly contact inner surfaces of the plurality of word line insulating films 1305. The lower protruding portions 1309-2 may be formed of a same material as the plurality of word line capping films 1309.

Figure 40:
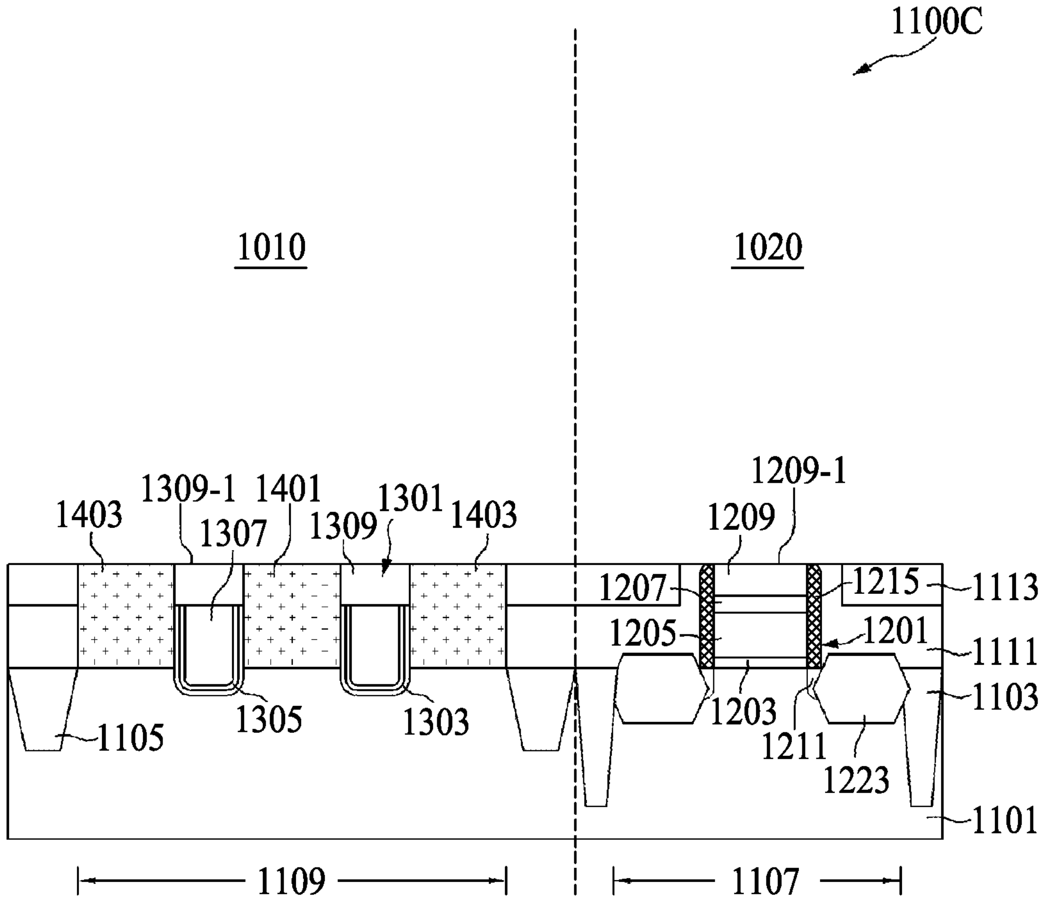

With reference to FIG. 40, the semiconductor device 1100C may include a pair of gate stress regions 1223. The pair of gate stress regions 1223 may be located at the peripheral area 1020 and in the peripheral active region 1107. Upper portions of the pair of gate stress regions 1223 may protrude from the top surface of the substrate 1101 and may be disposed adjacent to the pair of first spacers 1215. Lower portions of the pair of gate stress regions 1223 may be disposed in the substrate 1101 and adjacent to the pair of lightly-doped regions 1211. The pair of gate stress regions 1223 may be formed of a material having a second lattice constant which may be different from the first lattice constant. In the embodiment depicted, the pair of gate stress regions 1223 may be formed of, for example, silicon germanium or silicon carbide. The gate stress regions 1223 may serve as source/drain regions to work with the gate structure 1201, in which a channel is formed in the substrate 1101 below the gate insulating film 1203 between the gate stress regions 1223. Due to the lattice mismatch between the substrate 1101 and the pair of gate stress regions 1223, the carrier mobility may be increased; therefore, the performance of the semiconductor device 1100C may be improved.

Figure 41:
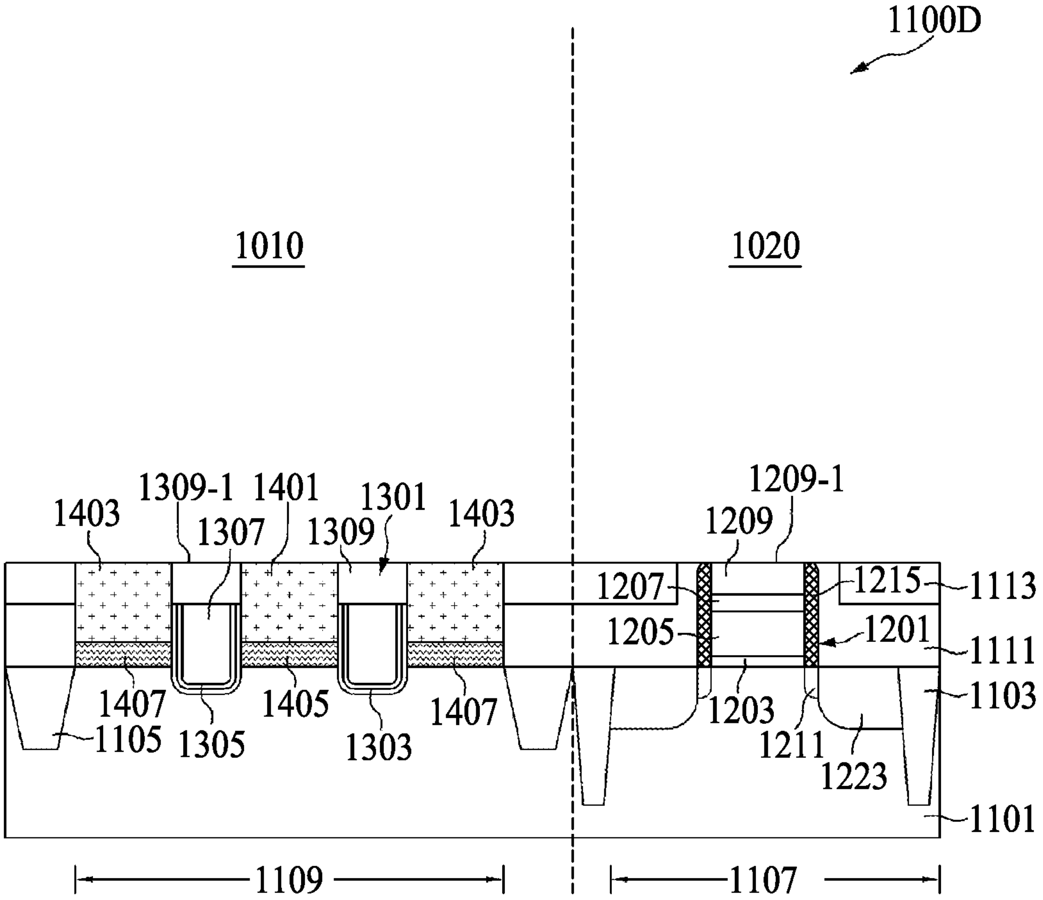

With reference to FIG. 41, the semiconductor device 100D may include a plurality of stress regions 1405, 1407. The plurality of stress regions 1405, 1407 may be located at the array area 1010. The plurality of stress regions 1405, 1407 may be respectively correspondingly disposed between the substrate 1101 and the plurality of conductive regions 1401, 1403. The plurality of stress regions 1405, 1407 may include a first stress region 1405 and two second stress regions 1407. The first stress region 1405 may be disposed between the adjacent pair of the plurality of word lines 1301 and may contact the outer surfaces of the plurality of word line channel films 1303. The first stress region 1405 may be disposed between the first conductive region 1401 and the substrate 1101.

With reference to FIG. 41, the two second stress regions 1407 may be respectively correspondingly disposed on opposite sides of the first stress region 1405 and disposed adjacent to the adjacent pair of the plurality of word lines 1301. The two second stress regions 1407 may contact the outer surfaces of the plurality of word line channel films 1303. The two second stress regions 1407 may be respectively correspondingly disposed between the two second conductive regions 1403 and the substrate 1101. The first stress region 1405 and the two second stress regions 1407 may be formed of a material having a third lattice constant which may be different from the first lattice constant. In the embodiment depicted, the first stress region 1405 and the two second stress regions 1407 may be formed of, for example, silicon carbide. Due to the lattice mismatch between the substrate 1101, the first stress region 1405 and the two second stress regions 1407, the carrier mobility may be increased; therefore, the performance of the semiconductor device 1100D may be improved.

Figure 42:
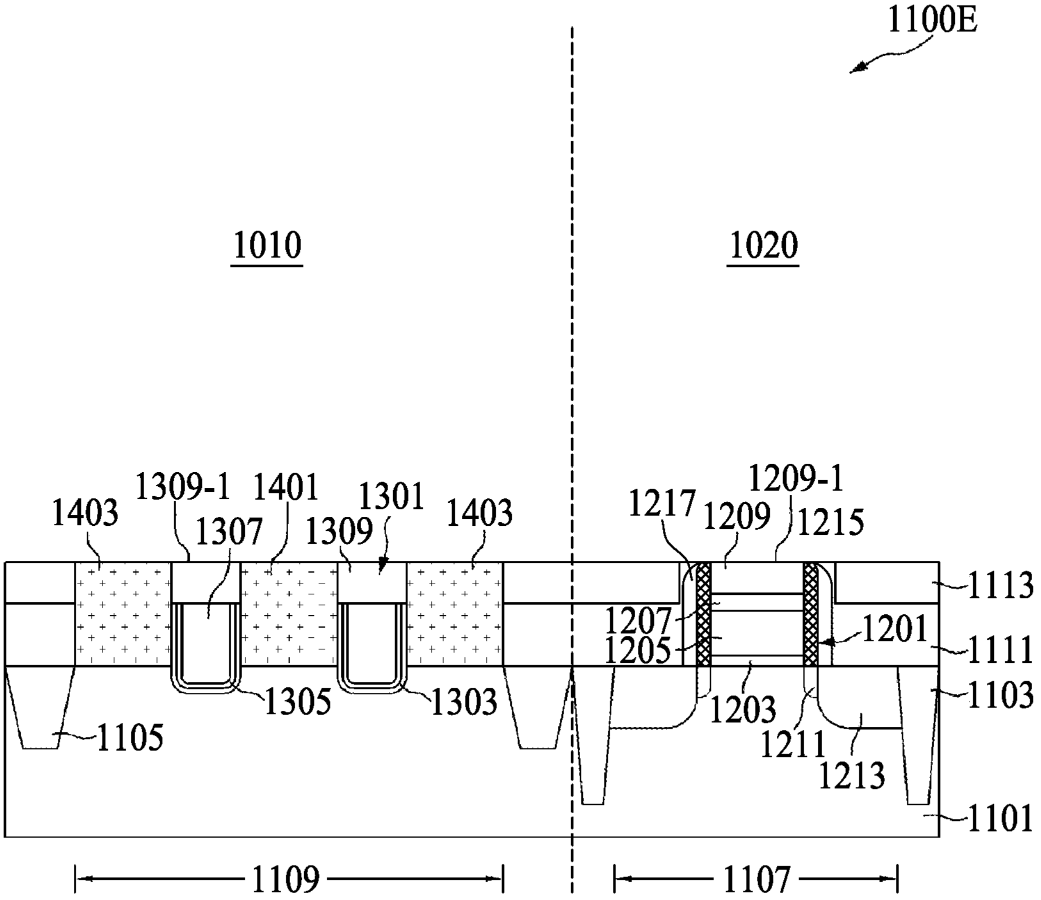

With reference to FIG. 42, the semiconductor device 100E may include a pair of second spacers 1217. The pair of second spacers 1217 may be formed of, for example, silicon oxide, silicon nitride, or the like. The pair of second spacers 1217 may be respectively correspondingly attached to outer surfaces of the pair of first spacers 1215. With presence of the pair of second spacers 1217, thicknesses of the pair of first spacers 1215 may be minimized, thereby reducing overlap capacitance formed among the pair of lightly-doped regions 1211, the pair of heavily-doped regions 1213, and the gate structure 1201. As a result, a performance of the semiconductor device 1100E may be improved. In some embodiments, the pair of second spacers 1217 are porous spacers, and the configuration of the pair of the second spacers 1217 is similar to the porous spacers 213.

Figure 43:
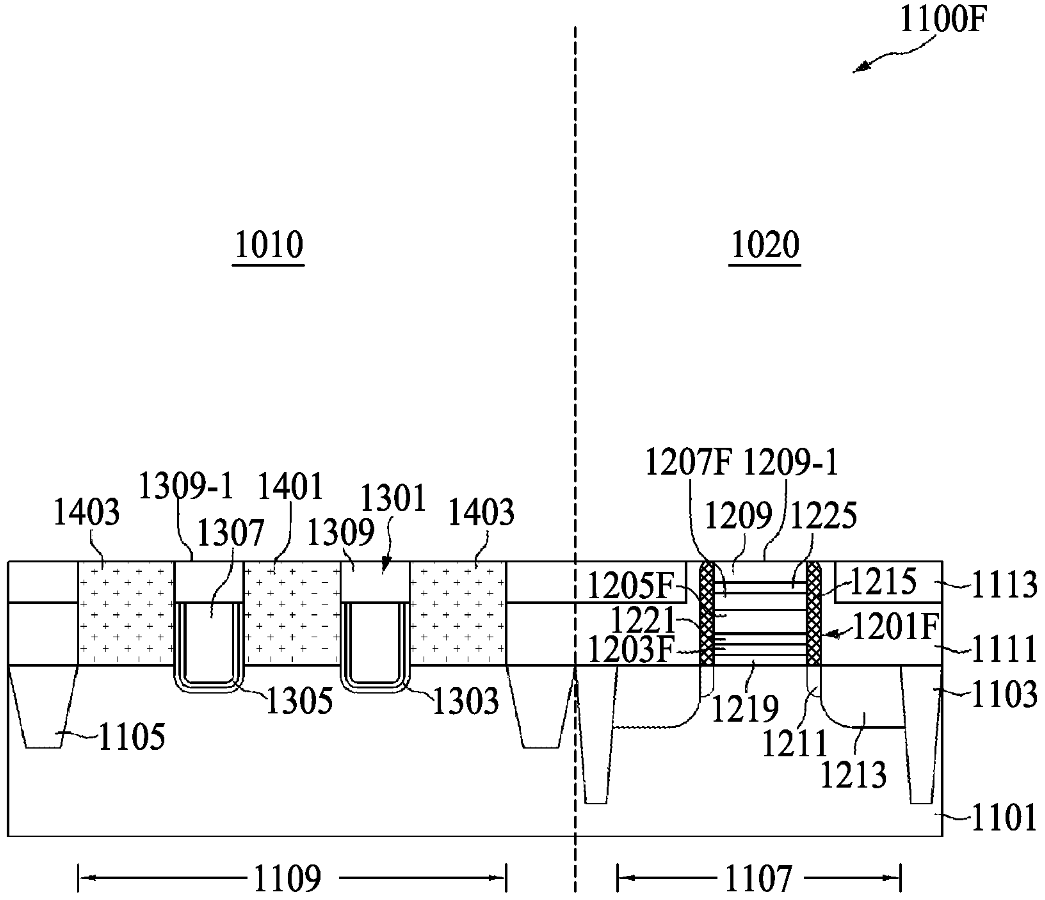

With reference to FIG. 43, the gate structure 1201F of the semiconductor device 1100F may include a gate dipole film 1219, a gate insulating film 1203F, a gate capping film 1221, a first gate conductive film 1205F, a second gate conductive film 1207F, a gate filler film 1225 and a gate mask film 1209. The gate dipole film 1219 may be disposed between the substrate 1101 and the gate insulating film 1203F. The gate dipole film 1219 may have a thickness less than 2 nm. The gate dipole film 1219 may be formed of a material including one or more of lutetium oxide, lutetium silicon oxide, yttrium oxide, yttrium silicon oxide, lanthanum oxide, lanthanum silicon oxide, barium oxide, barium silicon oxide, strontium oxide, strontium silicon oxide, aluminum oxide, aluminum silicon oxide, titanium oxide, titanium silicon oxide, hafnium oxide, hafnium silicon oxide, zirconium oxide, zirconium silicon oxide, tantalum oxide, tantalum silicon oxide, scandium oxide, scandium silicon oxide, magnesium oxide, and magnesium silicon oxide. The gate dipole film 1219 may displace defects in the gate insulating film 1203F and may improve the mobility and reliability of the gate structure 1201. The gate insulating film 1203F may be disposed on the gate dipole film 1219 and may be formed of an insulating material having a dielectric constant of about 4.0 or greater.

With reference to FIG. 43, the gate capping film 1221 may be disposed on the gate insulating film 1203F. The gate capping film 1221 may have a thickness between about 10 angstroms and about 15 angstroms and may be formed of, for example, titanium nitride or tantalum nitride. The gate capping film 1221 may protect the gate insulating film 1203F from damage during subsequent semiconductor processes and may be used to fine-tune a threshold voltage of the gate structure 1201. The first gate conductive film 1205F may be disposed on the gate capping film 1221. The first gate conductive film 1205F may have a thickness between about 10 angstroms and about 100 angstroms. The first gate conductive film 1205F may be formed of, for example, titanium nitride, tantalum nitride, tantalum carbide, tungsten nitride, or ruthenium.

With reference to FIG. 43, the second gate conductive film 1207F may be disposed on the first gate conductive film 1205F. The second gate conductive film 1207F have a thickness between about 10 angstroms and about 200 angstroms. Preferably, the thickness of the second gate conductive film 1207F may be between about 10 angstroms and about 100 angstroms. The second gate conductive film 1207F may be formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride. The gate filler film 1225 may be disposed on the second gate conductive film 1207F and may be formed of, for example, tungsten or aluminum. The gate mask film 1209 may be disposed on the gate filler film 1225.

Figure 44:
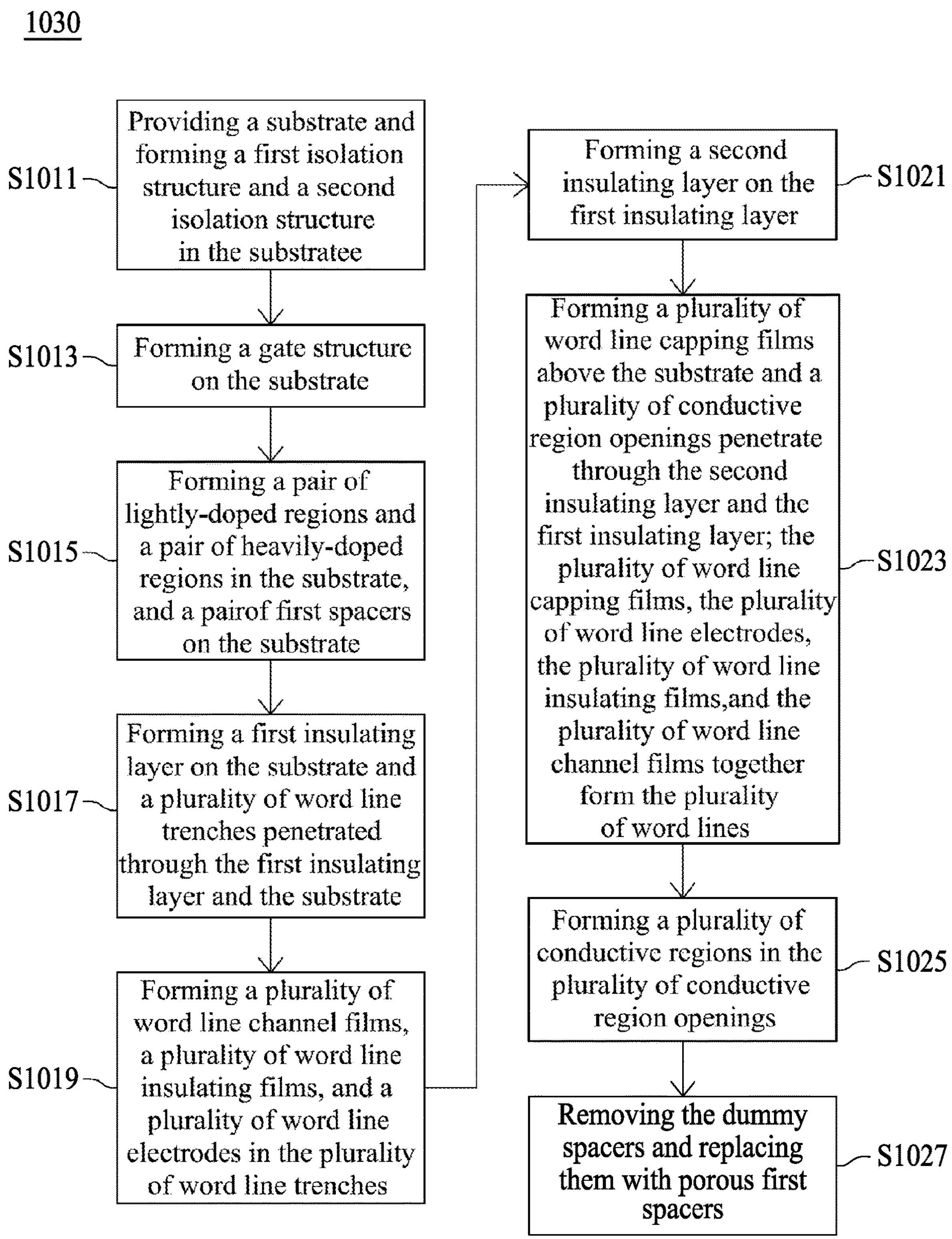
FIG. 44 illustrates, in a flowchart diagram form, a method for fabricating a semiconductor device in accordance with one embodiment of the present disclosure.

FIG. 44 illustrates, in a flowchart diagram form, a method 1030 for fabricating a semiconductor device 1100A in accordance with one embodiment of the present disclosure. FIGS. 45 to 65 illustrate, in schematic cross-sectional diagrams, a flow of fabricating the semiconductor device 1100A in accordance with one embodiment of the present disclosure.

Figure 45:
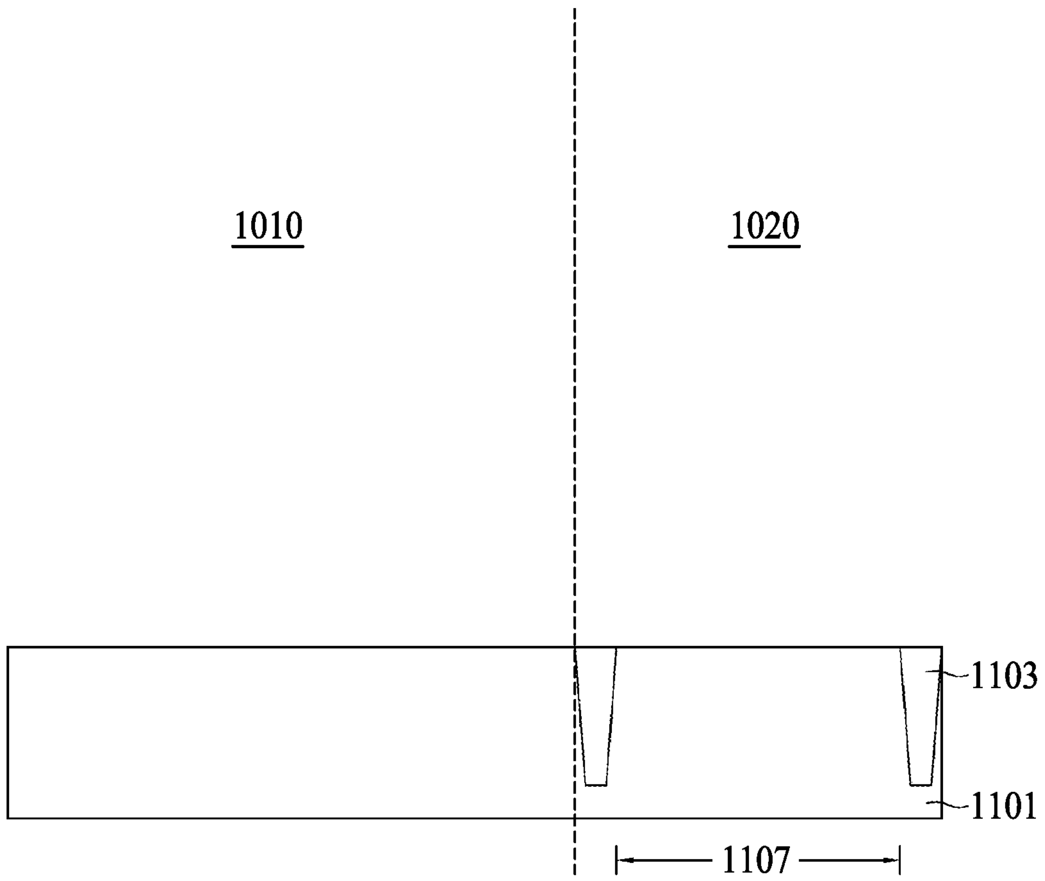
FIGS. 45 to 67 illustrate, in schematic cross-sectional diagrams, a flow of fabricating the semiconductor device in accordance with one embodiment of the present disclosure.
Figure 46:
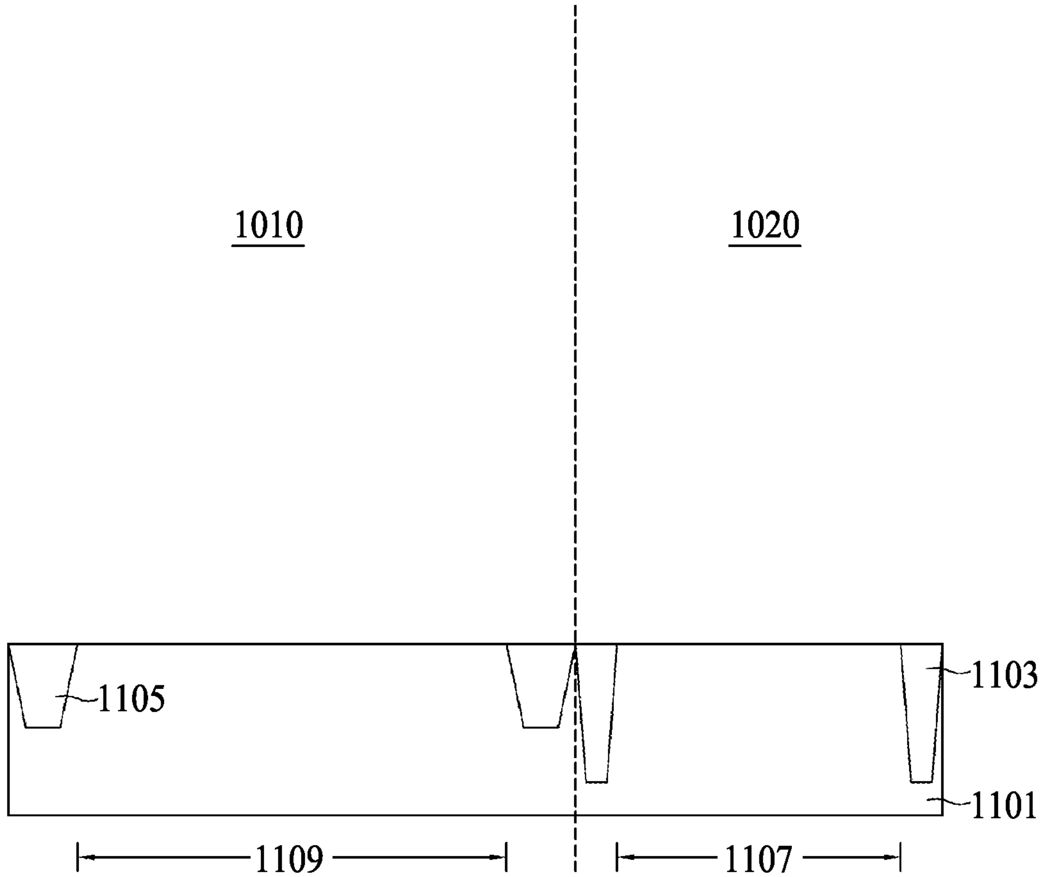

With reference to FIGS. 44, 45, and 46, at step S1011, in the embodiment depicted, a substrate 1101 may be provided and a first isolation structure 1103 and a second isolation structure 1105 may be formed in the substrate 1101. The substrate 1101 may include an array area 1010 and a peripheral area 1020. The array area 1010 may be in the center of the substrate 1101. The peripheral area 1020 may surround the array area 1010. A series of deposition processes may be performed to deposit a pad oxide layer (not shown in FIGS. 45 and 46) and a pad nitride layer (not shown in FIGS. 45 and 46) on the substrate 1101. A first photolithography process may be performed to define a position of the first isolation structure 1103 located at the peripheral area 1020. After the first photolithography process, a first etch process, such as an anisotropic dry etch process, may be performed to form trenches penetrating through the pad oxide layer, the pad nitride layer, and the substrate 1101. An insulating material may be deposited into the trenches and a planarization process, such as chemical mechanical polishing, may be subsequently performed to remove excess filling material until the pad nitride layer is exposed.

With reference to FIG. 46, a second photolithography process may be performed to define a position of the second isolation structure 1105 located at the array area 1010. After the second photolithography process, a second etch process, such as an anisotropic dry etch process, may be performed to form trenches penetrating through the pad oxide layer, the pad nitride layer, and the substrate 1101. An insulating material may be deposited into the trenches and a planarization process, such as chemical mechanical polishing, may be subsequently performed to remove excess filling materials until a top surface of the substrate 1101 is exposed. The first isolation structure 1103 and the second isolation structure 1105 may be concurrently formed after the planarization process. The first isolation structure 1103 may define a peripheral active region 1107 located at the peripheral area 1020. The second isolation structure 1105 may define a plurality of array active regions 1109 located at the array area 1010. A depth of the first isolation structure 1103 may be greater than a depth of the second isolation structure 1105.

Figure 47:
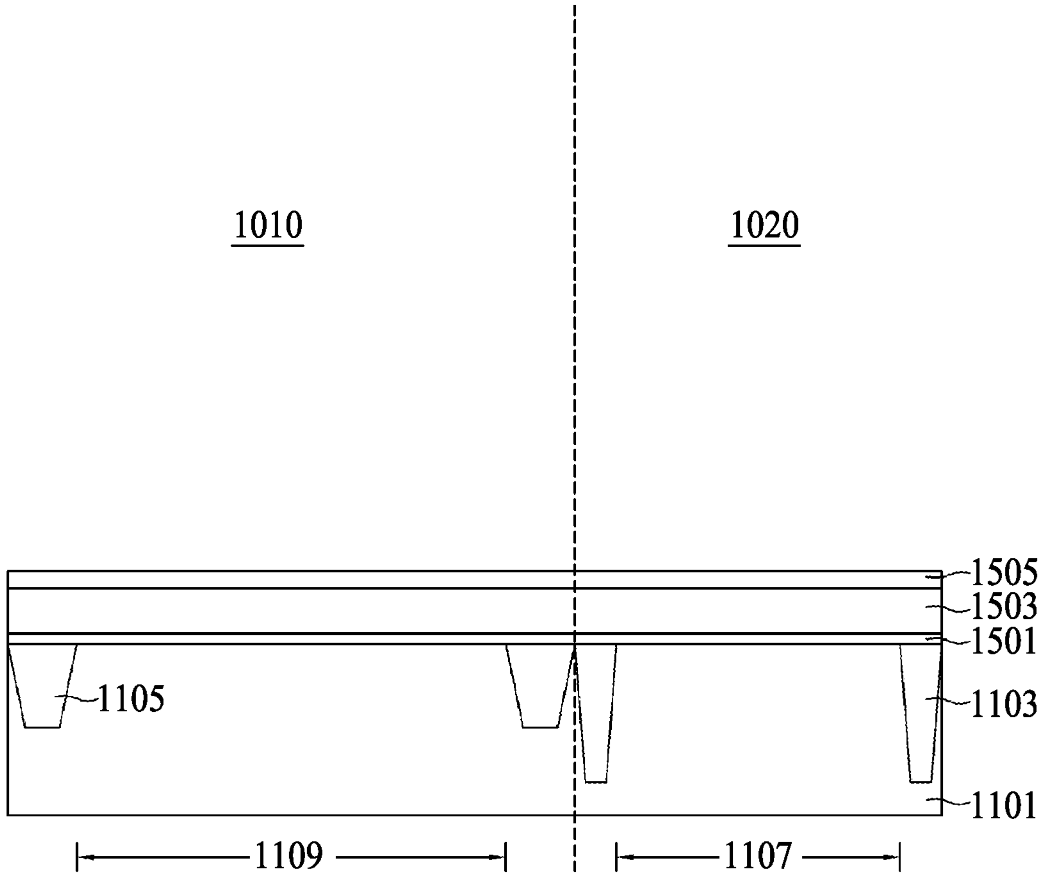

With reference to FIGS. 44 and 47 to 49, at step S1013, in the embodiment depicted, a gate structure 1201 may be formed on the substrate 1101. With reference to FIG. 47, a series of deposition processes may be performed to deposit a gate insulating layer 1501, a first gate conductive layer 1503, and a second gate conductive layer 1505 on the substrate 1101. The gate insulating layer 1501 may be formed of an insulating material having a dielectric constant of about 4.0 or greater. Alternatively, in another embodiment, the gate insulating layer 1501 may be formed of silicon oxide, silicon nitride, silicon oxynitride, silicon nitride oxide, or the like. The gate insulating layer 1501 may have a thickness between about 0.5 nm and about 5.0 nm. Preferably, the thickness of the gate insulating layer 1501 may be between about 0.5 nm and about 2.5 nm.

Figure 48:
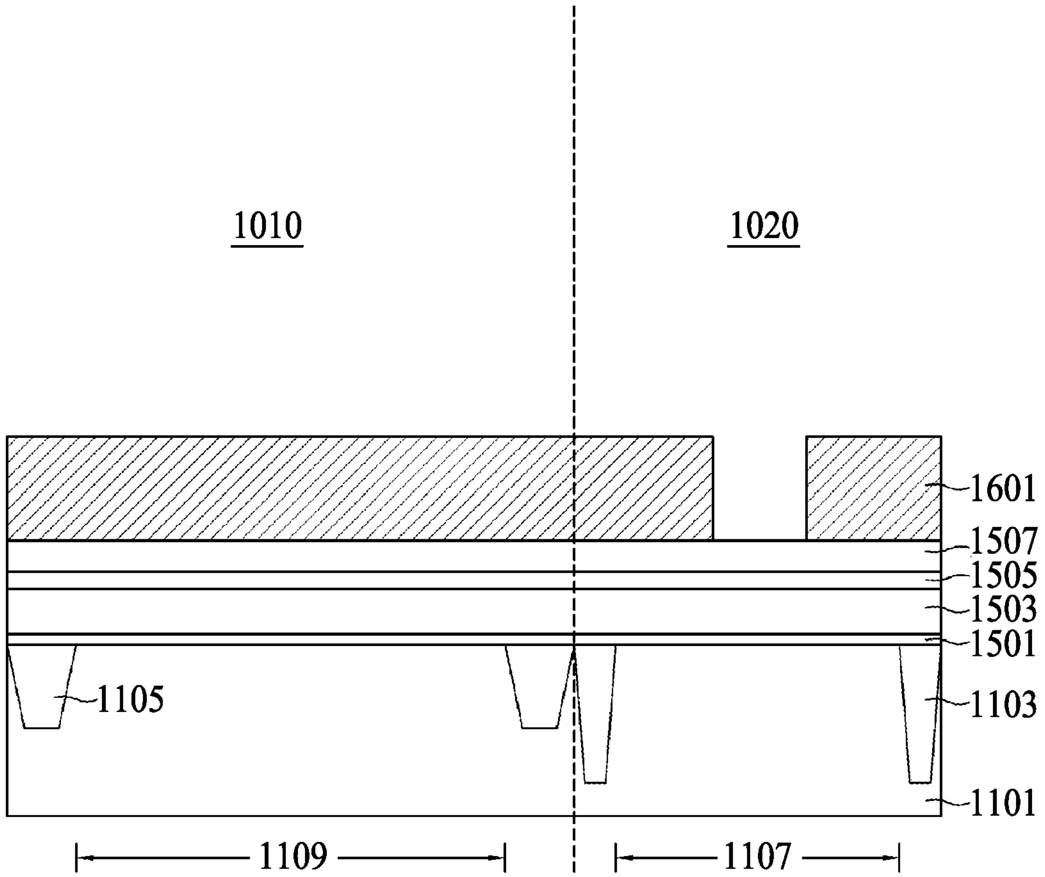

With reference to FIG. 47, the first gate conductive layer 1503 may have a thickness between about 150 nm and about 300 nm. The first gate conductive layer 1503 may be formed of, for example, doped polysilicon. The second gate conductive layer 1505 may be formed of, for example, metal silicide. With reference to FIG. 48, a gate mask layer 1507 may be formed on the second gate conductive layer 1505. The gate mask layer 1507 may be formed of, for example, silicon nitride, silicon oxynitride, silicon nitride oxide, or the like. A photolithography process using first mask segments 1601 as a mask may be performed to define a position of the gate structure 1201.

Figure 49:
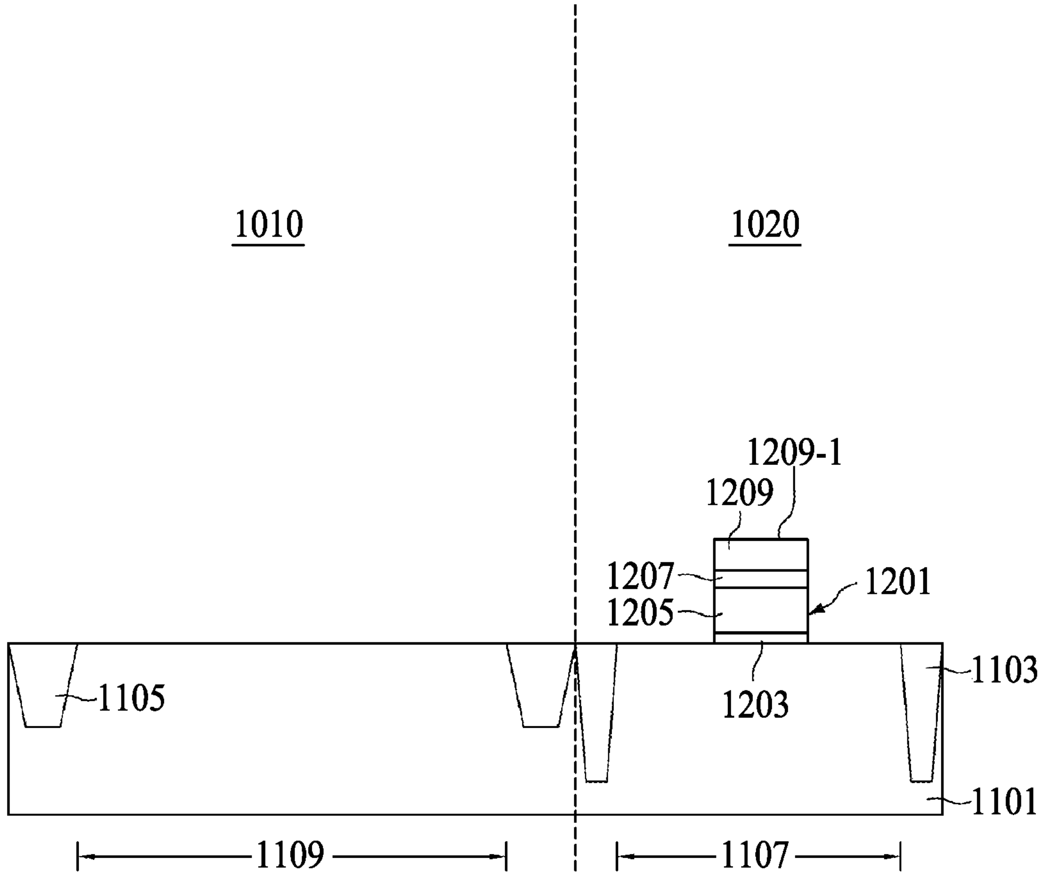

With reference to FIG. 49, after the photolithography process, an etch process, such as an anisotropic dry etch process, may be performed to remove portions of the gate mask layer 1507, the second gate conductive layer 1505, the first gate conductive layer 1503 and the gate insulating layer 1501, and turn the remaining portions of the aforementioned layers into a gate insulating film 1203, a first gate conductive film 1205, a second gate conductive film 1207, and a gate mask film 1209, respectively. The gate insulating film 1203, the first gate conductive film 1205, the second gate conductive film 1207, and the gate mask film 1209 together form the gate structure 1201.

Figure 50:
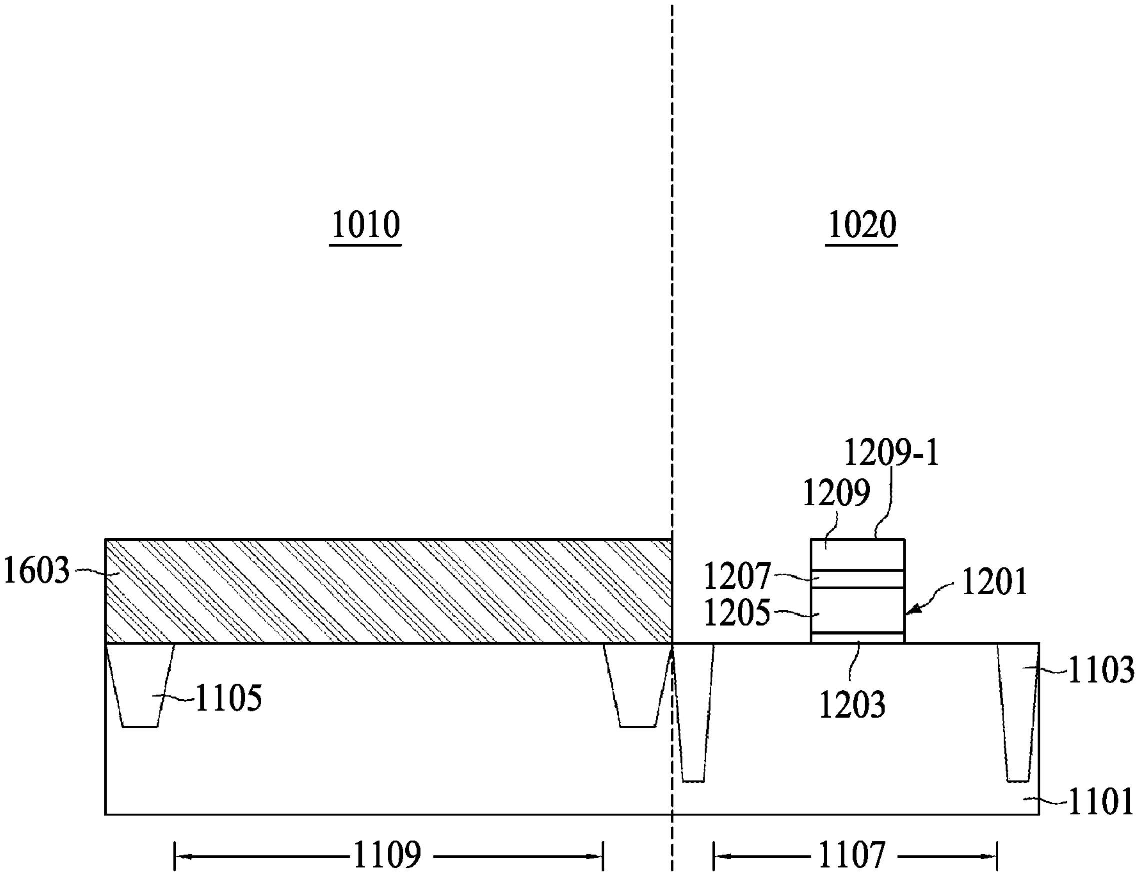
Figure 51:
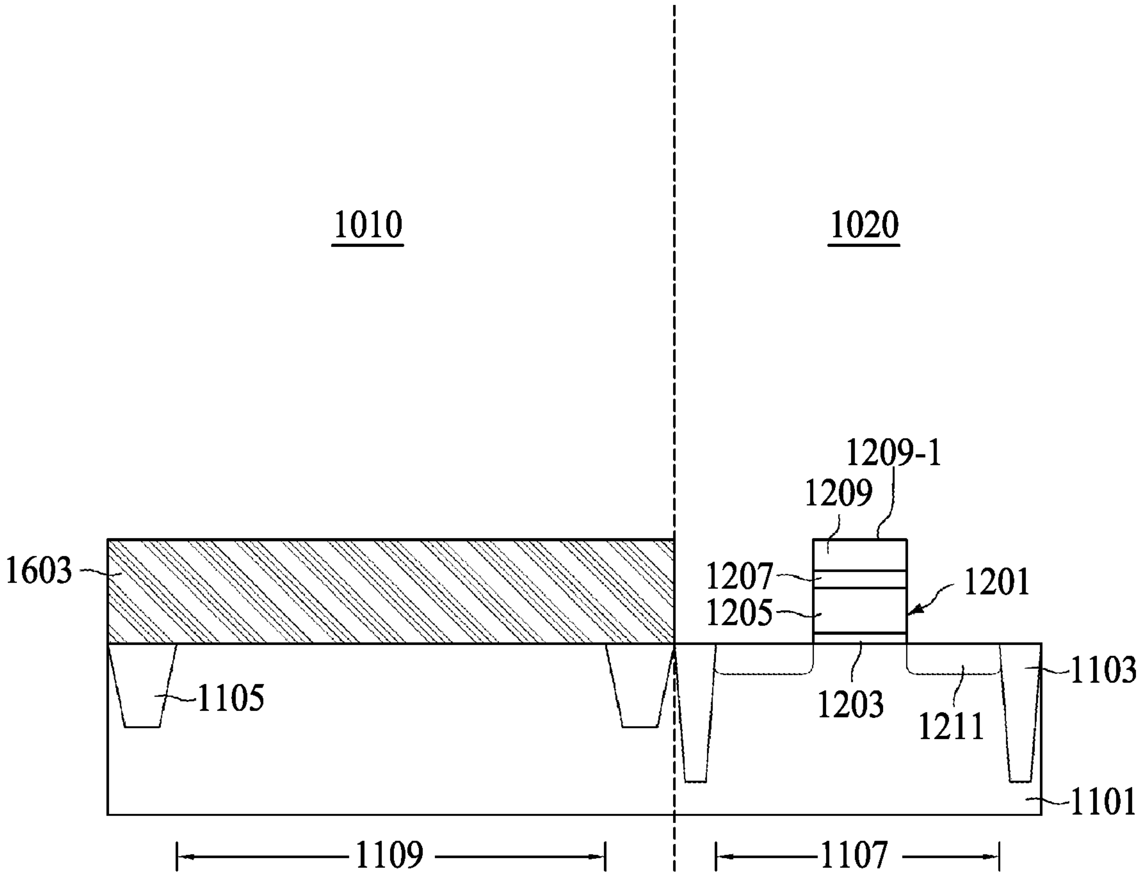

With reference to FIGS. 44 and 50 to 54, at step S1015, in the embodiment depicted, a pair of lightly-doped regions 1211 and a pair of heavily-doped regions 1213 may be formed in the substrate 1101, and a pair of dummy spacers 1315 may be formed on the substrate 1101. With reference to FIG. 50, a second mask segment 1603 may be formed to mask the array area 1010 of the substrate 1101. With reference to FIG. 51, an implantation process may be performed to form the pair of lightly-doped regions 1211 in the substrate 1101 and adjacent to the gate insulating film 1203. After the implantation process, the second mask segment 1603 may be removed.

Figure 52:
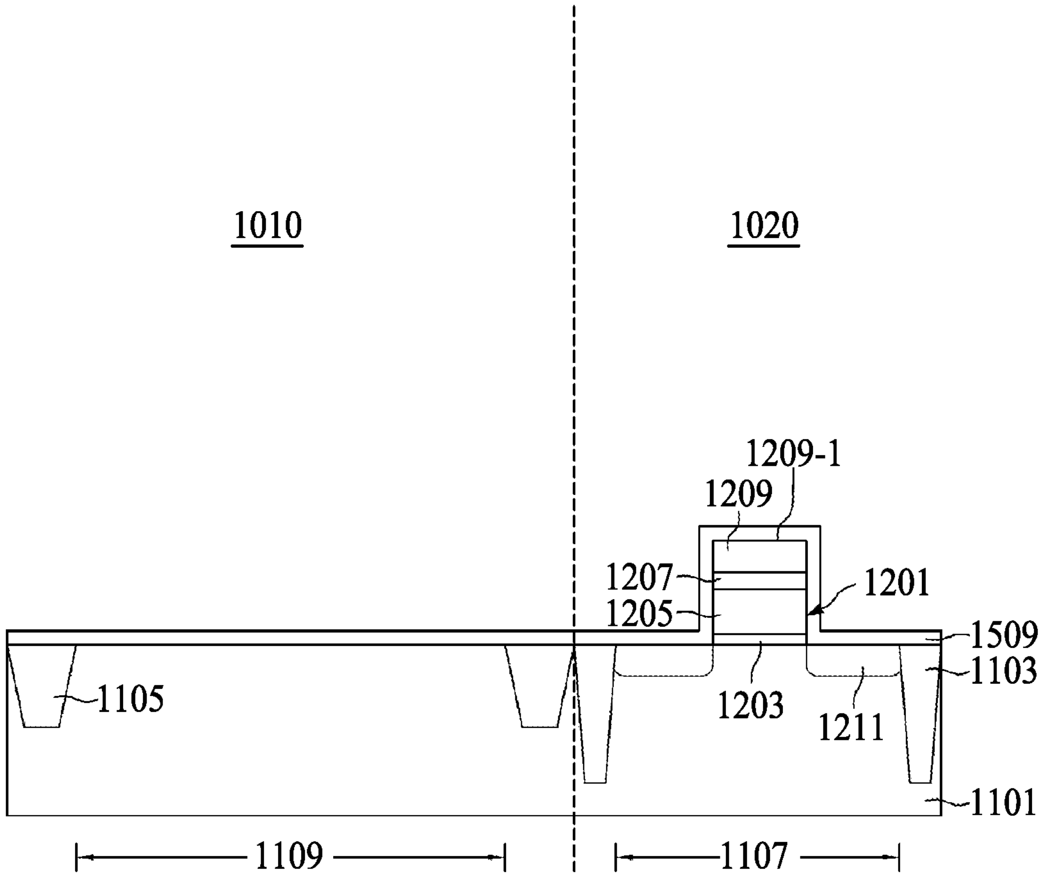
Figure 53:
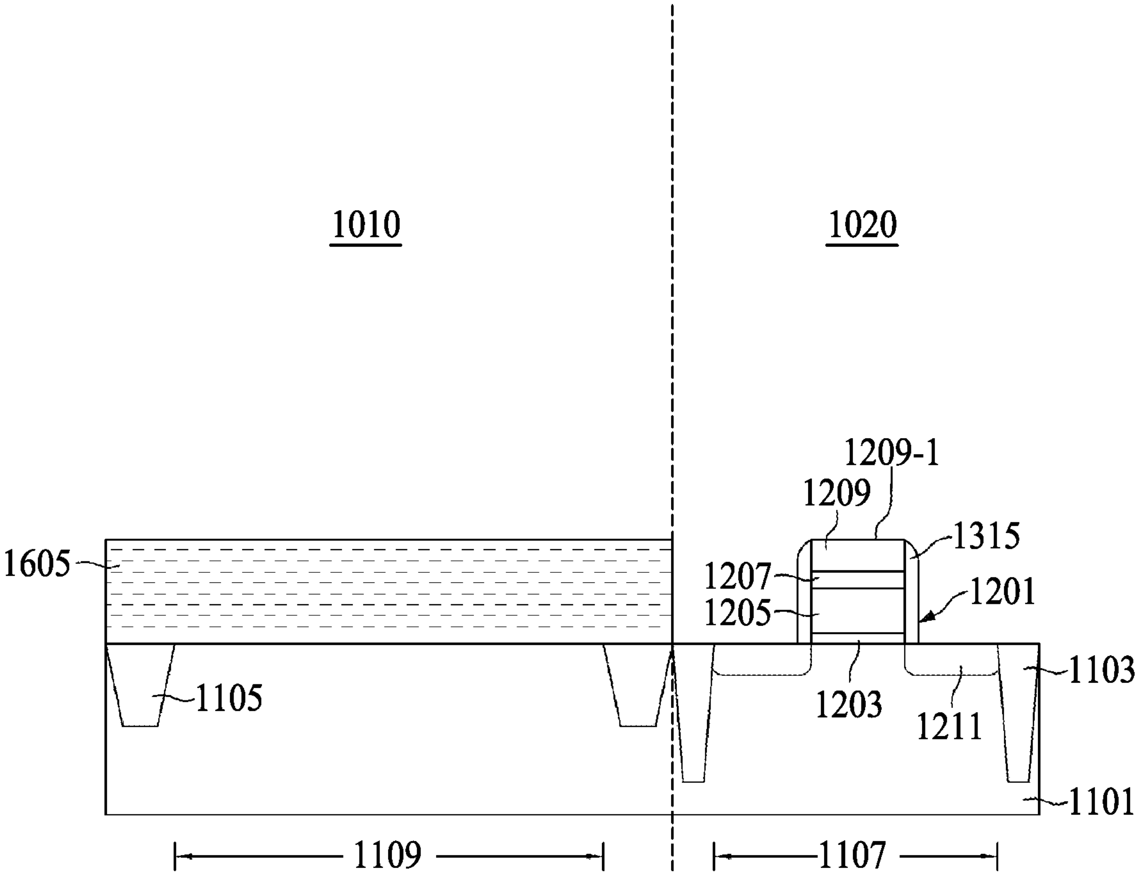
Figure 54:
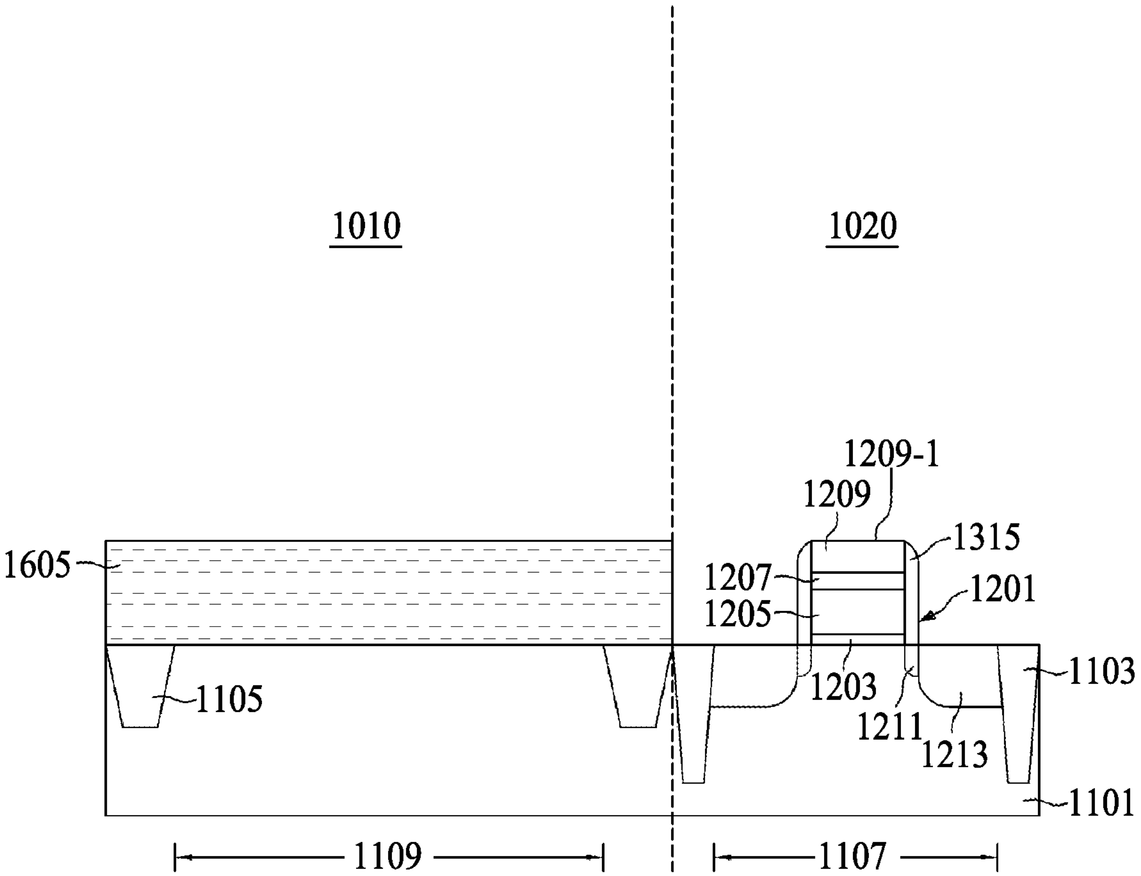

With reference to FIG. 52, a spacer layer 1509 may be formed by a deposition process and may cover the top surface of the substrate 1101 and the gate structure 1201. The spacer layer 1509 may be formed of, for example, polysilicon, silicon oxide, or silicon nitride. Alternatively, the material of the spacer layer 1509 is used as a sacrificial material before an energy-removable material, similar to the energy-removable material 607 for forming the porous first spacers 1215, are formed in place. With reference to FIG. 53, an etch process, such as an anisotropic dry etch process, may be performed to remove portions of the spacer layer 1509 formed on the top surface of the substrate 1101 and a top surface 1209-1 of the gate mask film 1209, and may turn the remaining spacer layer 1509 into a pair of dummy spacers 1315 attached to two sides of the gate structure 1201. After the etch process, a third mask segment 1605 may be formed to cover the array area 1010 of the substrate 1101. With reference to FIG. 54, an implantation process may be performed to form the pair of heavily-doped regions 1213 in the substrate 1101 and adjacent to the pair of dummy spacers 1315. After the implantation process, the third mask segment 1605 may be removed.

Figure 55:
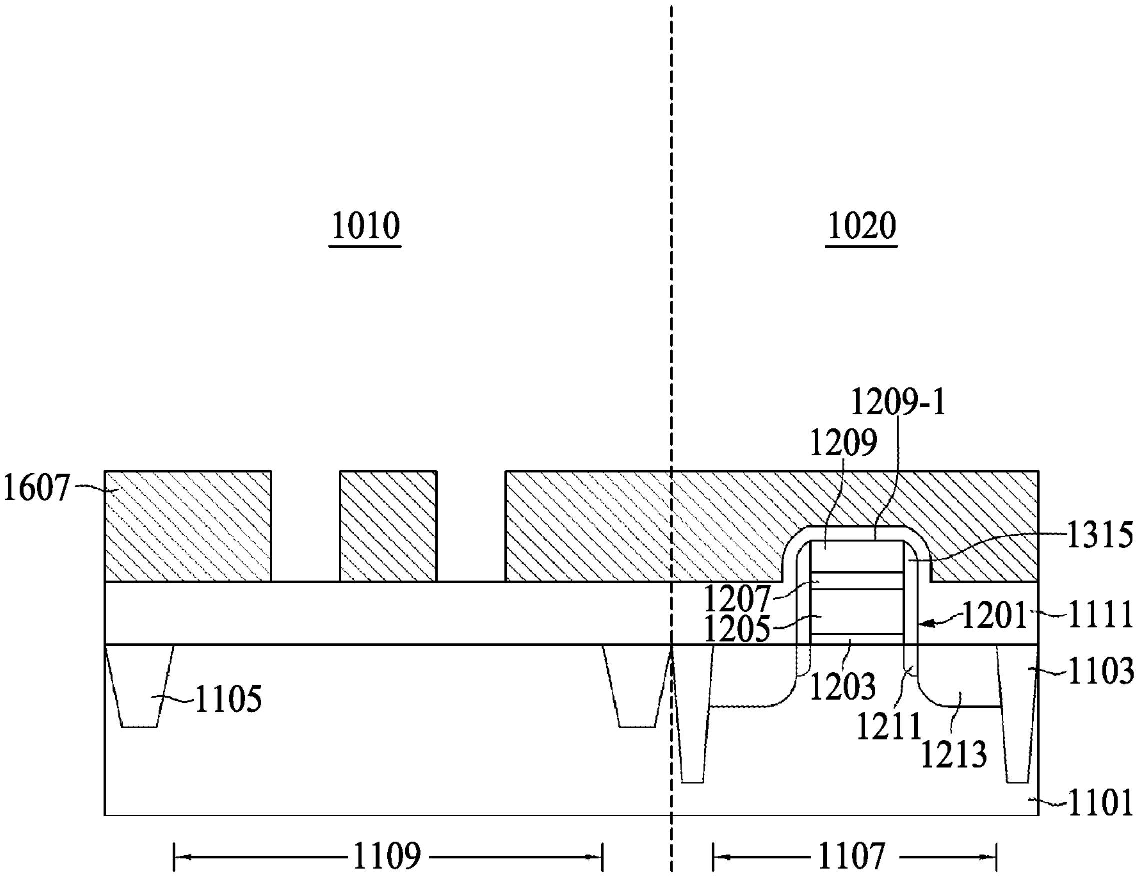
Figure 56:
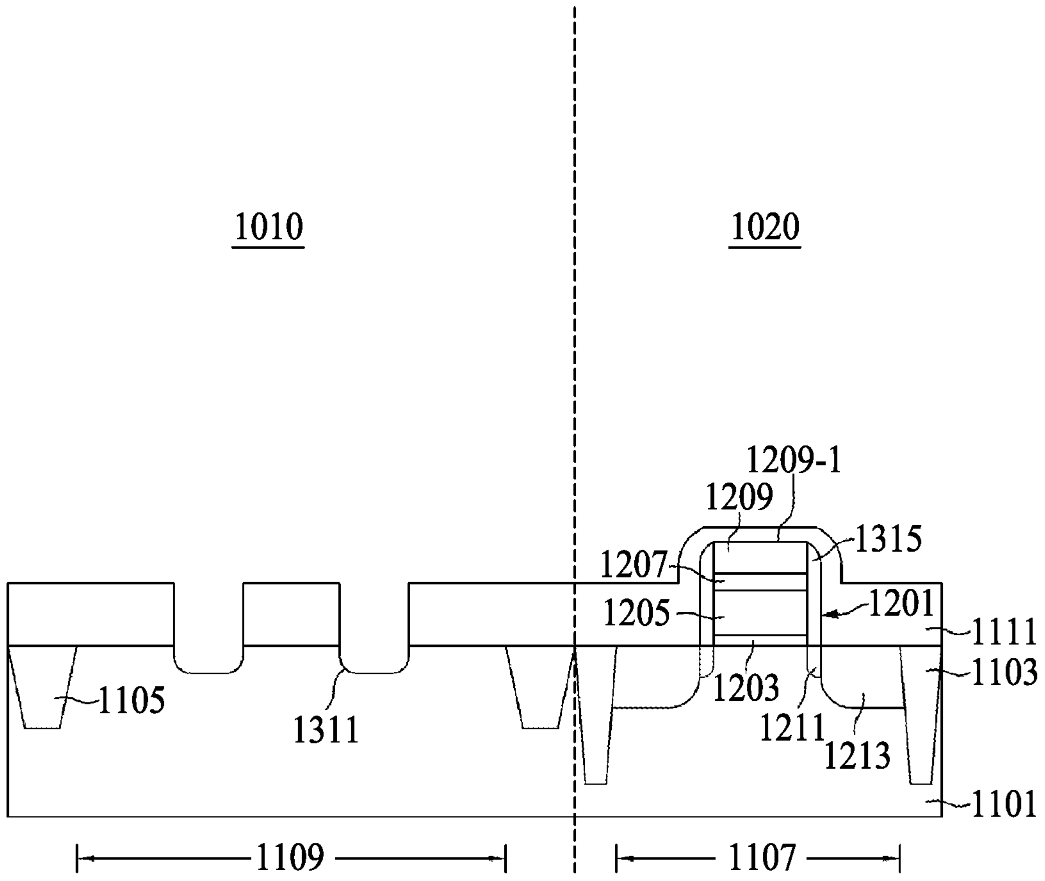

With reference to FIGS. 44, 55, and 56, at step S1017, in the embodiment depicted, a first insulating layer 1111 may be formed on the substrate 1101 and a plurality of word line trenches 1311 may be formed so as to penetrate through the first insulating layer 1111 and into the substrate 1101. With reference to FIG. 55, a first insulating layer 1111 may be formed over the substrate 1101 by a deposition process. A portion of the first insulating layer 1111 deposited on the gate structure 1201 and the pair of dummy spacers 1315 may protrude from a top surface of a remaining portion of the first insulating layer 1111. A photolithography process using fourth mask segments 607 as masks may be performed to define positions of the plurality of word line trenches 1311. With reference to FIG. 56, after the photolithography process, an etch process, such as an anisotropic dry etch process, may be performed to form the plurality of word line trenches 1311 so as to penetrate through the first insulating layer 1111 and into the substrate 1101. The plurality of word line trenches 1311 may be located at the array area 1010. Bottoms of the plurality of word line trenches 1311 may be flat.

Figure 57:
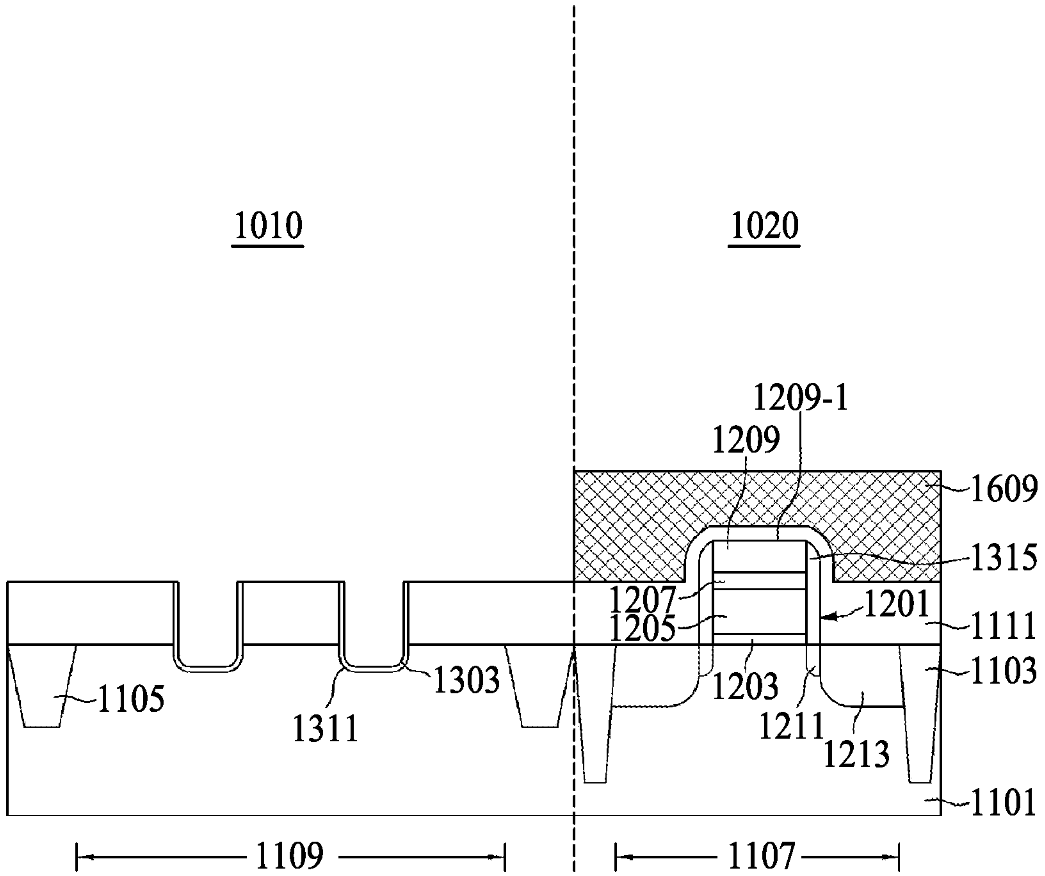
Figure 58:
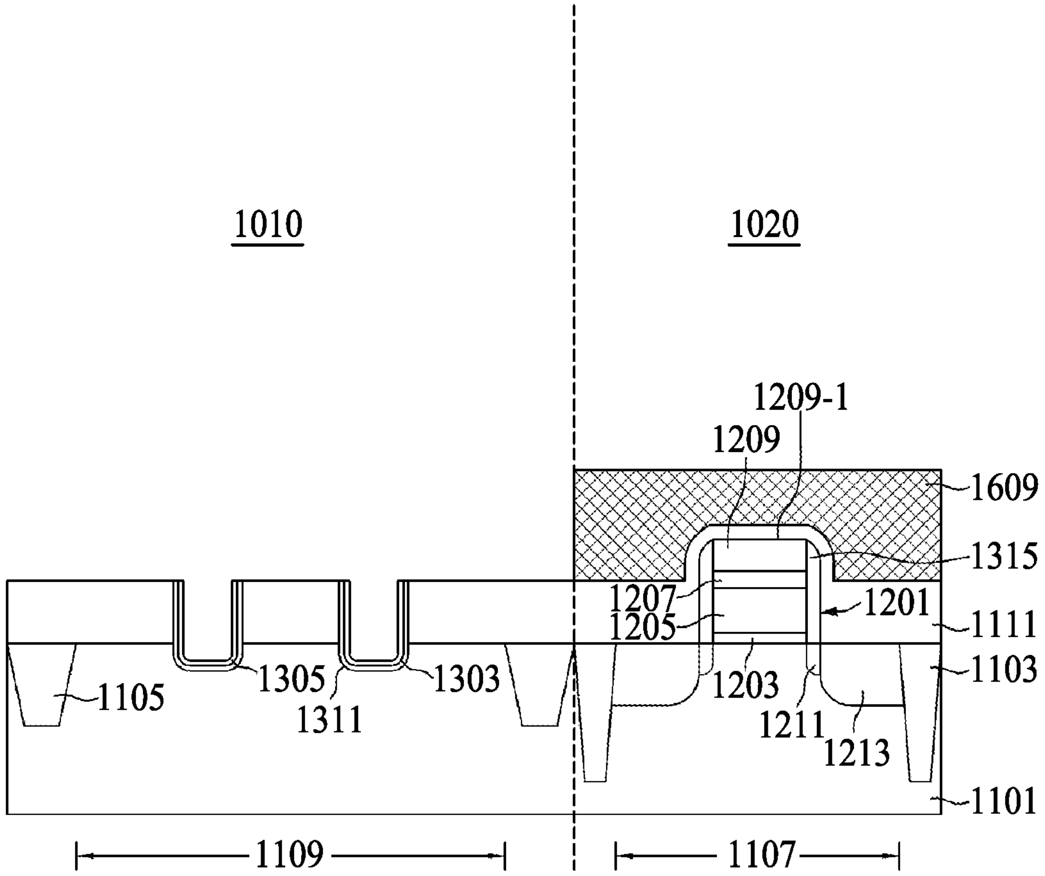

With reference to FIGS. 44 and 57 to 58, at step S1019, in the embodiment depicted, a plurality of word line channel films 1303, a plurality of word line insulating films 1305, and a plurality of word line electrodes 1307 may be respectively correspondingly formed in the plurality of word line trenches 1311. With reference to FIG. 57, a fifth mask segment 609 may be formed to cover the peripheral area 1020 of the substrate 1101. The plurality of word line channel films 1303 may be formed in the plurality of word line trenches 1311. Top surfaces of the plurality of word line channel films 1303 may be even with the top surface of the first insulating layer 1111 at the array area 1010.

Figure 59:
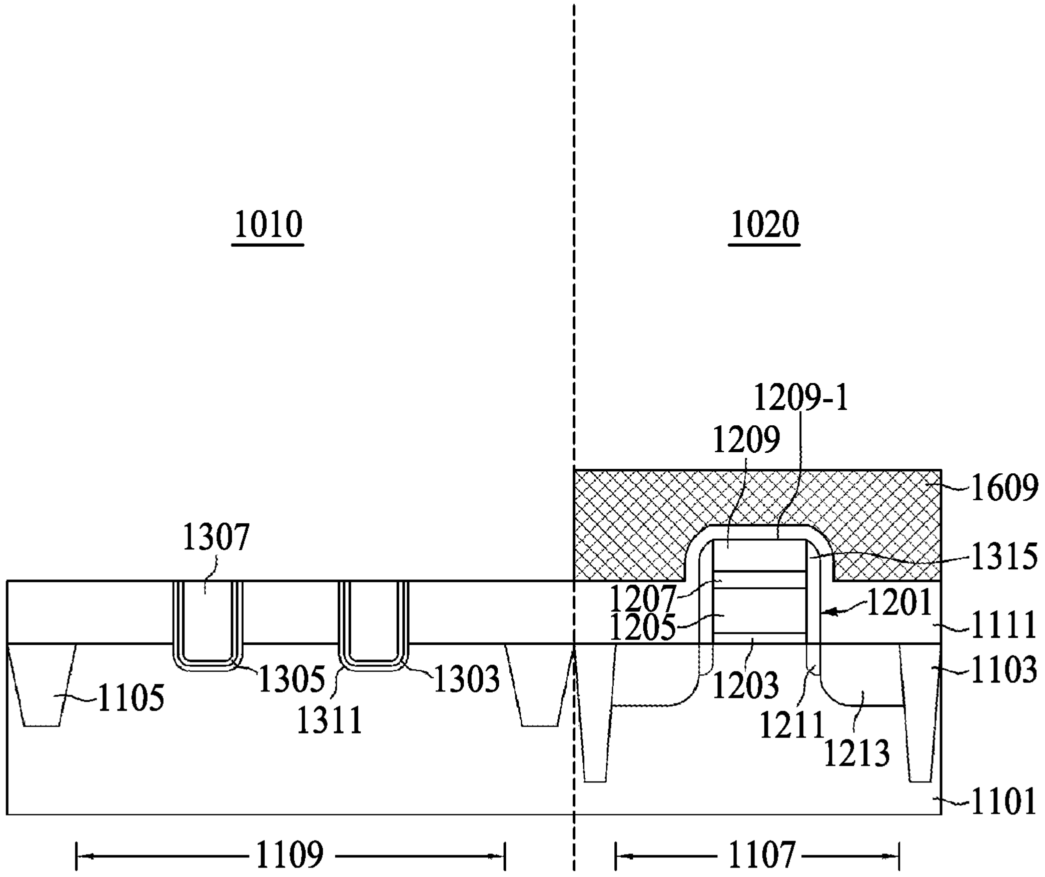

With reference to FIG. 58, the plurality of word line insulating films 1305 may be respectively correspondingly formed on the plurality of word line channel films 1303 in the plurality of word line trenches 1311. Top surfaces of the plurality of word line insulating films 1305 may be even with the top surfaces of the plurality of word line channel films 1303 and the top surface of the first insulating layer 1111 at the array area 1010. With reference to FIG. 59, the plurality of word line electrodes 1307 may be respectively correspondingly formed on the plurality of word line insulating films 1305 and may fill the plurality of word line trenches 1311. Top surfaces of the plurality of word line electrodes 1307 may be even with the top surfaces of the plurality of word line insulating films 1305, top surfaces of the plurality of word line channel films 1303, and the top surface of the first insulating layer 1111 at the array area 1010.

Figure 60:
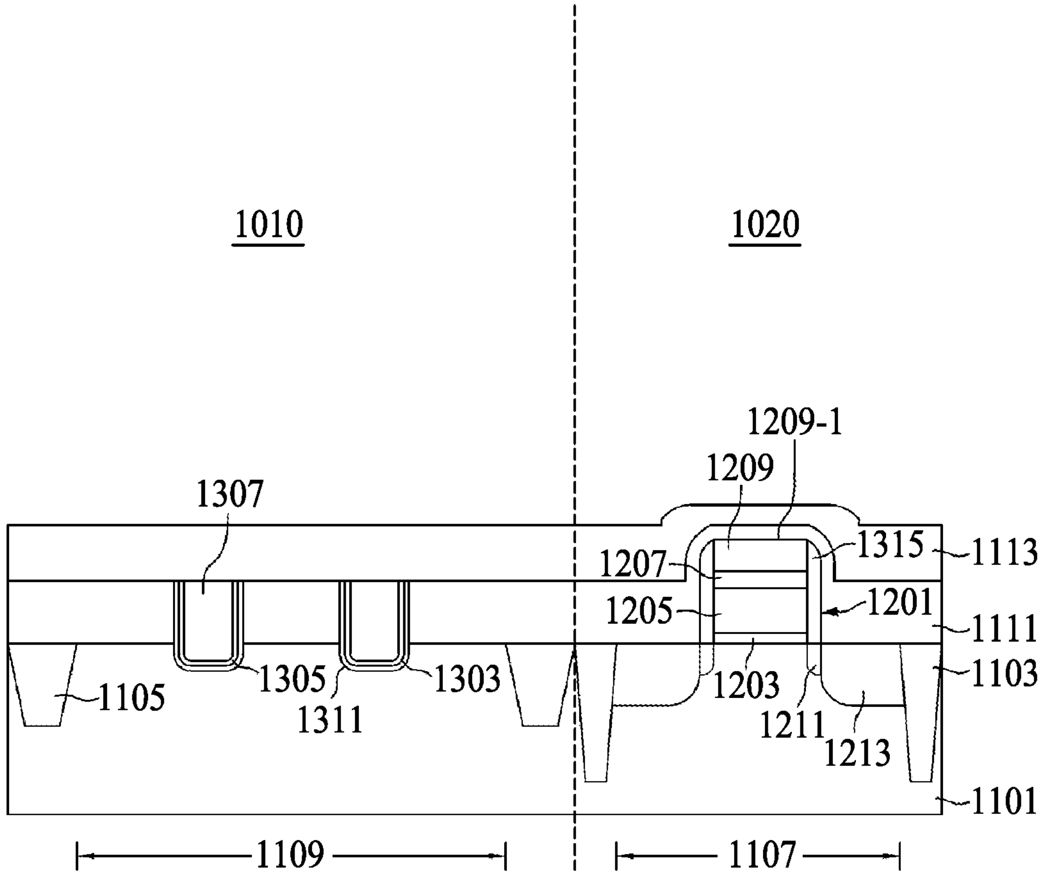

With reference to FIGS. 44 and 60, at step S1021, in the embodiment depicted, a second insulating layer 1113 may be formed on the first insulating layer 1111 by a deposition process. The portion of the second insulating layer 1113 deposited above the gate structure 1201 and the pair of dummy spacers 1315 may protrude from a top surface of the remaining portion of the second insulating layer 1113.

Figure 61:
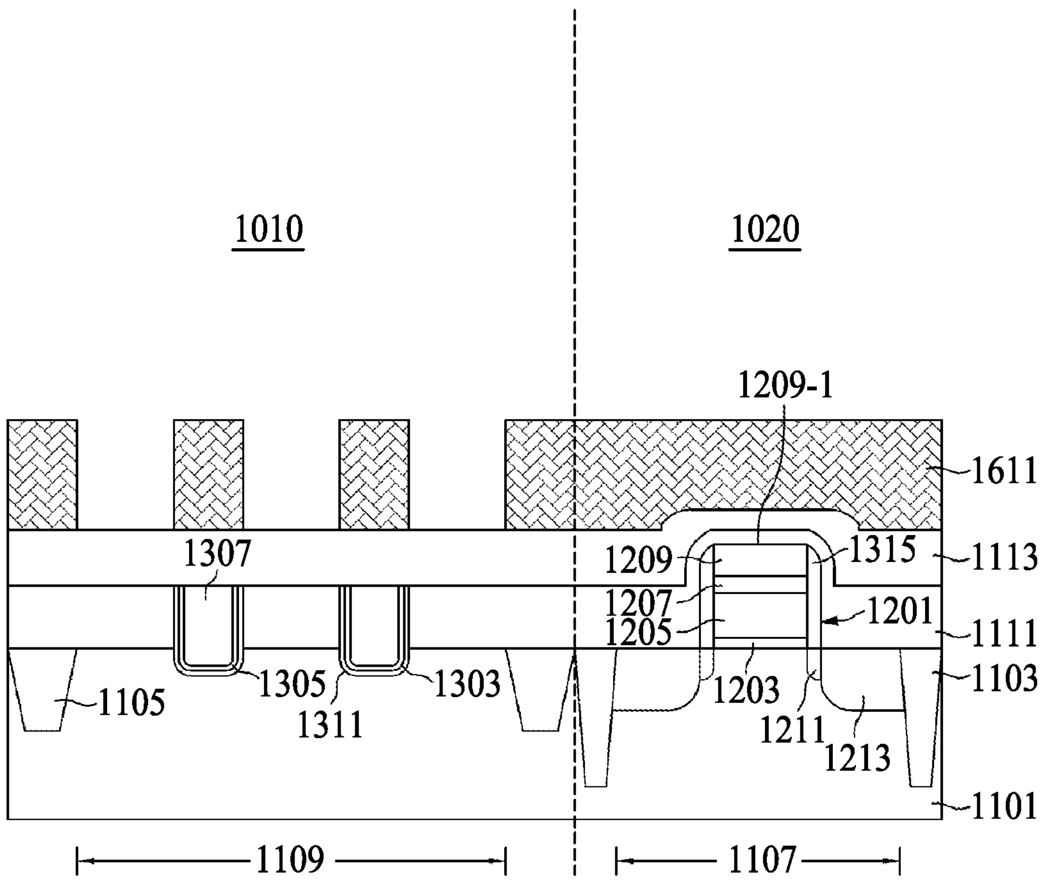
Figure 62:
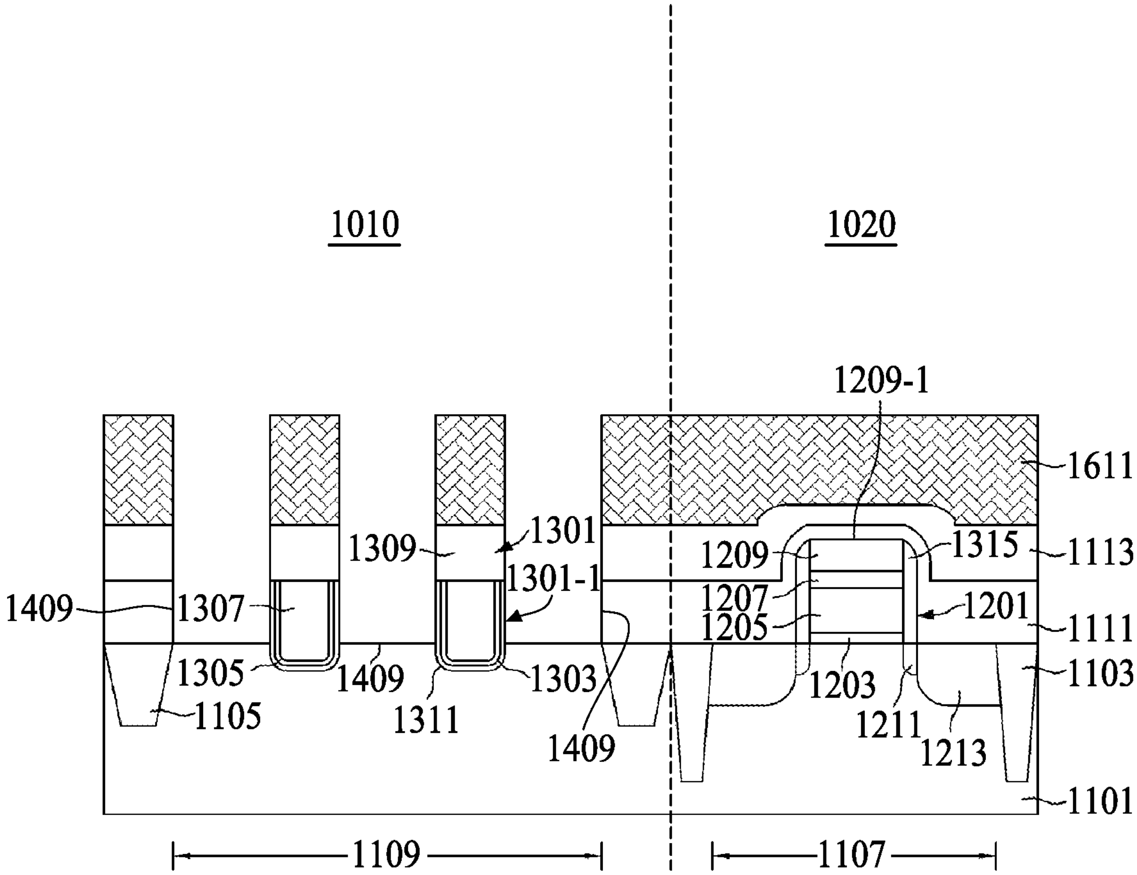

With reference to FIGS. 44, 61, and 62, at step S2023, in the embodiment depicted, a plurality of word line capping films 1309 may be formed above the substrate 1101, wherein the plurality of word line capping films 1309, the plurality of word line electrodes 1307, the plurality of word line insulating films 1305, and the plurality of word line channel films 1303 together form a plurality of word lines 1301, and a plurality of conductive region openings 1409 may be formed so as to penetrate through the second insulating layer 1113 and the first insulating layer 1111. With reference to FIG. 61, a photolithography process using sixth mask segments 1611 as masks may be performed to define positions of the plurality of conductive region openings 1409.

With reference to FIG. 62, after the photolithography process, an etch process, such as an anisotropic dry etch process, may be performed to remove portions of the second insulating layer 1113 and the first insulating layer 1111 located at the array area 1010 to concurrently form the plurality of word line capping films 1309 and the plurality of conductive region openings 1409. The plurality of word line capping films 1309 may be respectively correspondingly formed on the top surfaces of the plurality of word line electrodes 1307, the plurality of word line insulating films 1305, and the plurality of word line channel films 1303. The plurality of word line capping films 1309, the plurality of word line electrodes 1307, the plurality of word line insulating films 1305, and the plurality of word line channel films 1303 together form the plurality of word lines 1301. The plurality of conductive region openings 1409 may be respectively correspondingly formed adjacent to the plurality of word lines 1301. Portions of the top surfaces of the substrate 1101 and sidewalls 1301-1 of the word lines 1301 may be exposed through the plurality of conductive region openings 1409.

Figure 63:
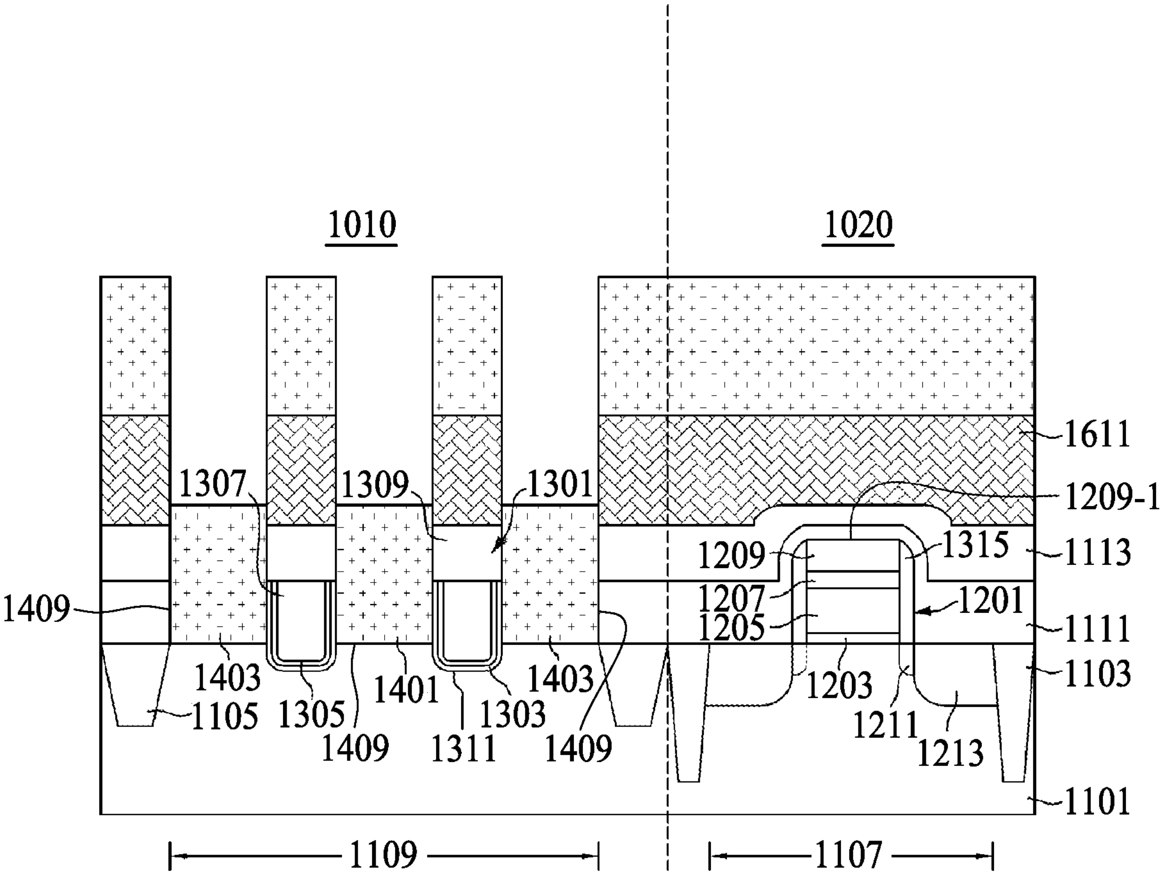

With reference to FIGS. 44 and 63 to 65, at step S1025, in the embodiment depicted, a plurality of conductive regions 1401, 1403 may be respectively correspondingly formed in the plurality of conductive region openings 1409. With reference to FIG. 63, a polysilicon layer may be deposited over the substrate 1101 and the sixth mask segments 1611 to fill the plurality of conductive region openings 1409 and concurrently form the plurality of conductive regions 1401, 1403. The plurality of conductive regions 1401, 1403 may include a first conductive region 1401 and two second conductive regions 1403. The first conductive region 1401 may be formed between an adjacent pair of the plurality of word lines 1301. The two second conductive regions 1403 may be formed opposite to the first conductive region 1401 and adjacent to the plurality of word lines 1301.

Figure 64:
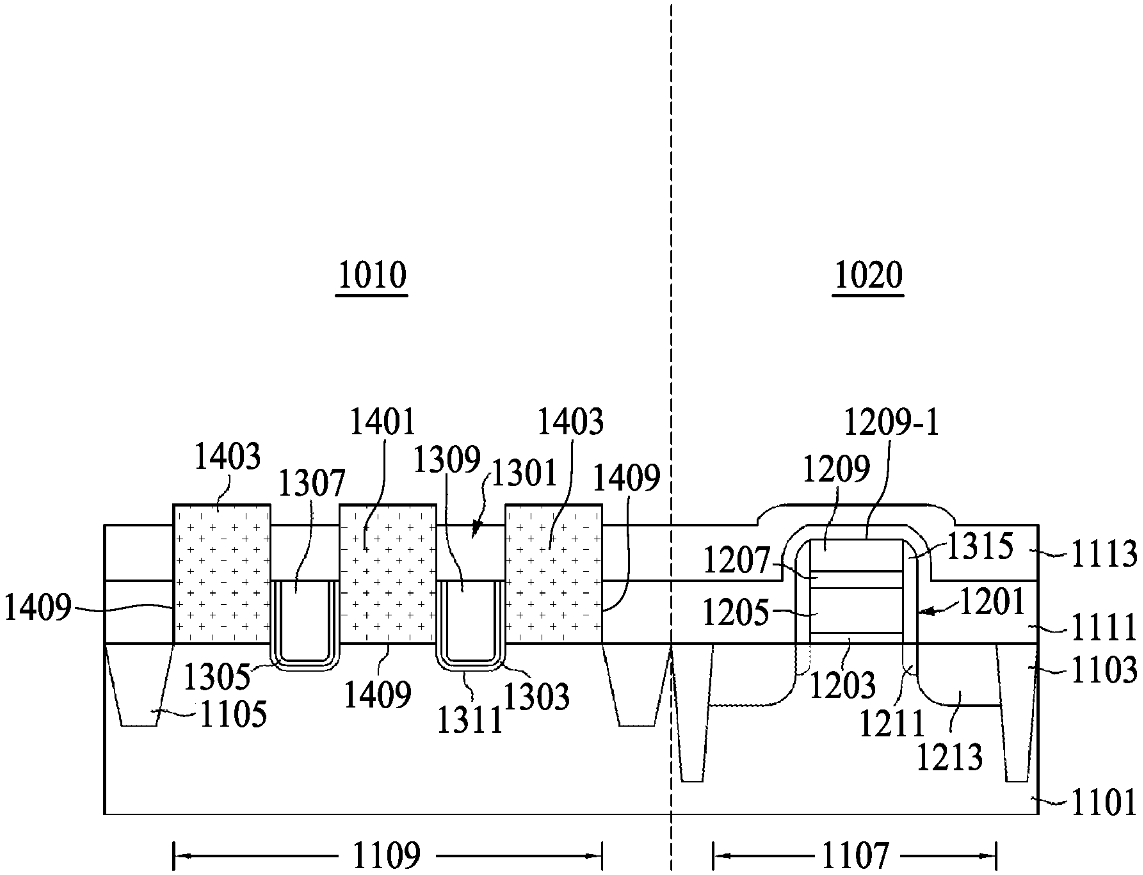
Figure 65:
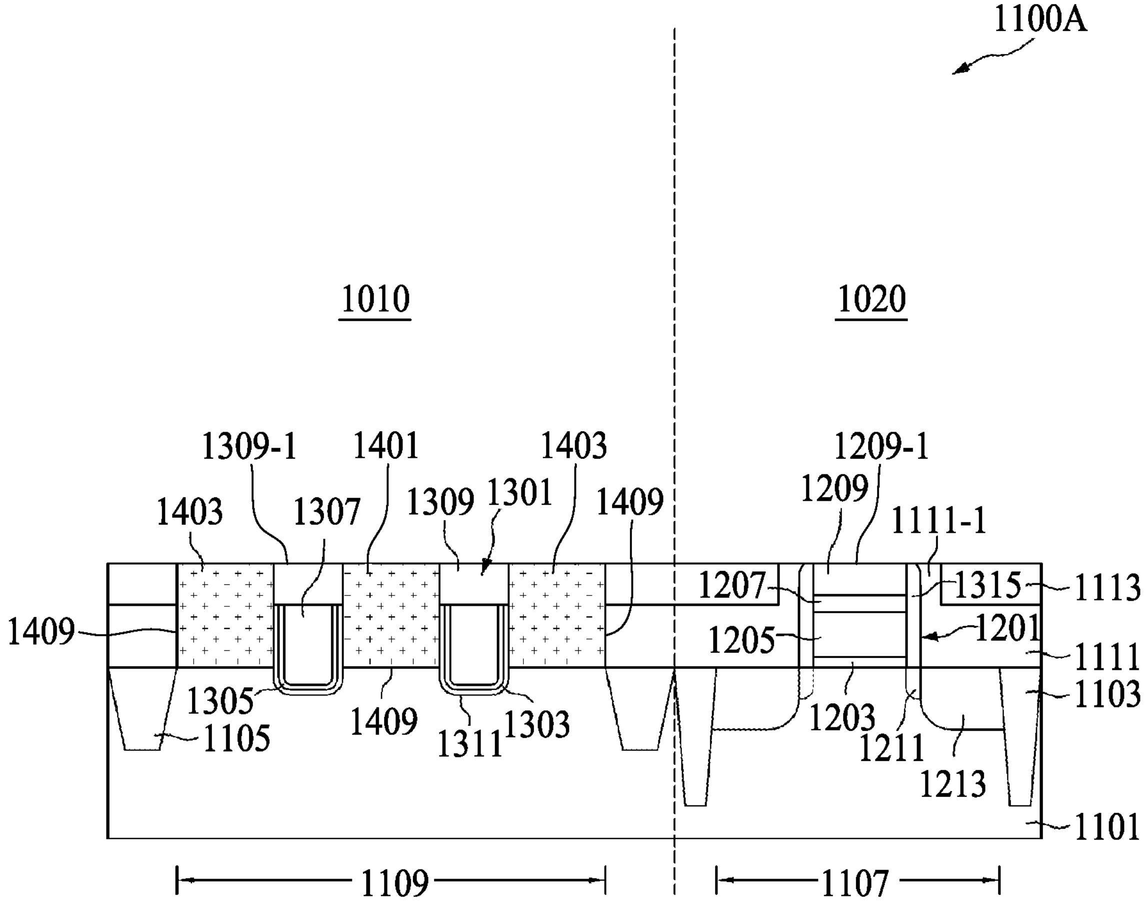

With reference to FIG. 64, the sixth mask segments 1611 may be removed. Portions of the polysilicon layer formed on the sixth mask segments 1611 may be removed along with the removal of the sixth mask segments 1611. It should be noted that, at the current stage, top surfaces of the first conductive region 1401 and the two second conductive regions 1403 may be higher than the top surface of the second insulating layer 1113 or the top surfaces of the plurality of word line capping films 1309. With reference to FIG. 65, a planarization process, such as chemical mechanical polishing, may be performed until the top surface 1209-1 of the gate mask film 1209 is exposed, in order to provide a substantially flat surface for subsequent processing steps. Protruding first insulating segments 1111-1 may be concurrently formed.

Figure 66:
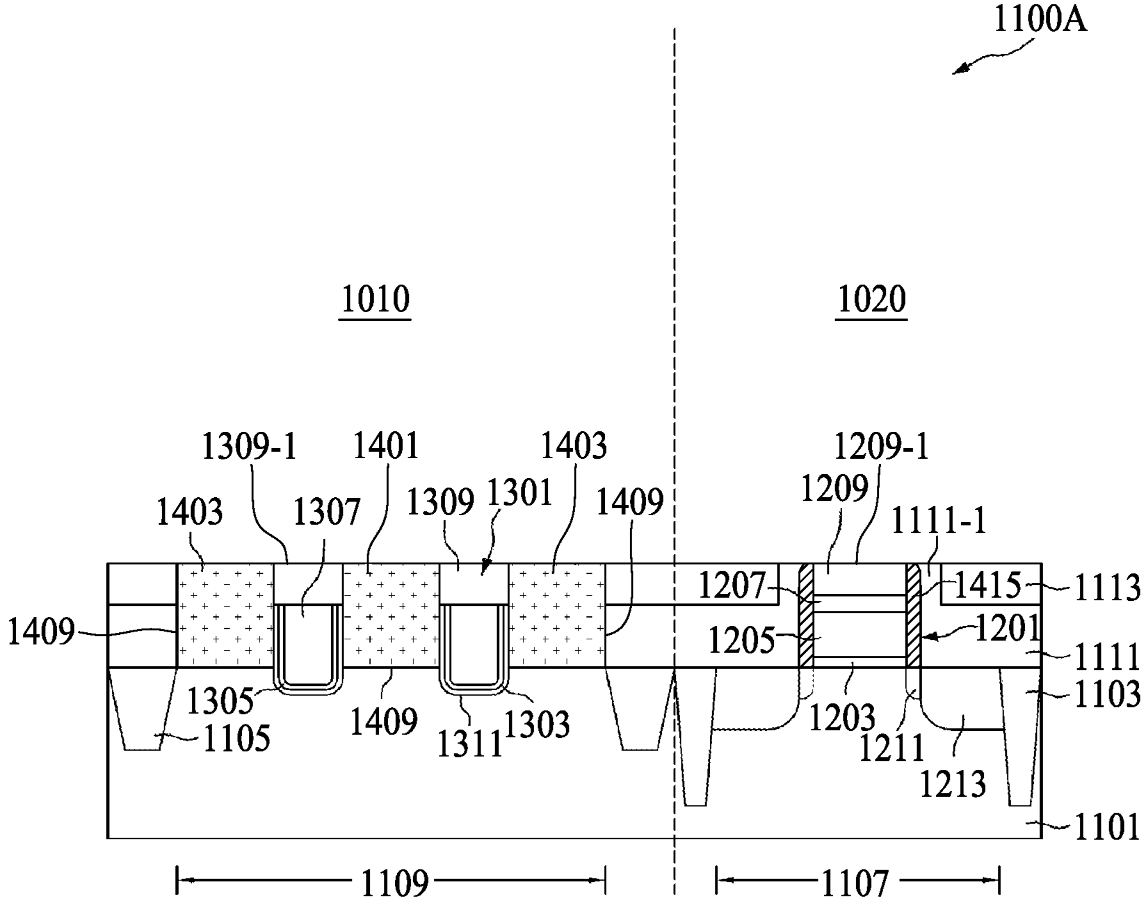
Figure 67:
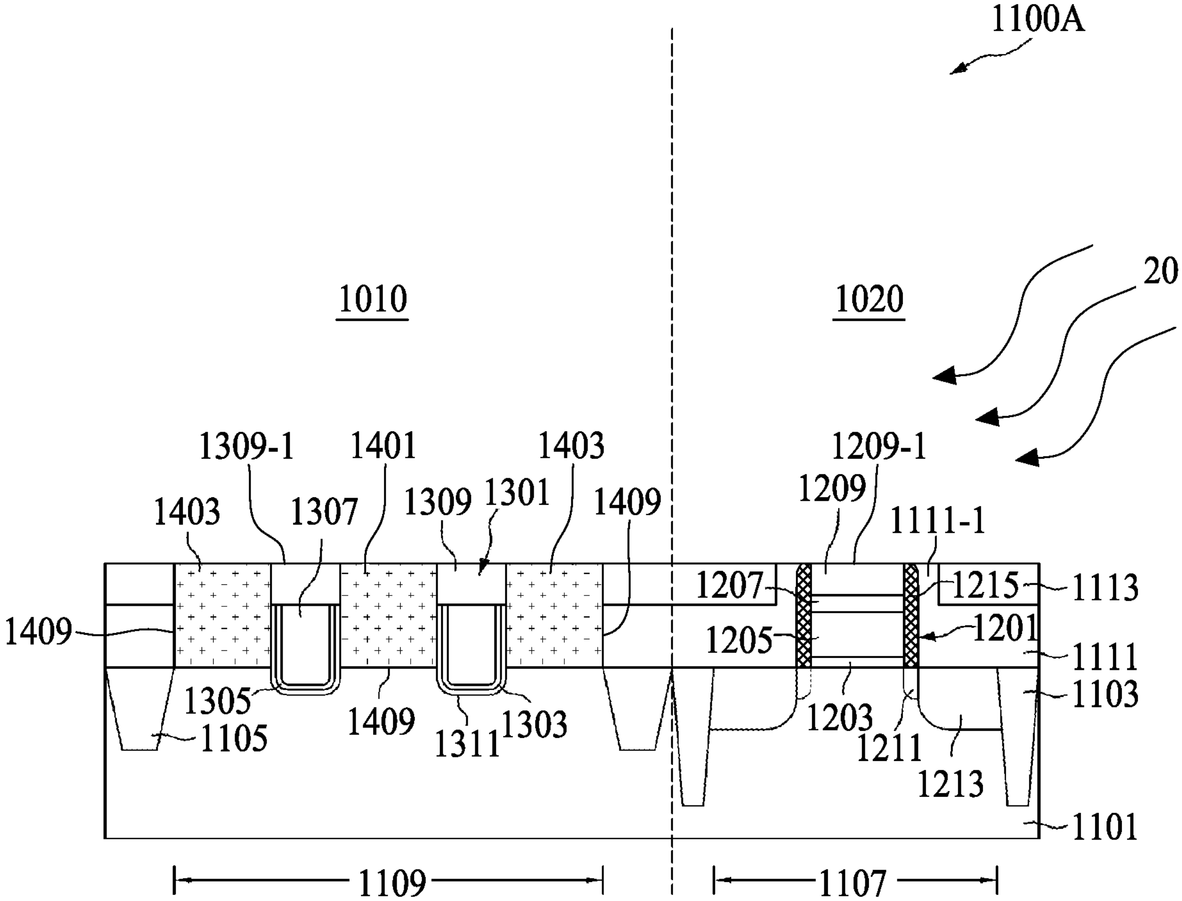

With reference to FIGS. 44 and 66 to 67, at step S1027, in the embodiment depicted, the dummy spacers 1315 are removed and replaced with porous first spacers 1215. With reference to FIG. 66, the dummy spacers 1315 may be removed. The removal of the dummy spacer 1315 may be performed by an etching operation. A pair of trenches are left after the dummy spacers 1315 are removed. Subsequently, an energy-removable material 1415 is deposited into the trenches left by the dummy spacers 1315. The materials, configurations and method of forming of the energy-removable material 1415 may be similar to those of the energy-removable material 607. In some embodiments, a planarization process may be performed on the energy-removable material 1415 to level the upper surface of the energy-removable material 1415 with the upper surface of the second insulating layer 1113.

With reference to FIG. 67, an energy treatment 20 is performed on the energy-removable material 1415 to thereby transform the energy-removable material 1415 into the first spacers 1215. The configuration, types and method of operation of the energy treatment 20 shown in FIG. 67 may be similar to those of the energy treatment 20 shown in FIG. 34. As a result, a pair of porous first spacers 1215 are formed.

Due to the design of the semiconductor device of the present disclosure, the top surface of the second insulating layer 1113, the top surface of the gate structure 1201, the top surfaces of the plurality of word lines 1301, and the top surfaces of the plurality of conductive regions may be even. In other words, top surfaces of the array area 1010 and the peripheral area 1020 may be even and the semiconductor device may have a substantially flat top surface, to facilitate performing of subsequent semiconductor processes on the substantially flat top surface. Therefore, the yield and quality of the semiconductor device may be improved. In addition, the pair of gate stress regions 1223, the first stress region 1405, and the two second stress regions 1407 may increase the carrier mobility of the semiconductor device; therefore, the performance of the semiconductor device may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:

providing a substrate;

forming a gate structure on the substrate;

forming a plurality of word lines on the substrate and apart from the gate structure, having top surfaces at a same vertical level as a top surface of the gate structure;

depositing an energy-removable material on two sides of the gate structure;

performing an energy treatment to transform the energy-removable material into a porous spacer, wherein a porosity of the porous spacer layer is between about 25% and about 100%;

attaching a spacer to an outer side of the porous spacer; and forming a first insulating layer on the substrate and laterally surrounding the gate structure;

wherein the spacer is made of a same material of the porous spacer;

wherein each of the porous spacer and the is constructed to have a skeleton and a plurality of empty spaces disposed and distributed among the skeleton;

wherein the forming of the plurality of word lines comprises:

forming a plurality of word line trenches penetrating through the first insulating layer and into the substrate; and depositing a plurality of word line electrodes on the plurality of word line trenches.

2. The method for fabricating the semiconductor device of claim 1, wherein the energy-removable material comprises a base material and a decomposable porogen material, and the base material comprises methylsilsesquioxane or silicon oxide.

3. The method for fabricating the semiconductor device of claim 1, wherein an energy source of the energy treatment is heat, light, or a combination thereof.

4. The method for fabricating the semiconductor device of claim 1, wherein a temperature of the energy treatment is between about 800° C. and about 900° C.

5. The method for fabricating the semiconductor device of claim 1, wherein the forming the gate structure comprises sequentially forming a gate insulating layer, a first gate conductive layer, a second gate conductive layer, and a mask layer on the substrate; wherein the forming of the gate structure further comprises performing a patterning operation with first mask segments to pattern the gate insulating layer, the first gate conductive layer, the second gate conductive layer, and the mask layer.

6. The method for fabricating the semiconductor device of claim 1, further comprising forming a pair of lightly-doped regions in the substrate prior to the forming of the porous spacer.

7. The method for fabricating the semiconductor device of claim 1, further comprising forming source/drain regions in the substrate prior to the forming of the porous spacer.

8. The method for fabricating the semiconductor device of claim 1, further comprising, prior to the depositing of the word line electrodes:

forming a plurality of word line channel films in the plurality of word line trenches; and forming a plurality of word line insulating films on the plurality of word line channel films.

9. The method for fabricating the semiconductor device of claim 1, further comprising:

depositing a second insulating layer over the first insulating layer and covering the plurality of word line electrodes; and performing an etching process to convert the second insulating layer and into a plurality of word line capping films on the plurality of word line electrodes.

10. The method for fabricating the semiconductor device of claim 9, further comprising performing a planarization process to make the top surfaces of the plurality of word lines and the top surface of the gate structure at the same vertical level.

11. The method for fabricating the semiconductor device of claim 10, further comprising forming conductive regions in openings between the word lines, wherein the planarization process further thins the conductive regions.

12. A method for fabricating a semiconductor device, comprising:

providing a substrate;

forming a gate structure on the substrate;

depositing dummy spacers on two sides of the gate structure;

depositing a first insulating layer over the substrate and the word lines to laterally surround the dummy spacers;

forming a plurality of word lines on the substrate and apart from the gate structure, wherein a top surface of the gate structure is level with top surfaces of the word lines; and removing the dummy spacers and forming porous spacers on two sides of the gate structure;

wherein the dummy spacers are formed by:

forming a spacer layer to cover a top surface of the substrate, a top surface of the gate structure, and the two sides of the gate structure; and via an etching process, removing portions of the spacer layer on the top surface of the substrate and the top surface of the gate structure, wherein remaining portions of the spacer layer form the dummy spacers on the two sides of the gate structure.

13. The method for fabricating the semiconductor device of claim 12, wherein forming of the porous spacers comprises depositing an energy-removable material on the two sides of the gate structure and transforming the energy-removable material into the porous spacers.

14. The method for fabricating the semiconductor device of claim 12, wherein the transforming of the energy-removable material into the porous spacers is performed subsequent to the depositing of the first insulating layer.

15. The method for fabricating the semiconductor device of claim 12, further comprising depositing a second insulating layer to cover the first insulating layer and the top surface of the gate structure.

16. The method for fabricating the semiconductor device of claim 15, further comprising patterning the first insulating layer and the second insulating layer to expose the substrate and sidewalls of the word lines.

17. The method for fabricating the semiconductor device of claim 16, further comprising depositing conductive regions on the sidewalls of the word lines.

18. The method for fabricating the semiconductor device of claim 17, further comprising performing a planarization process to remove a portion of the second insulating layer; wherein the planarization process further causes the top surface of the gate structure to be leveled with the second insulating structure.

19. The method for fabricating the semiconductor device of claim 12, wherein the first insulating layer covers the gate structure.

20. The method for fabricating the semiconductor device of claim 12, wherein the forming of the gate structure comprises sequentially forming a gate insulating layer, a first gate conductive layer, a second gate conductive layer, and a mask layer on the substrate.

* * * * *